United States Patent
Markle et al.

(10) Patent No.: US 9,329,484 B1
(45) Date of Patent: May 3, 2016

(54) APPARATUS AND METHOD OF DIRECT WRITING WITH PHOTONS BEYOND THE DIFFRACTION LIMIT USING TWO-COLOR RESIST

(71) Applicant: Periodic Structures, Inc., Los Gatos, CA (US)

(72) Inventors: David A. Markle, Pleasanton, CA (US); John S. Petersen, Austin, TX (US)

(73) Assignee: Periodic Structures, Inc., Los Gatos, CA (US)

( * ) Notice: Subject to any disclaimer, the term of this patent is extended or adjusted under 35 U.S.C. 154(b) by 0 days.

(21) Appl. No.: 14/866,877

(22) Filed: Sep. 26, 2015

Related U.S. Application Data

(62) Division of application No. 14/244,942, filed on Apr. 4, 2014, now Pat. No. 9,195,139.

(51) Int. Cl.
*G03F 7/26* (2006.01)
*G03F 7/20* (2006.01)

(52) U.S. Cl.
CPC ............... *G03F 7/26* (2013.01); *G03F 7/7015* (2013.01)

(58) Field of Classification Search
CPC .............................. G03F 7/26; G03F 7/7015
USPC ..................................................... 430/5, 296
See application file for complete search history.

(56) References Cited

U.S. PATENT DOCUMENTS

| | | | |
|---|---|---|---|
| 7,713,684 | B2 | 5/2010 | Menon et al. |
| 7,714,988 | B2 | 5/2010 | Menon et al. |
| 2005/0088633 | A1 | 4/2005 | Borodovsky |
| 2005/0147921 | A1 | 7/2005 | Lin et al. |
| 2006/0183059 | A1 | 8/2006 | Menon et al. |
| 2009/0046299 | A1 | 2/2009 | Menon et al. |
| 2009/0087797 | A1 | 4/2009 | Menon et al. |
| 2010/0097702 | A1 | 4/2010 | Menon et al. |
| 2010/0097703 | A1 | 4/2010 | Menon et al. |
| 2010/0248159 | A1 | 9/2010 | Menon et al. |
| 2012/0092632 | A1 | 4/2012 | McLeod et al. |

FOREIGN PATENT DOCUMENTS

| | | |
|---|---|---|
| CN | 1952789 A | 4/2007 |
| JP | H07-210068 | 8/1995 |

OTHER PUBLICATIONS

Tsai et al., "Reduction of focal spot size using dichromats in absorbance modulation", Optics Letters / vol. 33, No. 24 / Dec. 15, 2008.
Tsai et al.,"Spatial-frequency multiplication via absorbance modulation," Appl. Phys. Lett., 91(9), 094103 (2007).
Menon et al., "Far-Field Generation of Localized Light Fields using Absorbance Modulation", Physical Review Letters, 98, 043905-1, Week Ending Jan. 26, 2007.
Fourkas, "RAPID Lithography: New photoresists Achieve Nanoscale Resolution", Optics and Photonics News Jun. 2011, p. 24-29.
Harke et al., "Photopolymerization Inhibition Dynamics for Sub-diffraction Direct Laser Writing Lithography", ChemPhysChem 2012, 13, 1429-1434.
Hell et al., "Breaking the diffraction resolution limit by stimulated emission: stimulated emission-depletion fluorescence microscopy," Opt. Lett. 19, 780-782 (1994).
Brimhall et al., "Breaking the Far-Field Diffraction Limit in Optical Nanopatterning via Repeated Photochemical and Electrochemical Transitions in Photochromic Molecules", DOI: 10.1103/PhysRevLett.107.205501, 2011 American Physical Society.
Walsh et al., "Maskless Lithography with Massively-Parallel Independent Beams: Photons Rather than Electrons", Obtained from LumArray, Inc. 15 Ward Street, Somerville, MA 02139, Jun. 2015.
Menon et al., "Absorbance-modulation optical lithography," J. Opt. Soc. Am. A, 23(9), 2290-2294 (2006).
Scott et al., "Principles of voxel refinement in optical direct write lithography" Journals of Materials Chemistry DOI: 10.1039/c1jm11915j, Jun. 2011.
Andrew et al., "Confining light to deep sub-wavelength dimensions to enable optical nanopatterning," Science, vol. 324, 917 (May 15, 2009). DOI: 10.1126SCIENCE. 1167704.
Li et al., "Dual-beam, 3D photolithography provides exceptional resolution", SPIE Newsroom (web edition), Jun. 24, 2009 DOI: 10.1117/2.1200906.1690.
Linjie et al., "Achieving λ/20 Resolution by One-Color Initiation and Deactivation of Polymerization," Science May 15, 2009 vol. 324 910-913.
Fischer et al., "The materials challenge in diffraction-unlimited direct-laser writing optical lithography," Adv. Mater. 22, 3578-3582 (2010).
Stocker et al., "Multiphoton photoresists giving nanoscale resolution that is inversely dependent on exposure time", Nature Chemistry vol. 3, pp. 223-227 (Mar. 2011).

(Continued)

*Primary Examiner* — Christopher Young
(74) *Attorney, Agent, or Firm* — Opticus IP Law PLLC

(57) ABSTRACT

Methods of and apparatus for performing direct-write lithography in a two-color photoresist layer are disclosed. The method includes exposing the two-color photoresist layer with transducer and inhibition images that respectively define bright spots and dark spots. The transducer image generates excited-state photo-molecules while the inhibition image converts the exited-state photo-molecules to an unexcited state that is not susceptible to conversion to an irreversible exposed state. The dark spots and bright spots are aligned, with the dark spots being smaller than the bright spots so that a portion of the excited-state photo-molecules adjacent the periphery of the bright spots absorb the inhibition radiation and transition to the unexcited state while a portion of the excited photo-molecules at the center of bright spots are not exposed to the inhibition light and transition to an irreversible exposed state. This forms in the two-color photoresist layer a pattern of sub-resolution photoresist pixels.

9 Claims, 35 Drawing Sheets

(56) References Cited

OTHER PUBLICATIONS

Winston, "Nodal Photolithography: Lithography via Far-Field Optical Nodes in the Resist," MSc. Thesis submitted to the Department of Electrical Engineering and Computer Science at the Massachusetts Institute of Technology on Jan. 18, 2008, in partial fulfillment of the requirements for the degree of Master of Science in Electrical Engineering and Computer Science.

Meyer, "Extending the STED Principle to multicolor Imaging and Far-Field Optical Writing," Inaugural Dissertation submitted to the Combined Faculties for the Natural Sciences and for Mathematics of the Ruperto-Carola University of Heidelberg, Germany for the degree of Doctor of Natural Sciences, Dec. 2009.

Akatay et al, "Design and Optimization of microlens array based on high resolution beam steering system," Optics ExpressApr. 16, 2007, vol. 15, No. 8, pp. 4523-4529.

Fischer et al., "Three-dimensional optical laser lithography beyond the diffraction limit", Laser Photonics Rev. 1-23 (2012)/ DOI: 10.1002/por.201100046.

Frankel et al., "Quantum state control interference lithography and trim double patterning for 32-16 nm lithography", Optical Microlithography XX, edited by Donis Flagello, Proc. of SPIE vol. 6520, 65202L, (2007).

Menon et al., "Maskless Lithographh," Materials Today, Feb. 2005, pp. 26-33.

Office Action for Taiwan Patent Application No. 101142947, mailed on Feb. 4, 2015, and which is a counterpart to the above-identified US Patent Application.

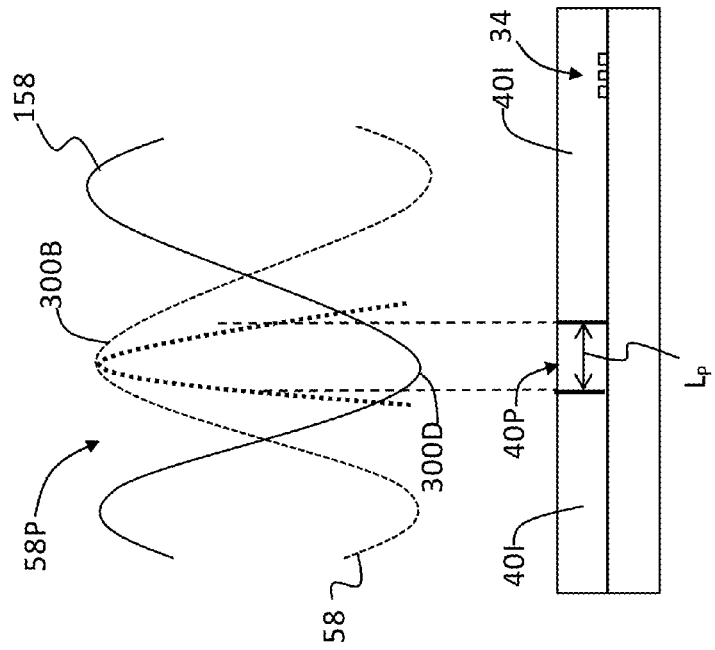
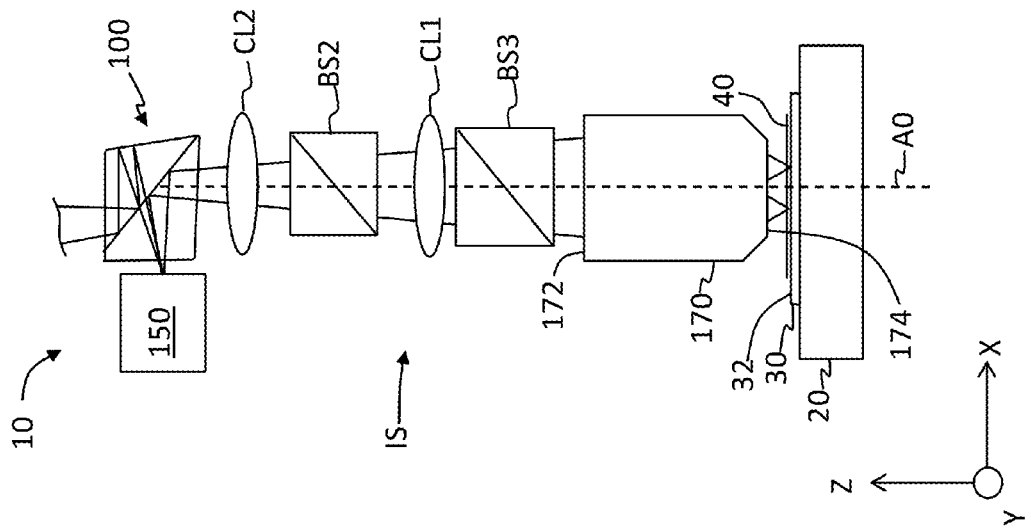

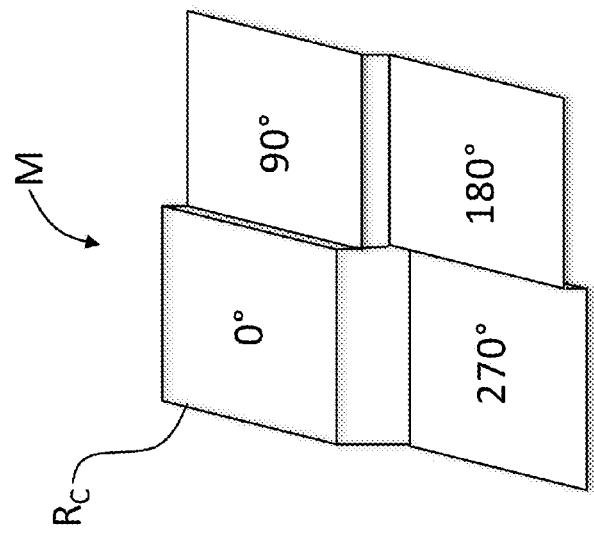
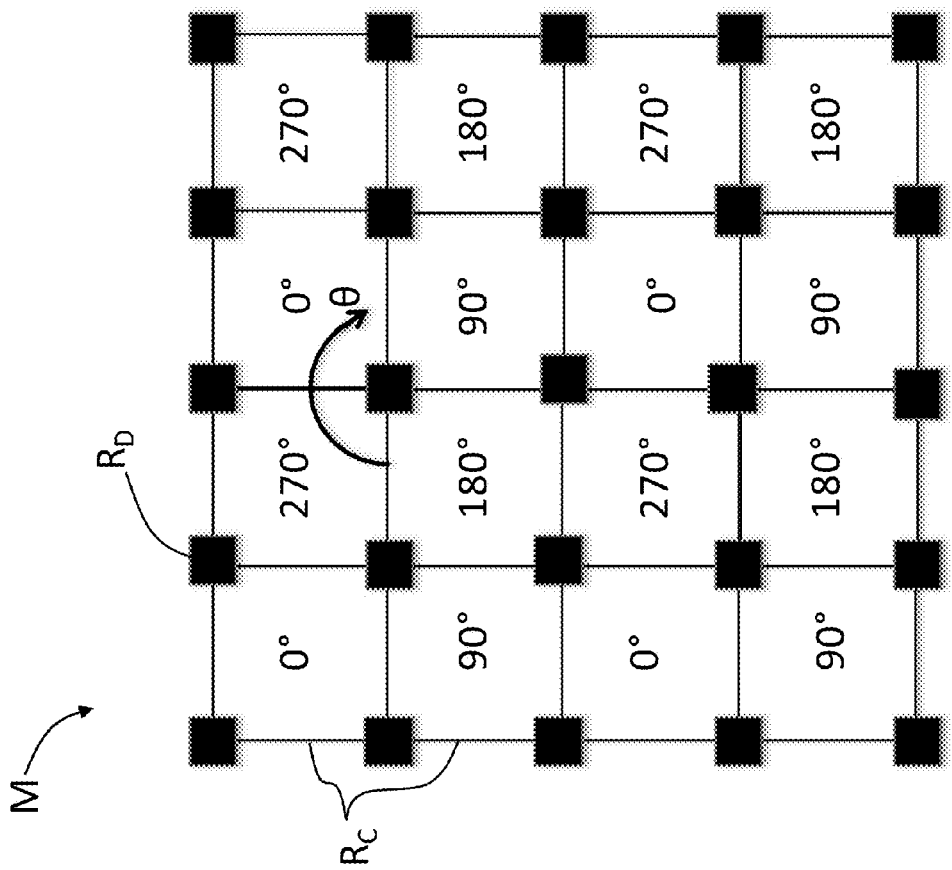
Fig. 31B
Fig. 31A

APPARATUS AND METHOD OF DIRECT WRITING WITH PHOTONS BEYOND THE DIFFRACTION LIMIT USING TWO-COLOR RESIST

CLAIM OF PRIORITY

This application is a divisional application of co-pending U.S. patent application Ser. No. 14/244,942, filed on Apr. 4, 2014, and which is incorporated by reference herein, and which is a continuation-in-part of co-pending U.S. patent application Ser. No. 14/143,139, filed on Dec. 30, 2013, which application is incorporated by reference herein and which is a divisional patent application of U.S. patent application Ser. No. 13/678,692, filed on Nov. 16, 2012, and which has issued as U.S. Pat. No. 8,642,232 and which is incorporated by reference herein and which claims priority under 35 U.S.C. §119(e) from U.S. Provisional Application Ser. No. 61/561,545, filed on Nov. 18, 2011, which application is incorporated by reference herein.

STATEMENT OF GOVERNMENT RIGHTS

This disclosure was made with government support under Contract # N66001-10-C-406, awarded by DARPA and managed by SPAWAR Systems Center Pacific. The government therefore has certain rights in the disclosure.

FIELD

The present disclosure relates to lithography, and in particular to super-resolution lithography apparatus and methods that utilize direct writing with photons using a two-color resist.

BACKGROUND ART

The semiconductor device manufacturing industry has relied on optical lithography techniques since the 1960s to produce ever denser and more powerful integrated circuit (IC) chips. However, the ability to keep reducing the minimum geometry of IC chips is reaching fundamental material limitations. The continued use of optical lithography has been enabled by the employment of increasingly more complex lenses and shorter operating wavelengths. Present-day microlithography lenses rely on liquid immersion to increase the numerical aperture (NA) to a maximum of about 1.33.

Likewise, the optical wavelengths used to expose the photoresist have been reduced from the original g-line of mercury (436 nm) down to the ArF-excimer-laser deep-ultraviolet wavelength of 193 nm. Beyond 193 nm there are no glass materials suitable for use as the lenses, and the transmission of such short-wavelength light through air is problematic. While serious effort is presently being directed toward using extreme-ultra-violet (EUV) wavelengths in the X-ray region at 13.5 nm in combination with mirror systems, it is not yet clear whether EUV lithography systems will be commercially viable.

Optical lithography relies on the ability of photoresist to respond to light incident thereon and thereby record a sharp photoresist image. Conventional mask-based optical lithography is limited mainly by the diffraction limit of the projection imaging process.

U.S. Pat. No. 7,713,684 (hereinafter the '684 patent) describes a direct-write (i.e., non-mask-based, non-projection) optical-lithography technique whereby a thin film is placed above a photoresist layer. The thin film can be bleached by a first wavelength of light and rendered opaque by a second wavelength of light. The '684 patent describes a technique that involves creating a patch of the second wavelength, the center of which contains a small black hole. The hole is irradiated with an image larger than the hole and formed by the first wavelength of light, and if the intensity of the superimposed second wavelength of light is sufficiently low, then the first wavelength of light bleaches and thereby exposes the underlying photoresist layer.

The size of the resultant photoresist image can be as small as $\frac{1}{13}$th the size of the image formed using just the first wavelength. This technique and subsequent related techniques whereby an image is formed in photoresist using direct writing to achieve a resolution beyond the usual resolution limits of conventional photolithography are referred to in the art as super-resolution lithography (SRL).

While SRL techniques have been demonstrated and are shown to be feasible, they need to be made commercially viable. This includes developing systems and methods that allow for SRL techniques to be implemented in a manufacturing environment in a manner that provides wafer throughputs similar to those presently available using conventional mask-based optical lithography techniques.

SUMMARY

An aspect of the disclosure is a method of performing direct-write lithography in a two-color photoresist layer that contains photo-molecules that are initially in an unexcited state. The method includes: exposing the two-color photoresist layer with a transducer image formed from exposure radiation having an exposure wavelength and comprising a first array of bright spots each having a periphery, with the exposure radiation associated with the bright spots exciting corresponding photo-molecules in the two-color photoresist layer to an excited state, thereby generating excited-state photo-molecules that are susceptible to absorption by inhibition radiation having an inhibition wavelength; and exposing the two-color photoresist layer with an inhibition image comprising the inhibition radiation having the inhibition wavelength, the inhibition image defining an array of dark spots that are aligned with the bright spots of the transducer image and that are smaller than the bright spots so that a portion of the excited-state photo-molecules adjacent the periphery of the bright spots absorb the inhibition radiation and transition to an unexcited state that is not susceptible to conversion to an irreversible exposed state while a portion of the excited photo-molecules at the center of bright spots are not exposed to the inhibition light and transition to an irreversible exposed state, thereby forming in the two-color photoresist a set of sub-resolution photoresist pixels each having a size smaller than would be formed in the absence of the dark spots.

Another aspect of the disclosure is the method as described above, wherein the acts of exposing the two-color photoresist layer with the transducer image and the inhibition image are repeated to form additional sets of sub-resolution photoresist pixels at different locations in the two-color photoresist layer.

Another aspect of the disclosure is the method as described above, and further comprising changing the transducer image between forming sets of sub-resolution, permanently exposed photoresist pixels.

Another aspect of the disclosure is the method as described above, wherein said exposing the two-color photoresist layer with a transducer image precedes exposing the two-color photoresist layer with the inhibition image.

Another aspect of the disclosure is the method as described above, wherein said exposing the two-color photoresist layer with the inhibition mage precedes exposing the two-color photoresist layer with the transducer image.

Another aspect of the disclosure is the method as described above, wherein said exposing the two-color photoresist layer with the inhibition image is performed concurrently with and for at least a same amount of time as said exposing the two-color photoresist layer with the transducer image.

Another aspect of the disclosure is the method as described above, wherein said exposing the two-color photoresist layer with the inhibition image is performed for a longer period of time than said exposing the two-color photoresist layer with the transducer image.

Another aspect of the disclosure is the method as described above, wherein said exposing the two-color photoresist layer with the inhibition image is substantially continuous between forming sets of sub-resolution photoresist pixels, and wherein the interference image is repositioned relative to the two-color photoresist layer between forming sets of sub-resolution photoresist pixels.

Another aspect of the disclosure is the method as described above, wherein the transducer image is formed by illuminating and imaging a programmable image transducer, and wherein said exposing the two-color photoresist layer with a inhibition image is substantially continuous between forming sets of sub-resolution photoresist pixels, and wherein the interference image is repositioned relative to the two-color photoresist layer while the programming the programmable image transducer.

Another aspect of the disclosure is the method as described above, wherein the inhibition image is formed by imaging a phase mask containing a pattern that generates an array of black holes when imaged onto the two-color photoresist layer.

Another aspect of the disclosure is the method as described above, wherein the inhibition image is formed by causing collimated beams to interfere at the two-color photoresist layer.

Another aspect of the disclosure is the method as described above, wherein the acts of exposing the two-color photoresist layer with the transducer image and the inhibition image occur within an exposure frame, and wherein the two-layer photoresist has a resist time constant $\tau$ that is substantially the same duration as the exposure frame.

Another aspect of the disclosure is the method as described above, wherein the acts of exposing the two-color photoresist layer with the transducer image and the inhibition image are repeated in respective exposure frames to form additional sets of sub-resolution photoresist pixels at different locations in the two-color photo resist layer, and wherein the two-color photoresist layer has a time constant $\tau$ that is substantially the same as a time between the exposure frames.

Another aspect of the disclosure is the method as described above, and including maintaining the transducer image and the inhibition image in relative alignment and moving the transducer image and inhibition image together relative to the substrate between forming the additional sets of sub-resolution photoresist pixels.

Another aspect of the disclosure is the method as described above, wherein the additional sets of sub-resolution photoresist pixels at different locations define a photoresist pattern having an edge, and edge position and an edge resolution, and wherein the edge resolution is defined by a partial exposure when forming the photoresist pixels at the edge of the photoresist pattern.

Another aspect of the disclosure is a direct-write lithography apparatus for forming in a two-color photoresist layer on a substrate sub-resolution photoresist pixels, wherein the two-color photoresist layer includes photo-molecules. The apparatus includes: an illumination system configured to provide an illumination light having a wavelength capable of exciting the photo-molecules in the two-color photoresist to form excited-state photo-molecules; at least one image transducer having an array of configurable transducer pixels arranged to receive and selectively modulate the illumination light; an objective lens arranged to receive the modulated illumination light from the at least one image transducer and form on the two-color photoresist layer a transducer image having an arrangement of bright spots, with each bright spot having a first size and being formed by a corresponding activated transducer pixel; a stage that movably supports the substrate; an inhibition image generator arranged relative to the objective lens and adapted to operate in combination with the objective lens to generate at the two-color photoresist an inhibition image from inhibition light having an inhibition wavelength that causes excited-state photo-molecules to transition to an unexcited state that is not susceptible to conversion to an irreversible exposed state, wherein the inhibition image includes an array of dark spots; and wherein the array of dark spots are aligned with the bright spots and are smaller than the bright spots so that a portion of the excited-state photo-molecules adjacent the periphery of the bright spots absorb the inhibition radiation and transition to the unexcited state, while a portion of the excited photo-molecules at the center of bright spots are not exposed to the inhibition light and transition to an irreversible exposed state, thereby forming in the two-color photoresist a set of sub-resolution photoresist pixels each having a size smaller than would be formed in the absence of the dark spots.

Another aspect of the disclosure is the apparatus as described above, wherein the inhibition image generator includes either an interference pattern generator or a mask imaging system.

Another aspect of the disclosure is the apparatus as described above, wherein the mask imaging system includes a phase mask.

Another aspect of the disclosure is the apparatus as described above, wherein each image transducer pixel includes a center and an edge, and wherein the illumination system includes a phase mask configured to modulate the illumination beam to provide a maximum intensity at the center of each image transducer pixel and a minimum intensity along an edge of each transducer pixel.

Another aspect of the disclosure is the apparatus as described above, further comprising including an optical element arranged to adjust an alignment between the substrate, the image transducer image and the inhibition image.

Another aspect of the disclosure is the apparatus as described above, wherein the transducer image is composed of light that excites the photo-molecules in the resist layer, the interference pattern image is composed of light that inhibits excitation of photo-molecules in the resist layer, and wherein the transducer and inhibition images have an s-polarization at the two-color photoresist.

Another aspect of the disclosure is the apparatus as described above, wherein the transducer pixels define zones having different reflectivity.

Another aspect of the disclosure is the apparatus as described above, wherein the transducer pixels have a 180° degree phase shift with respect to the light from the four nearest neighboring transducer pixels.

Another aspect of the disclosure is the apparatus as described above, wherein the set of sub-resolution photoresist pixels defines a pattern having a first axis, wherein the image transducer has a second axis aligned with the first axis, and wherein the pattern has a minimum feature size defined by a size of the sub-resolution pixels.

Additional features and advantages of the disclosure are set forth in the Detailed Description that follows and in part will be readily apparent to those skilled in the art from that description or recognized by practicing the embodiments as described herein, including the Detailed Description that follows, the claims as well as the appended drawings. The claims constitute a part of this specification and are hereby incorporated into the Detailed Description by reference.

It is to be understood that both the foregoing general description and the following Detailed Description presented below are intended to provide an overview or framework for understanding the nature and character of the disclosure as it is claimed. The accompanying drawings are included to provide a further understanding of the disclosure and are incorporated into and constitute a part of this specification. The drawings illustrate various embodiments of the disclosure and together with the description serve to explain the principles and operations of the disclosure.

The claims set forth below constitute a part of this specification and in particular are incorporated into the Detailed Description set forth below.

All documents cited herein are incorporated by reference.

BRIEF DESCRIPTION OF THE DRAWINGS

FIG. 5 is a schematic diagram of an example imaging system for the direct-write lithography apparatus of FIG. 1;

FIG. 6 is a schematic diagrams illustrating how the intensities of the interference image and the transducer image combine to form a super-resolution pixel in the photoresist layer;

FIG. 31A is a face-on view of an example mask that includes dark regions and clear phase regions and that can be used to form the array of black holes in place of using an interference pattern formed by interfering beams from the interference pattern generator;

FIG. 31B is a close-up schematic diagram that shows the relative phases of adjacent clear phase regions for the mask of FIG. 31A;

Figure 1:
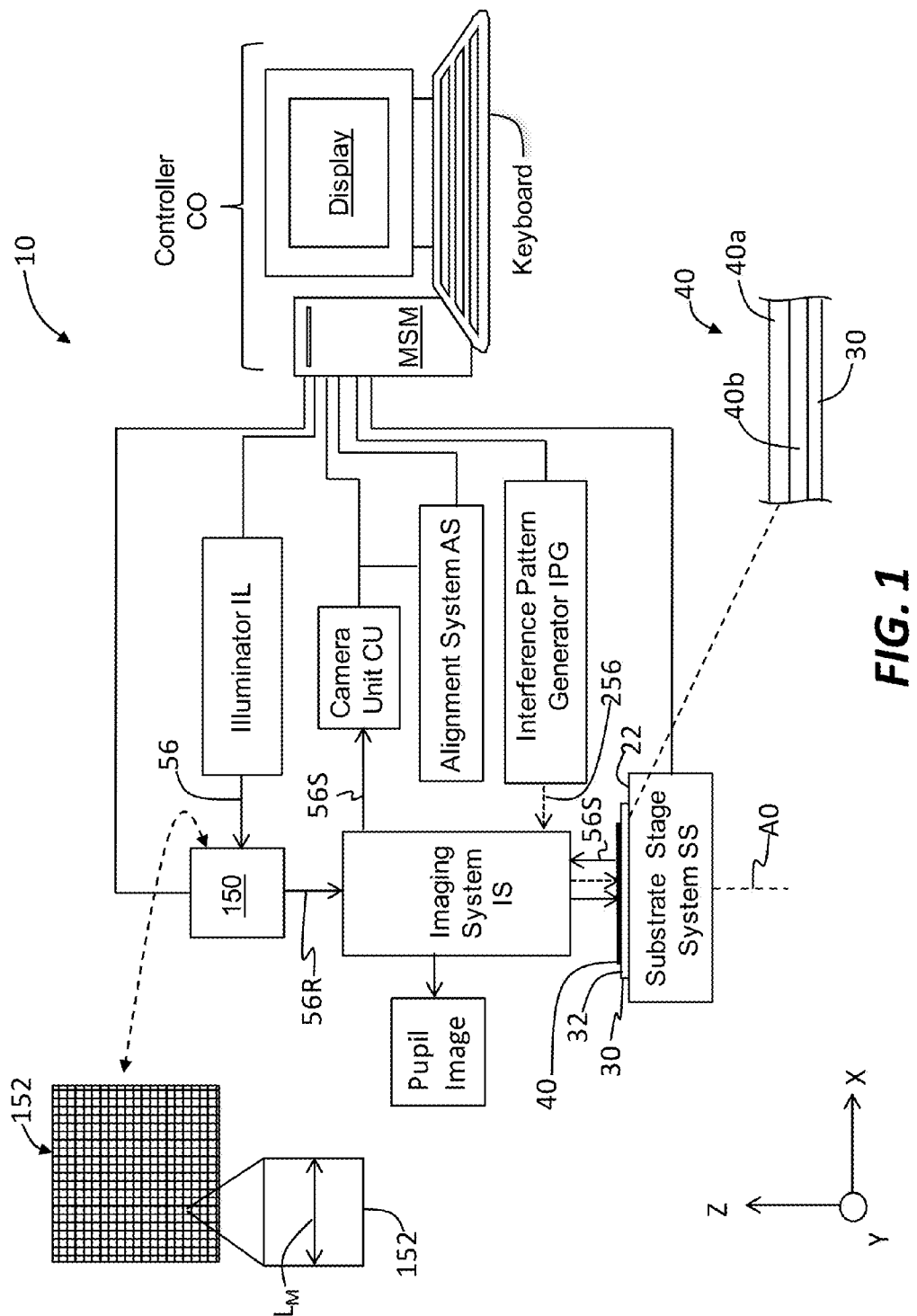
FIG. 1 is a schematic diagram of a generalized version of a direct-write lithography apparatus according to the disclosure.

Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

In some of the Figures, Cartesian coordinates are provided for the sake of reference and are not intended as providing limitations on specific directions and orientations of the systems and methods described herein.

DETAILED DESCRIPTION

Reference is now made in detail to various embodiments of the disclosure, examples of which are illustrated in the accompanying drawings. The claims as set forth below are incorporated into and constitute a part of this Detailed Description. All references cited in this document are incorporated by reference herein.

The present disclosure relates to lithography, and in particular to super-resolution lithography apparatus and methods that utilize direct writing with photons. The combination of interference lithography and direct-write lithography permits the writing of a great many points simultaneously while also achieving imagery well below the diffraction limit for the wavelength and numerical aperture (NA) being employed. Generally speaking, interference lithography generates an array of equally spaced lines and spaces that extend across an entire field. More specifically, in this case, the lines and spaces extend across the field of a lithography objective in two orthogonal directions, or possibly three directions oriented 120° apart, by way of inhibition light that inhibits a polymerization reaction or other photochemical process.

In this document, the word "inhibition" refers to the wavelength used to inhibit the resist exposure, while the word "exposure" refers to the wavelength used to promote the resist exposure.

In other situations, "inhibition" and "exposure" can refer to the same wavelength, but inhibition is a low level of radiation that is more or less continuously applied to generate the two-dimensional interference pattern that inhibits exposure, and exposure is a much shorter, much higher intensity pulse of radiation directed primarily at the lowest intensity points in the two-dimensional interference pattern generated by the inhibition illumination to cause exposure. The regions where the interference patterns reach a minimum intensity are called "dark spots" and can also be called "black holes," as they represent the absence of light in the interference image.

Also, the terms "rows" and "columns" are used for reference and are not necessarily intended to be limiting as to orientation; these terms can be used interchangeably.

The following definitions are used herein:

Period: The distance between adjacent pixels at the objective image plane or the substrate plane.

Frame: The resist pattern on the substrate that results from a single exposure. The time given frame is exposure is the frame exposure time.

Column: An assembly containing one objective and at least one image transducer that is capable of patterning a resist layer.

Digital Micro-mirror Device (DMD): A specific type of image transducer that employs an array of micro-mirrors, each of which can be tilted so that the mirror normal falls on either side of the normal to the device.

DMD pixel: An individual DMD micro-mirror.

Photoresist pixel: The area on the resist layer that corresponds to the geometrical image of an image transducer (e.g., DMD) pixel.

Image pixel: An individual image element such as the image of a DMD micro-mirror (pixel) formed at the substrate.

Exposure light: Light having an exposure wavelength $\lambda_1$ that activates (exposes) the photoresist to form a photoresist pattern.

Inhibition light: Light having an inhibition wavelength $\lambda_2$ that causes the photoresist to be insensitive to the exposure light.

General Direct-Write Lithography Apparatus

FIG. 1 is a schematic diagram of a generalized version of a direct-write lithography apparatus ("apparatus") 10 according to the disclosure. The apparatus 10 includes an illuminator system ("illuminator") IL, which is in optical communication with an image transducer 150, such as a DMD. The image transducer 150 is in optical communication with an imaging system IS, which in turn is in optical communication with a substrate 30 supported by a substrate stage system SS. The image transducer 150 is configured to receive and modulate light, e.g., by reflection, transmission, absorption or other known light-modulation means, on a pixel-by-pixel basis.

A camera unit CU is in optical communication with the substrate 30 via reflected light 56S that passes back through the imaging system IS to a beam splitter, which directs the light toward the camera unit, as explained in greater detail below. The apparatus 10 also includes an interference pattern generator IPG that is in optical communication with substrate 30 through imaging system IS. The apparatus 10 includes a primary axis A0, along which resides imaging system IS and substrate stage system SS.

The substrate 30 includes a top surface 32, upon which is supported a layer of photoresist 40. In an example, photoresist 40 can comprise chemical components that photo-chemically respond to exposure (actinic) light, resulting in a change in the solubility of the photoresist by a developer agent, and that can be turned off or negated by inhibition light. Alternatively, photoresist 40 can comprise a conventional resist material ("layer") 40b, over which is laid a layer of photochromic material ("layer") 40a that can be bleached by exposure light and rendered opaque by inhibition light (see inset in FIG. 1). Photoresist compositions that become insoluble after exposure to actinic radiation, usually due to a polymerization reaction, are called "negative resists." Likewise, photoresists that become soluble after actinic exposure, usually due to their changing from a non-polar compound to a polar compound with a much higher solubility in a base developer, are called "positive resists."

Thus, photoresist 40 can consist of a single layer or can consist of first and second layers 40a and 40b, where layer 40a is an inhibiting layer activated by light of wavelength $\lambda_2$ and layer 40b is an exposure layer sensitive to exposure light of wavelength $\lambda$. Other layers that might also be included along with the resist and inhibiting layers are not specifically noted. For example, these might include antireflection coatings.

The apparatus 10 also includes an alignment system AS that employs the camera unit CU to view the substrate 30 and the transducer image formed thereon as projected onto the substrate through imaging lens IS.

In the general operation of apparatus 10, illuminator IL generates substantially uniformized illumination light 56 at a first (exposure) wavelength $\lambda_1$. The uniformized illumination light 56 is received by image transducer 150, which in the case of a DMD includes a large number (e.g., over 1 million, and in another example, about 2 million) tiltable mirror elements ("micro-mirrors") 152. Micro-mirrors 152 are switchable to create a series of patterns that when illuminated by light 56, the light reflects therefrom to form reflected light 56R that includes the series of patterns.

Figure 4:
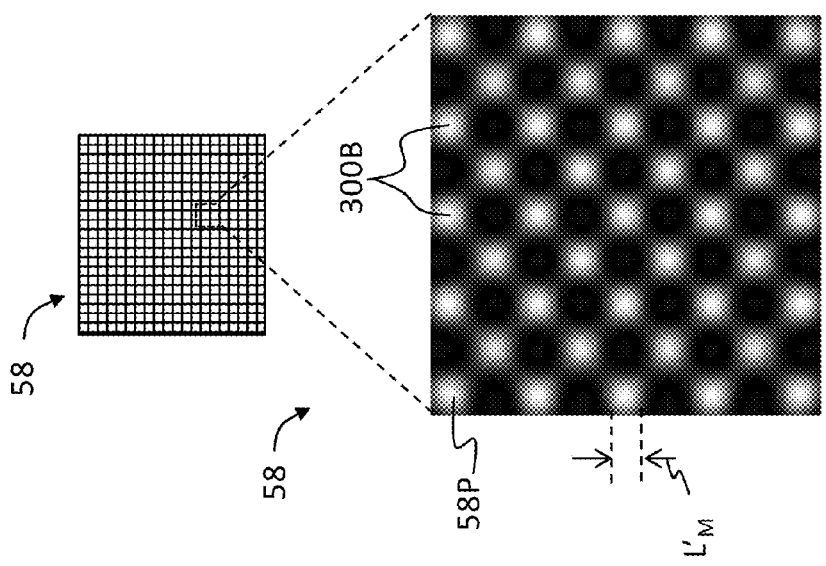
FIG. 4 shows a close-up view of an example transducer image that includes an array of bright spots that align with select dark spots in the interference image.

Most of reflected light 56R from image transducer 150 is imaged by imaging system IS into photoresist layer 40 and forms a transducer image 58 (see FIG. 4). A portion of light 56R is reflected from the substrate 30, passes through the imaging system IS again and is directed to camera unit CU via a beam splitter, which forms an image of the substrate pattern and the superimposed transducer and interference images thereon, and in response generates an electrical transducer-image signal ST (see FIG. 2A). The superimposed images of previous layers applied to the substrate 30 and the projected image-transducer patterns can be used for alignment.

Figure 3:
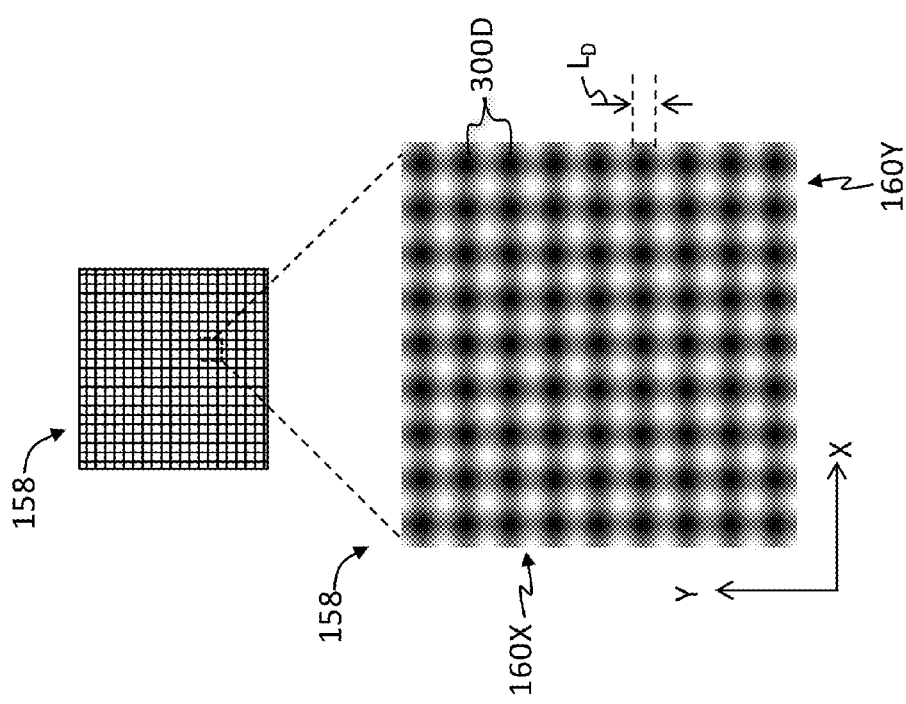
FIG. 3 shows a close-up view of an example interference image, which includes an array of dark spots.

Meanwhile, interference pattern generator IPG generates interference light 256 of a second wavelength $\lambda_2$ that, when imaged by imaging system IS at photoresist layer 40, forms an interference image 158 that in an example consists of first and second line fringe patterns 160X and 160Y that are oriented in orthogonal directions and do not interfere with each other (see FIG. 3). It is also possible to add a third fringe and in this case the fringe patterns are oriented at 120° to each other and the image transducer pixels are arranged in a close-packed array having 3-axis of symmetry. The image on photoresist layer 40 thus has a fine grid pattern superimposed on the transducer image 58. The dynamics of the interaction of the transducer image 58 and the interference image 158 with photoresist layer 40 to achieve very high imaging resolution patterning at a relatively high throughput rate are discussed in greater detail below. The alignment system AS is configured to capture the superimposed interference image 158 and transducer image 58 and measure the alignment of these images, as discussed below. The transducer image 58 is a DMD image when image transducer 150 includes or consists of a DMD.

The apparatus 10 also includes a controller CO that is operably connected to and is configured to control the operation of illuminator IL, image transducer 150, camera unit CU, alignment system AS, interference pattern generator IPG and substrate stage system SS. Details about these various apparatus components and their operation are provided below.

Example Direct-Write Lithography System

Figure 2A:
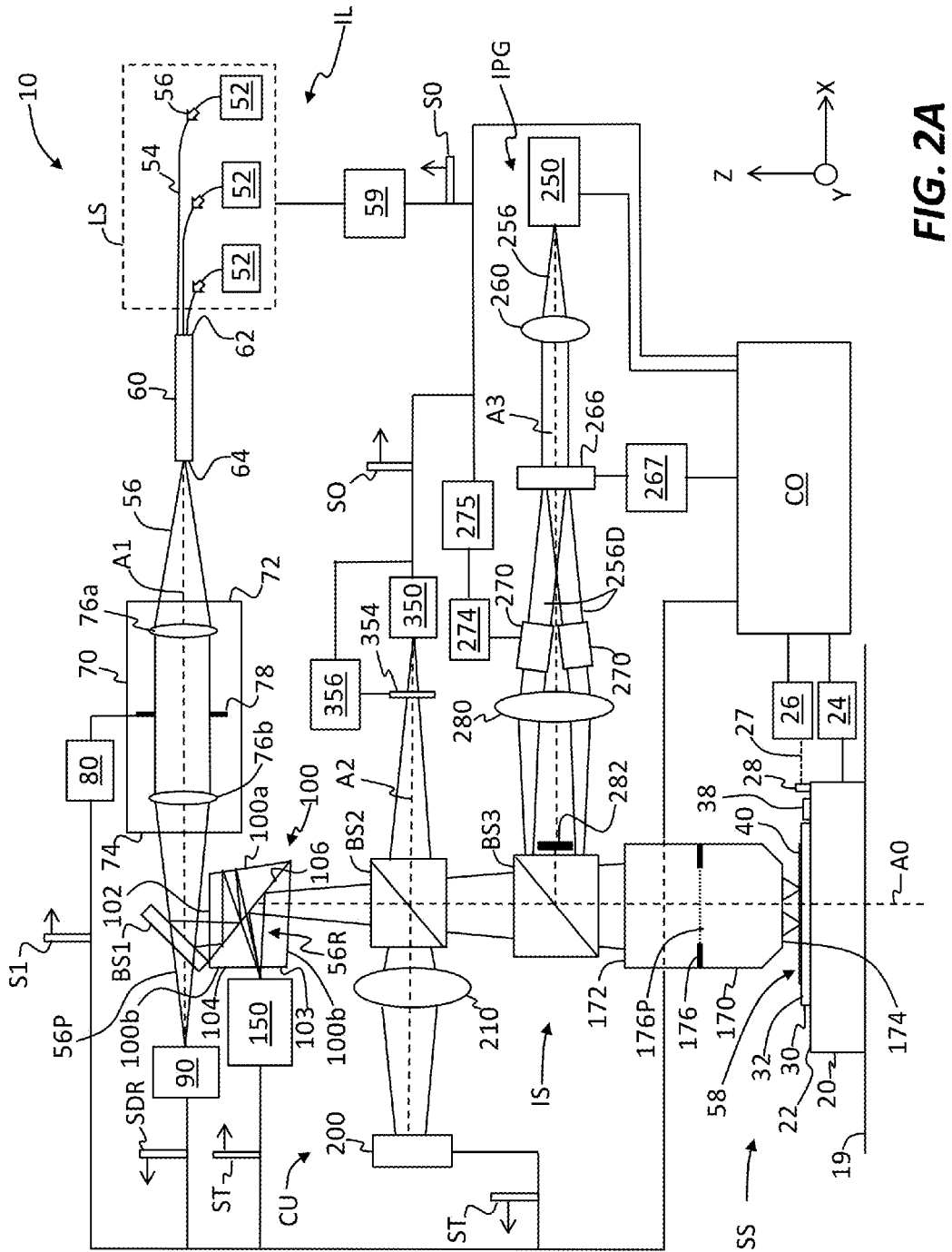
FIG. 2A is a more detailed schematic diagram of the direct-write lithography apparatus of FIG. 1.

FIG. 2A is a more detailed schematic diagram of the direct-write lithography apparatus 10 of FIG. 1. The apparatus 10 includes a stage 20 having an upper surface 22 configured to support substrate 30. The stage 20 is shown as being supported by a platen 19, and the stage may move over the platen by means of air bearings or a magnetic suspension system.

The substrate 30 can be a silicon wafer. The stage 20 can include a chuck (not shown) for supporting substrate 30. The stage 20 is operably connected to a stage driver 24 and a precision metrology system that monitors its position. The metrology system could be an interferometric positioning system 26 that measures the position of stage 20 using measurement light 27 reflected from a reflecting member 28 on the stage. The stage 20, stage driver 24 and interferometric positioning system 26 (including reflecting member 28) constitute a part of substrate stage system SS.

The apparatus 10 also includes, as part of illuminator IL, in order along a first axis A1, a light source LS, a light uniformizer 60 having input and output ends 62 and 64, a relay optical system 70 with input and output ends 72 and 74, a beam-splitting element ("beam splitter") BS1, and a reference detector 90. The light source LS includes a laser or one or more laser diodes 52 optically coupled to input end 62 of light uniformizer 60 via respective optical fiber sections 54. In an example, one or more laser diodes 52 generate the non-uniformized light 56 at wavelength $\lambda_1$, which in an example is 405 nm. In an example, light source LS is controlled by a light source controller 59 that is responsive to a light source control signal S0. The light 56 is also referred to as "light beam" 56 where appropriate, and is also referred to as non-uniformized or uniformized depending on its location along the optical path of apparatus 10.

An example light uniformizer 60 includes or consists of a light pipe having a cross-sectional shape similar to the shape of the image transducer 150. Such a light pipe can be hollow and have reflective walls or can be solid and operate by total internal reflection.

In an example, relay optical system 70 includes a collimating lens 76a and a focusing lens 76b, with an adjustable aperture 78 disposed between these lenses. The adjustable aperture 78 is operably connected to an aperture driver 80 configured to set the size of the aperture in response to a control signal S1. The aperture 78 controls the size of the collimated portion of light beam 56, which lies between collimating and focusing lenses 76a and 76b, and thereby adjusts the numerical aperture of relay optical system 70.

The beam splitter BS1 is configured to reflect most of light beam 56 exiting output end 74 of relay optical system 70. In an example, beam splitter BS1 directs light beam 56 such that the light beam proceeds at substantially a right angle to axis A1. The remaining portion of light beam 56, denoted as light beam 56P, travels through beam splitter BS1 and to reference detector 90. In response thereto, reference detector 90 generates a reference detector signal SDR, which is representative of the amount of detected optical power. The power detected by detector 90 is proportional to the power incident on the image transducer 150, so the power incident on the image transducer can be measured through a calibration technique.

A total-internal-reflection (TIR) prism assembly ("prism assembly") 100 is disposed to receive the portion of light beam 56 that is reflected by beam splitter BS1, namely, light beam 56P. The TIR prism assembly 100 includes first and second prism sections 100a and 100b that define an input surface 102, a device surface 103, an output surface 104, and an interface 106. The prism assembly 100 is discussed in greater detail below.

The light source LS, light uniformizer 60, relay optical system 70, beam splitter BS1, reference detector 90 and TIR prism assembly 100 constitute illuminator IL, which provides the substantially uniform illumination light beam 56 to image transducer 150.

The image transducer 150 of apparatus 10 is operably disposed adjacent device surface 103 of prism assembly 100. A DMD-based image transducer 150 has the aforementioned array of micro-mirrors 152 (see FIG. 1), which can be turned on and off (e.g., by electrostatic deflection of the tilt angle) to create a select pattern in response to a transducer control signal ST. Thus, image transducer 150 is illuminated by uniformized light beam 56P exiting device surface 103 of prism assembly 100. The light 56R reflected by image transducer 150 is then reflected from interface 106 of prism assembly 100 and exits output surface 104 of the prism assembly to travel along primary axis A0. As mentioned above, DMD-based image transducer 150 has a large number of micro-mirrors 152, e.g., over 1 million, and in another example about 2 million. Larger numbers of micro-mirrors 152, up to the limits of the state of DMD technology, can also be employed.

The apparatus 10 includes along axis A0 an objective lens 170 operably arranged adjacent wafer 30 and wafer stage 20. The objective lens 170 has an input end 172 and an output end 174, and includes a pupil 176 that defines a pupil plane 176P. The objective lens 170 is color-corrected and is also telecentric. The objective lens 170 is configured to receive at input end 172 the reflected light 56R from image transducer 150 and to form an image of the transducer (i.e., the transducer image 58) in photoresist layer 40 on substrate 30, which resides adjacent output end 174 of the imaging lens.

The apparatus 10 includes second and third beam splitters BS2 and BS3 that reside along axis A0 between prism assembly 100 and objective lens 170 and that respectively define second and third axes A2 and A3. An imaging photodetector 200 lies along axis A2, along with an imaging lens 210. The imaging lens 210 is configured to receive reflected light 56R from second beam splitter BS2 and form a pupil image on photodetector 200, which corresponds to the image formed at the relay lens pupil.

The camera unit CU, which views the substrate 30, comprises an imaging photodetector 350. The pupil image on detector 200 allows the direction and intensity of the illumination reflected off of each micro-mirror 152 or any group of micro-mirrors to be measured. Thus if the hinge of a micro-mirror 152 breaks and the deflection is abnormal in any way, the problem can be identified and localized quickly. The camera unit CU can be used to determine the relative positions of the alignment targets on the substrate 30, the individual "on" pixels in the image transducer 150 and the positions of the orthogonal fringe patterns 160X and 160Y. The camera unit CU can be used to measure the amount of inhibition light in the bottom of each of a plurality of dark spots 300D. The measurements can be used to minimize the amount of inhibition light in each dark spot 300D and to make it as uniform as possible using adjustments provided for that purpose.

The apparatus 10 includes along third axis A3 at least one light source 250 that generates light 256 at the aforementioned wavelength $\lambda_2$. An example light source 250 is a laser diode. A collimating lens 260 collimates the light 256 from light source 250 and directs it through a phase grating 266 that diffracts light beam 256 to form two diffracted light beams 256D that travel in different directions. The phase grating 266 is operably connected to a driver 267 that finely adjusts the period of the phase grating, which is obtained by a slight rotation of the grating about an axis parallel to the lines on the grating and passing through the optical axis A3.

Figure 2B:
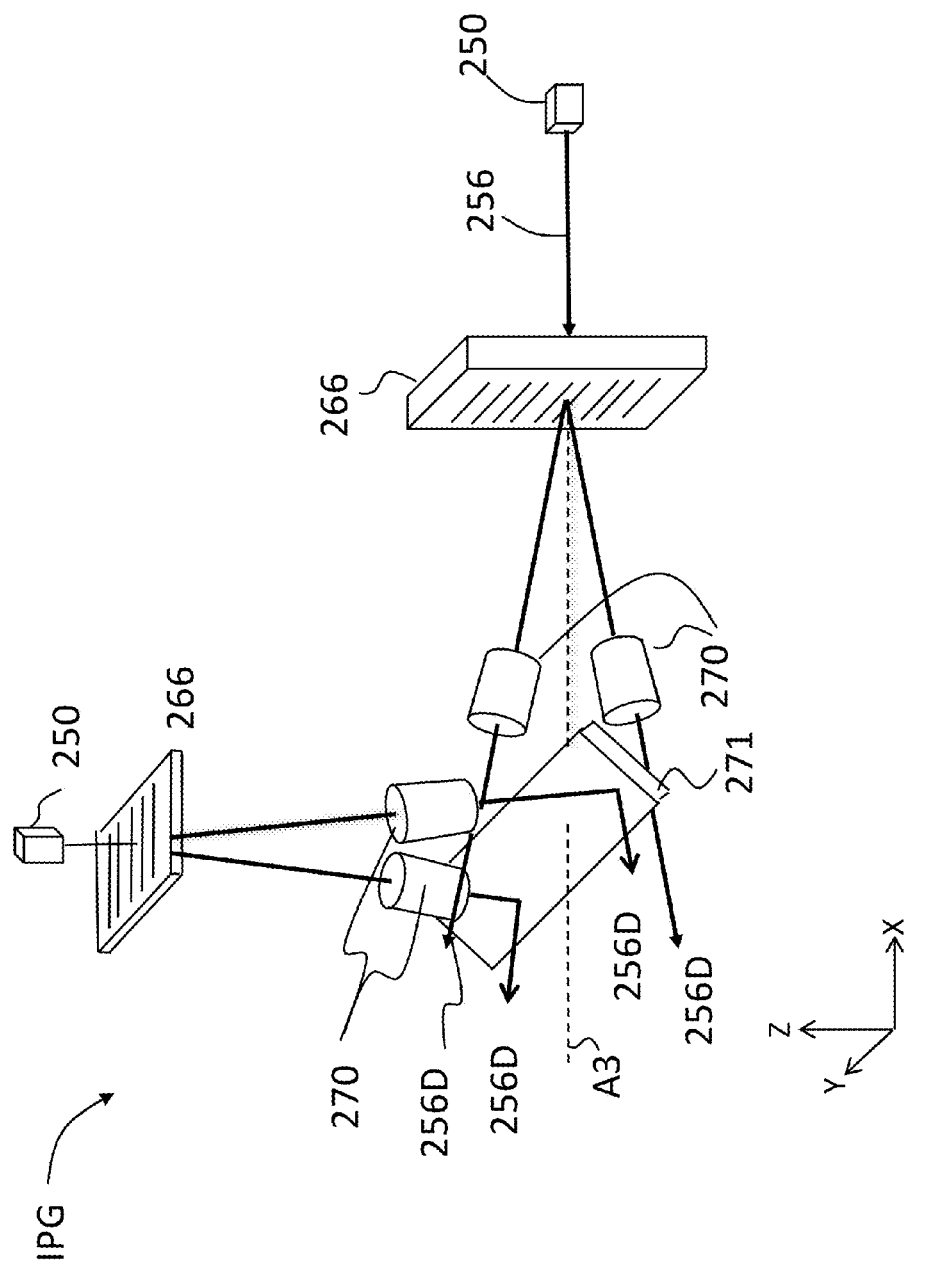
FIG. 2B is a close-up, elevated view of an example interference pattern generator showing two laser sources, two phase gratings and four phase shifters, along with four diffracted light beams.

Not shown in FIG. 2A is a second light source, collimating lens and grating, which generate a second set of diffracted light beams arranged on either side of the optical axis A3 and out of the plane of FIG. 2A. FIG. 2B is a close-up, elevated view of an example interference pattern generator IPG that shows all four diffracted light beams 256D, all four fringe shifters 270, two light sources 250 and two phase gratings 266. A fold mirror 271 is used to direct the two out-of-plane diffracted light beams 256D in the same general direction as the other two in-plane diffracted light beams.

The four diffracted light beams 256D pass through respective fringe shifters 270. Example fringe shifters 270 are Pockels cells, Kerr cells, and an arrangement containing an acousto-optic modulator. The fringe shifters 270 introduce a path-length change between the two coherently linked, interfering beams 256D, thereby causing the resultant fringe patterns 160X and 160Y to shift position normal to the fringe direction. Since the positions of the fringe patterns 160X and 160Y determine the position of the super-resolution pixels being written, the fringe shifters 270 provide a very quick and easy way to adjust the position of the pixels in order to compensate for the scanning motion of the stage 20 or any small errors in the stage position.

An imaging lens 280 then works in combination with beam splitter BS3 to focus each of the four diffracted light beams 256D in four symmetrically located positions around the edge of the pupil 176 of the objective lens 170. After passing through the objective lens 170, each of the four diffracted light beams 256D is collimated. The collimated diffracted light beams 256D overlap on the image plane to form the X and Y grid interference image 158 in photoresist 40. The fringe shifters 270 are operably connected to a driver unit 274, which in turn is connected to a control unit 275 that synchronizes the fringe positions with the position of the stage 20 during the exposure. A zero-order light-blocking member 282 is arranged along axis A3 and adjacent beam splitter BS3 so that only light from the four ±1st order diffracted light beams 256D passes through to the beam splitter and through objective lens 170.

With reference to FIG. 3, the net result of imaging the four diffracted light beams 256D in the objective focal plane is a robust interference image 158 of equal lines and spaces that stretches across the field of the objective lens in the X- and Y-directions, thereby by forming the X-Y grid. The spacing between the fringe patterns 160X and 160Y is set equal to the spacing between the pixels of image transducer 150 imaged on the substrate 30. The brightest parts of the fringes are aligned with the boundaries between the rows and columns of the pixels of image transducer 150. The darkest parts of the fringes overlap in the center of each pixel of image transducer 150, thus forming the aforementioned dark spots 300D, which, if filled with exposure radiation $\lambda_1$, each form a super-resolution photoresist pixel 40P (see FIG. 6). In the discussion below, photoresist pixels 40P are also referred to as "photoresist features" in cases where the pixel is in the form of a sub-resolution line or other extended shape. Non-sub-resolution photoresist patterns formed by sub-resolution pixels or sub-resolution features are denoted by reference number 41 (see, e.g., FIGS. 35A-35C introduced and discussed below).

At some distance away from the center of each dark spot 300D, the intensity of the inhibition radiation forming the interference image 158 increases to the point where it nulls the exposure radiation and thereby limits the size of each of the super-resolution pixels 40P. Here, the term "spot" means a hole or sharp localized drop in the intensity. In an example, the distribution of the intensity in the dark spots 300D serves to trim the size of the exposure spots, resulting in a pixel dimension $L_D$ (see FIG. 3). Ideally, dark spots 300D have a parabolic shape, with the center of each dark spot having zero intensity. This shape serves to trim the diffraction-limited image of a corresponding pixel of image transducer 150 into an inverted parabolic shape.

The dark spots 300D each have a very large depth of field, since they exist everywhere the interfering diffracted light beams 256D overlap. The photoresist 40 is configured so that inhibition light of second wavelength $\lambda_2$ serves to inhibit the exposure of the photoresist, while exposure light of first wavelength $\lambda_1$ serves to expose the photoresist. Thus, if the photoresist 40 is irradiated with inhibition light of second wavelength $\lambda_2$ in all but the very small regions, such as those defined by dark spots 300D, then the only place the exposure light 56 can expose photoresist is in the regions defined by the dark spots.

Generally speaking, a bright spot 300B is larger in size than a dark spot 300D is. The size of the image defined by dark spots 300D depends on the dose of exposure radiation received, and on the ratio between the intensity of the inhibition light and the intensity of the exposure light 56. The higher the intensity ratio, the smaller the size of the resultant super-resolution pixel 40P. The size of the pixel 40P also depends on the characteristics of photoresist 40. Some photoresists 40 are more sensitive than others, and the effectiveness of the inhibition radiation is likely to vary somewhat from one photoresist composition to another. The wavelengths used for exposure and inhibition also affect the resolution. However, the exposure inhibition created by each of dark spots 300D generally causes the resulting photoresist pixel 40P to be smaller in size than would be the case were the photoresist pixel formed by the bright spot 300B only, i.e., in the absence of the exposure-inhibiting dark spot.

Since a DMD can be precisely fabricated, light in the transducer image 58 can be directed exactly to the location of select dark spots 300D to form a desired photoresist pattern in photoresist 40. The angle of each of the DMD micro-mirrors 152 determines the position of the illumination beam 56 in the objective pupil 176, and given that the illumination beam is usually smaller than the pupil, great precision in the micro-mirror tilt angle is not required. In the specific example given here, however, the 1° variation in the angle of the micro-mirrors 152 makes it impractical to employ an illumination beam that is smaller than the pupil 176, and it is therefore necessary to overfill the pupil with the illumination beam 56 to achieve good illumination uniformity across the transducer image 58.

FIG. 4 is a simulated transducer image 58 that shows a portion of the pixel pattern generated by an image transducer 150 assuming that every other pixel 40P is turned off in a checkerboard pattern. In this case the illumination is assumed to be highly spatially coherent ($\sigma$=0). The bright white spots 300B reside directly at the location of interference pattern dark spots 300D and where the pixels 40P are turned on. The patterned photoresist layer 40 and substrate 30 are then processed using standard photolithography techniques to form sub-resolution lithography features in the substrate.

Objective Lens

Commercially available objective lenses for use as objective lens 170 are often corrected for infinity. Consequently, in an example of imaging system IS as shown in FIG. 5, a first compensating lens CL1 is arranged along optical axis A0 to yield a back focal plane with a finite conjugate distance. It is often also convenient to have the back focal plane be telecentric like the object plane. This can be achieved with a second compensating lens CL2 placed between the frustrated prism 100 and second beam splitter BS2. This requires that illuminator IL be telecentric both at image transducer 150 and in the object space near light uniformizer 60. Thus, in an example, imaging system IS consists of objective lens 170 and beam splitters BS2 and BS3, as well as a prism section 100a (see FIG. 2A) of frustrated prism assembly 100, while in another example, the imaging system also consists of one or both of compensating lenses CL1 and CL2.

X-Y Grid Interference Image

The beam splitter BS3 allows the four diffracted light beams 256D to be focused onto the pupil plane 176P of objective lens 170, and then pass through the objective lens to form four collimated beams covering the field of the objective at substrate surface 32 (or photoresist layer 40 thereon) to define interference image 158, such as is illustrated in FIG. 3. All four diffracted light beams 256D may be generated by the same laser diode 250, provided care is taken to ensure that there is no possibility of interference between the two orthogonal interference fringe patterns 160X and 160Y. However, in another example as illustrated in FIG. 2B, to prevent interference effects between the two orthogonal interference fringe patterns 160X and 160Y, separate laser diodes 250 are used so that diffracted light beams 256D in the Y-plane are generated from one laser diode and diffracted light beams in the X-plane are generated by another laser diode.

The opposing pairs of diffracted light beams 256D are coherently linked so that they interfere to generate fringe patterns 160X and 160Y. However, interference between the two crossed fringe patterns 160X and 160Y is not desirable. Such interference can be avoided by polarizing the light used to generate one set of diffracted light beams 256D at a right angle to the light used to generate the other set of diffracted light beams. This ensures that the X-direction fringe pattern 160X and the Y-direction fringe pattern 160Y do not interfere with each other, and that the light intensity of a single fringe pattern is well described by a sine-squared function. Where the centers of fringe patterns 160X and 160Y overlap, the light intensity is twice as high as where the center of one fringe pattern falls on the trough of another.

The diffracted light beams 256D are also referred to herein as inhibition light beams because they serve to inhibit the exposure of photoresist layer 40 by the transducer image 58. Thus, two of the inhibition light beams 256D are propagated in the X-Z plane and two are propagated in the Y-Z plane.

The phase grating 266 generates ±1st order diffracted/inhibition light beams 256D, which diverge before striking imaging lens 280. The imaging lens 280 serves to focus the inhibition light beams 256D onto the pupil plane 176P of objective lens 170. The beam splitter BS3 is a spectrally selective beam splitter so that it can reflect the second wavelength $\lambda_2$ generated by the one or more laser diodes 250. The light-blocking member 282 blocks zero-order light 256D-0 (see FIG. 21) from phase grating 266, which, if unblocked, could generate a uniform level of inhibiting radiation that would null a comparable amount of exposure radiation. The third beam splitter BS3 efficiently reflects the inhibition wavelength $\lambda_2$ used to form the X-Y grid interference image 158 (see FIG. 3) and efficiently transmits the exposure wavelength $\lambda_1$ of reflected light 56R that forms the transducer image 58.

In an example embodiment, two diffracted light beams 256D can be generated using a 50:50 beam splitter if light source 250 is sufficiently monochromatic. The advantage of using a grating such as phase grating 266 (a reflection grating can also be used) is that the intensities of the two diffracted orders are usually very nearly equal and the geometry favors short symmetrical path lengths for each diffracted light beam 256D. The most efficient method is to employ the phase grating 266, since doing so minimizes the generation of any zero-order light 256D-0 and efficiently generates the ±1st order lights.

The diffracted light beams 256D having equal intensities is advantageous since only equal intensities yield perfectly dark spots (black holes) 300D.

While two pairs of diffracted light beams 256D are shown by way of illustration, three pairs of diffracted light beams 256D can also be used. More generally, two or three pairs of beams 256D can be employed, wherein the two or three beam pairs are symmetrically arranged to generate interference image 158.

Introducing an Exposure Threshold

In some cases, it may prove desirable to introduce a small, uniform amount of inhibition light 256D into each hole 300D to serve as a threshold that prevents low levels of illumination (exposure) light 56 from the surrounding pixels 40P from creating a partial exposure. This can conveniently be achieved by introducing a slight imbalance between the intensities of diffracted light beams 256D.

There are a number of ways to introduce this slight imbalance. One way includes attenuating one of the diffracted light beams 256D more than another using, for example, a selective attenuator arranged in one of the diffracted light beams. Introducing a window into the region before the acousto-optical modulators and where the two diffracted light beams 256D are cleanly separated allows the portion of the window used by one beam to be coated with efficient antireflective coatings and the portion of the window used by the other beam to have less efficient coatings.

The Transducer Image

The image transducer 150 is illuminated by uniformized light 56 using illuminator IL, as described above. The prism assembly 100 consists of the aforementioned two prism sections 100a and 100b separated by a small air gap that defines interface 106. The light 56 can pass through the gap when it is incident at the gap at near normal angles but is reflected when incident at angles near 45°.

Thus, light 56 incident on image transducer 150 at 24° to the normal readily passes through prism assembly 100. But reflected light 56R from micro-mirror 152 tilted at +12° hits the air interface 106 of the prism assembly 100 at 45° and is totally reflected down primary axis A0 toward objective lens 170. If the micro-mirror 152 is tilted at −12°, the only other option with a digital mirror, then the incident light 56 is reflected at an angle of 48° to the normal and is lost from the optical path.

The image transducer 150 thus defines an exposure radiation pattern (i.e., the transducer image 58) that is superimposed on the two-dimensional X-Y inhibition interference image 158 in photoresist layer 40 on substrate 30. Ideally, during exposure the superposition is such that each of a plurality of exposure pixels 58P (i.e., light from a given micro-mirror 152) is centered on one dark spot 300D. The net result is that where an exposure pixel 58P is present, a very small photoresist pixel 40P is created in photoresist layer 40 at the corresponding location. Where the exposure by interference image 158 causes photoresist 40 to be insensitive to activation by exposure light 56 of wavelength λ, the photoresist pixel 40P is surrounded by inhibited resist 401. The dimension (size) $L_P$ of the photoresist pixel 40P depends on the dose of exposure light 56R that forms the transducer image 58 and the intensity of the surrounding inhibition fringe patterns 160X and 160Y of interference image 158 that inhibits the exposure. In an example, the resultant photoresist pixel 40P can have a size $L_P$ that is ¹⁄₂₀th the size of the de-magnified pixel on image transducer 150, i.e., $L_P=(0.05) \cdot L_M/M$, where $L_M$ is the corresponding dimension of DMD micro-mirror 152 and M is the magnification ratio from the substrate 30 to the image transducer.

FIG. 6 shows an example of the diffraction-limited image of a single DMD pixel illuminated with 405-nm radiation (solid line) and the surrounding interference pattern generated with 532-nm radiation that follows a sine-squared function. Assuming that one watt of 532-nm radiation exactly cancels a similar intensity of 405-nm radiation, the resulting intensity distribution is given approximately by the dotted line in FIG. 6. Note that the resultant pixel profile represented by the dotted line is much narrower than the diffraction limited pixels represented by the solid line. Increasing the interference intensity serves to make the width of the narrowed pixel even narrower.

Stage Position Compensation for Overlay

An advantage of apparatus 10 is that it is not necessary to control the position of stage 20 to a small fraction of the size $L_P$ of super-resolution pixel 40P to achieve good overlay performance between the current pattern and previously created patterns on the substrate 30. In an example, the size $L_M$ of micro-mirror 152 can be about 10.6 microns, and the magnification provided by objective lens 170 can be about 36.6. This yields a pixel image size on the substrate 30 (i.e., a photoresist pixel 40P size) of $L'_M$ (see FIG. 4)=$L_P$ (see FIG. 6)=0.29 microns, where $L'_M$ is the size of an image pixel 58P in transducer image 58. Trimming this by a factor of 18 by forming bright spot 300B over dark spot 300D yields a pixel size of $L_P$=16 nm. The required overlay for this geometry might be 3 nm. Accurately positioning stage 20 in the presence of vibration and other influences to this accuracy can be difficult, because the bandwidth of the associated control system of substrate stage system SS is typically less than 100 Hz and because there are disturbances with higher frequency content.

The shortcomings of the positioning ability of substrate stage system SS, provided they are reasonably small, can be corrected by the aforementioned fringe shifters 270. The fringe shifters 270 are placed in each diffracted light beam 256D that generates the inhibition fringe patterns 160X and 160Y. Any increase or decrease in the path of the diffracted light beams 256D causes the fringes in interference image 158 to shift. Example fringe shifters 270 include Pockels cells, and Kerr cells, piezo-optic devices and acoustic modulators. Acoustic modulators (also called acousto-optic modulators) operate by reflecting light off of a moving sound wave in a transparent material. The sound wave might have a frequency on the order of 100 MHz, and the bandwidth of any of these devices might on the order of 100+ kHz or more.

The total range of the (phase) shift provided by the fringe shifters 270 need only be about one wavelength, roughly the distance between neighboring image pixels, since they need only operate during the time of the exposure. During this time frame, interference image 158 can be held stationary or moved in any direction on a continuous basis. Providing the stage position errors are small with respect to the size $L'_M \approx 0.295$ microns of a single exposure pixel 58P, the residual error can be corrected by moving the location of dark spots 300D with fringe shifters 270. In practice, the fringe pattern of interference image 158 can be locked into position on substrate 30 so it moves with the substrate during exposure. The positioning stability of the super-resolution lithography system is thus determined by the bandwidth of the fringe shifters 270 and not by the bandwidth of substrate stage system SS.

The Alignment and Intensity Monitoring System

With reference to FIGS. 1 and 2A, an example alignment system AS employs the picture from camera unit CU. The alignment system AS includes a digital camera 350, which views substrate 30 via second beam splitter BS2 and captures a digital image of the superimposed interference pattern and transducer images 158 and 58 as well the images of patterns previously placed on the substrate 30. The digital image of the superimposed interference pattern, transducer and previous images are embodied in an overlay signal SO, which is used to recognize and determine the positions of alignment targets 34 (see FIG. 6) contained in the layers created previously on substrate 30 with respect to the superimposed interference pattern and transducer images 158 and 58.

A filter changer 356 that inserts different filters 354 in front of digital camera 350 is used to permit the digital camera to image over different wavelengths or wavelength bands so as to get an optimum image of the alignment targets 34 on the substrate 30. In an example, different filters 354 that shape the spectrum to enhance the appearance of the various image components are used. The filter changer 356 is operably connected to controller CO. The apparatus 10 performs alignment between the previous patterns formed on the substrate 30 and the new pattern to be formed on the substrate using the transducer image 58 and the interference image 158.

The digital camera 350 can also be used to measure the relative intensities of the interference light 256 used to create interference image 158 and the exposure light 56 used to illuminate image transducer 150. To make an absolute intensity measurement, the reflectance of substrate 30 has to be accurately known. This is achieved by employing a reflective element 38 on substrate stage top surface 22. The reflective element 38 has a known reflectivity-versus-wavelength characteristic and in an example lies in the same plane as substrate top surface 32.

To achieve an accurate overlay between an existing pattern on the substrate 30 and the next pattern, the optical path from digital camera 350 to the substrate has to be very well corrected. In an example, digital camera 350 includes more than four image-sensing pixels for every exposure pixel 58P in transducer image 58. The second beam splitter BS2 can be spectrally neutral and need only reflect a tiny portion of light 56 passing through it.

Distortion Correction

In many instances, photoresist patterns formed in photoresist layer 40 on substrate 30 need to be accurately overlaid with existing patterns that have been previously formed in a photoresist layer or in the substrate surface.

However, photoresist patterns are not always geometrically perfect. The compressive and tensile layers added to the substrate 30 combined with an anisotropic circuit pattern can cause the substrate to distort; in addition, the mask pattern and the optical system that defined the previous pattern may not have been perfect to start with.

To achieve a very tight overlay between an existing substrate pattern and a follow-on pattern, it is often necessary to map the location of a number of chips or even a few locations within each chip and then distort the pattern to be overlaid so that it best fits the underlying pattern. One of the advantages of apparatus 10 is that it affords great flexibility in adjusting the shape and position of the interference pattern and transducer images 158 and 58. By adding a small correction to the desired stage position as a function of the stage position, it is possible to distort the particular pattern being overlaid so that it accurately conforms to the underlying (existing) patterns.

The Metered Stage

Commercially available substrate stages do not have the metrology accuracy required for state-of-the-art lithography. Laser gauging via interferometric positioning system 26 and reflecting member 28 provides sub-nanometer resolution, as long as the air path through which measurement light (laser beam) 27 travels can be made sufficiently thermally stable. In most industrial environments, the accuracy is about 20 nm.

An example aspect of apparatus 10 employs a two-dimensional reference grid (not shown) on a thermally inert substrate 30 that is positioned at the substrate focal plane level, and outboard of any substrate location. The reference grid is read by transducers located on stage 20. A grid consisting of 0.5-micron lines and spaces can be interpolated to about 1 part in 500, yielding a resolution of about 1 nm.

Inhibition Fringe Scale and Rotation Adjustment

The alignment of interference image 158 with transducer image 58 may require an adjustment of the scale or magnification of the interference pattern. This can be achieved by designing interference pattern generator IPG so that interference image 158 is slightly larger than required, and then tilting the phase grating 266 (with respect to primary optical axis A0) to slightly reduce the image size. In this case, the scale varies as the cosine of the angle between the grating normal and the optical axis A0. This adjustment can be carried out automatically using electrical actuators to rotate each phase grating 266 about a line parallel to the grating lines and through the grating center. The angular orientation of the fringe patterns 160X and 160Y can be adjusted by rotating the phase grating 266 about the optical axis A0.

In another example, light source 250, collimating lens 260 and phase grating 266 are configured to focus each of the ±1 order beams 256D into optical fibers, which are brought into the objective assembly and relayed to the pupil plane 176P using a small relay lens (not shown). By adjusting the position of the small relay lens, the emission end of the optical fiber, or some intermediate element, the period of interference image 158 can be changed and the image rotated.

Variable Resolution

The apparatus 10 is configured to provide a variable degree of resolution. Lower-resolution imaging can be performed more quickly than higher-resolution imaging so that the appropriate amount of resolution can be applied for the given pattern to be formed. For example, a pattern requiring a pixel size of 40 nm could be done about four times faster than a pattern requiring a pixel size of 20 nm.

To change the resolution of apparatus 10, in an example the intensity of light 256 from laser source 250 is changed, which changes the intensity in interference image 158 and the pixel dimension $L_D$ created by dark spots 300D. A different pixel dimension $L_D$ requires a different rasterized database, as well as a different scan trajectory and scanning speed. It is noted here that dark spots 300D do not have a definite size. They are defined by a substantially parabolic intensity distribution so that the super-resolution photoresist pixel 40P is determined by the ratio of the exposure intensity to the inhibition intensity.

Thermal Compensation

On a nanometer scale, thermal effects on the imaging process need to be controlled since at such small scales thermal stability is difficult to achieve. Small temperature differences in the air path between the diffracted light beams 256D used to produce interference image 158 can cause motions in the fringe position. Small thermal changes in objective lens 170 and the components in interference pattern generator IPG can slowly change the alignment between transducer image 58 and interference image 158. It is therefore desirable to have a position reference standard and to constantly position the other critical items in relation to the standard. For example, the position of image transducer 150 as seen by digital camera 350 can be selected as the position reference standard, and the expected position of interference image 158, taking into account correction for stage position error, can be compared to the actual position to generate a correction signal. When applied to the fringe shifters 270, this signal can correct for short-term air path thermal fluctuations as well as longer-term thermal changes in apparatus 10.

Data Transfer

In most configurations of apparatus 10, image transducer 150 is most likely to be the gate for data transfer. For example, the Texas Instruments 1080p DMD has a maximum frame rate of 20,000 frames per second, which corresponds to a data rate of 41.5 Gb/s. With a 64- or a 128-bit wide bus, this frame rate is not a problem for most applications. However, for apparatus 10 to achieve a throughput comparable to modern DUV scanners, the data rate needs to be higher, e.g., 12 Tb/s, or about 290 times the data rate of a typical DMD.

Figure 7:
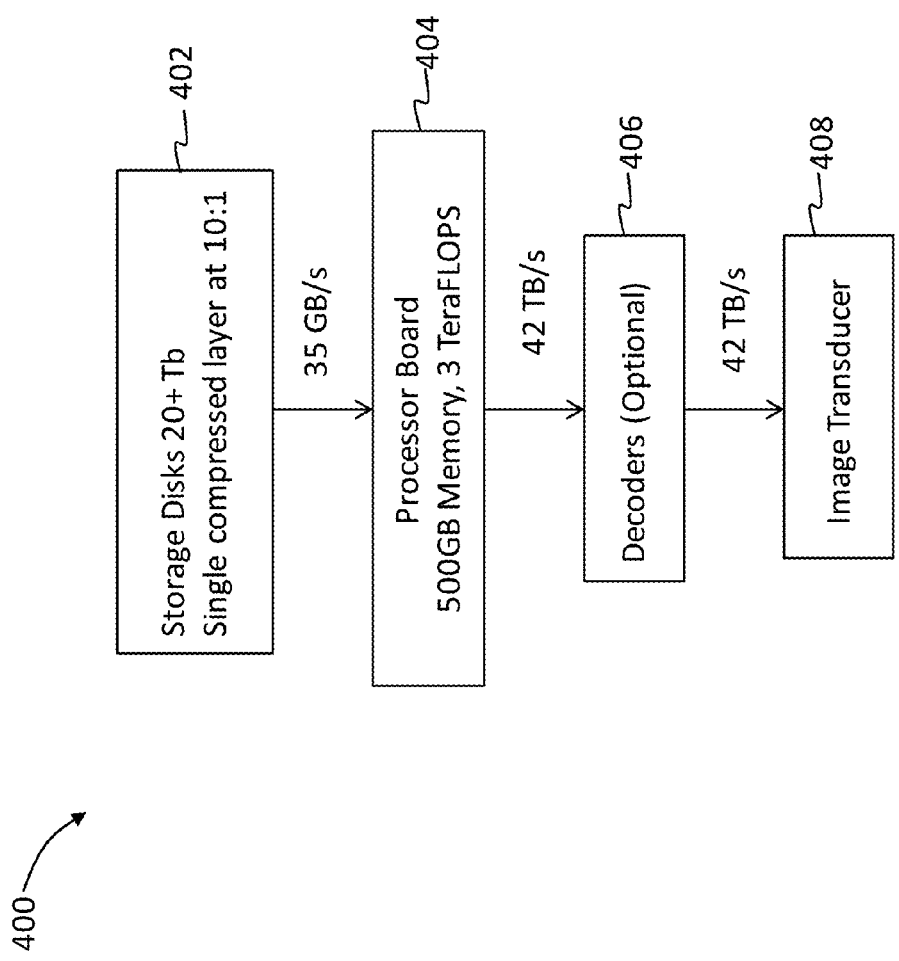
FIG. 7 is a flow diagram that illustrates an example embodiment of a method of achieving a sufficiently high data transfer rate for the direct-write lithography apparatus to have a reasonable throughput.

FIG. 7 is a flow diagram that illustrates an example embodiment of a data transfer method 400 of achieving a data transfer rate high enough for apparatus 10 to achieve a reasonable throughput. With reference to a step 402, apparatus 10 starts with rasterized, flattened layouts of a chip to be formed using wafer 30. The layouts are stored in a mass storage system MSM, which is shown in FIG. 1 by way of example and for ease of illustration as being part of controller CO. With reference to a step 404, the compressed layouts of step 402 are then transferred to the processor board, which has enough memory to store one layer at a time, e.g., 2 Tb of memory and a processing capability of 3 TeraFLOPS or more.

An example data rate for this particular transfer is about 35 Gb/s. With reference now to steps 406 and 408, the processor board then transfers the compressed layout to the image transducer 150 at a data rate of about 42 Tb/s. The image transducer 150 contains a large number of decoders and writing elements. The output of the decoders is uncompressed layout data, which is fed to the writing elements. The data transfer method 400 of FIG. 7 benefits from employing efficient and lossless compression and decompression algorithms as well as error checking.

To achieve a 12 Tb/s data rate or the even higher data rate of 42 Tb/s proposed for the extension to this technology, method 400 can be carried out using current super-computer technology, which has achieved computing speeds as high as 3 or 6 TeraFLOPS. This computing capacity can also support very high data rates, such as the aforementioned 42 Tb/s. The extra computing power, made available only recently, may obviate the need for the decoders, making it possible to transfer data directly from the processor board to the image transducer 150 without passing through decoder step 406 in method 400.

Illumination Uniformity and Exposure Dose Control

An image of the objective exit pupil 176 placed on photodetector 200 can be used to determine either the average exposure dose by turning on all the image-transducer pixels (i.e., micro-mirrors 152) or the variation in dose by turning on small groups of pixels progressively across the field. Variations in the tilt angle of the image-transducer micro-mirrors 152 can be measured by closing down aperture 78 in relay optical system 70, and then measuring the image pupil position on imaging photodetector 200. Measurement of the position of the center of the illumination patch on a pixel-by-pixel basis yields the total variation in the mirror tilt angle across the DMD micro-mirror array.

Controller

The controller CO is operably connected to all the electrically controlled devices and components in apparatus 10. The controller CO includes a display and a keyboard that serve as an operator interface. The mass storage system MSM is used for storing pattern information to be used by image transducer 150.

In one embodiment, controller CO includes a device, for example, a floppy disk drive, CD-ROM drive, DVD drive, magnetic optical disk (MOD) device (not shown) or any other digital device including a network connecting device such as an Ethernet device or an optical fiber-based network (not shown) for reading instructions and/or data from a computer-readable medium, such as a CD-ROM, a DVD, a MOD or any other digital source such as a network or the Internet, as well as yet-to-be-developed digital means. In another embodiment, controller CO executes instructions stored in firmware or software in a processor or a memory.

In an example, controller CO is configured (e.g., programmed) to perform the functions described herein, and as used herein. The controller CO may include one or more computers, processors, microcontrollers, microcomputers, programmable logic controllers, application-specific integrated circuits, other programmable circuits and the like.

Software may be used to implement or to aid in performing the disclosed concepts. Software functionalities of a computer system involving programming, including executable code, may be used to implement the methods disclosed herein. The software may be code that is executable by controller CO. In operation, the code and possibly the associated data records are stored within the computer and control system or stored externally. Hence, the embodiments discussed herein may involve one or more software products in the form of one or more modules of code carried by at least one machine-readable medium.

As used herein, a machine-readable medium refers to any medium that participates in providing instructions to a processor for execution. Such a medium may take many forms, including, but not limited to, non-volatile media, volatile media and transmission media. Non-volatile media include, for example, optical or magnetic disks, such as any of the storage devices in any computer(s) operating as one of the server platforms discussed above. Volatile media include dynamic memory, such as the main memory of such a computer platform. Physical transmission media include coaxial cables, copper wire and fiber optics, including the wires that comprise a bus within a computer system. Carrier-wave transmission media can take the form of electric or electromagnetic signals or of acoustic or light waves such as those generated during radio frequency (RF) and infrared (IR) data communications.

Common forms of computer-readable media therefore include, for example: a floppy disk, a flexible disk, a hard disk, magnetic tape and any other magnetic medium; a CD-ROM, a DVD and any other optical medium; less commonly used media such as punch cards, paper tape and any other physical medium with patterns of holes; a RAM, a PROM, an EPROM, a FLASH-EPROM and any other memory chip or cartridge; a carrier-wave transporting data or instructions; cables or links transporting such a carrier wave; or any other medium from which a computer can read programming code and/or data. Many of these forms of computer readable media may be involved in carrying one or more sequences of one or more instructions to a processor for execution.

The controller CO may be configured (e.g., via hardware, software, or a combination of both) to provide enhanced data transfer, data compression and processing techniques known in the art to facilitate the handling and processing of large amounts of data. Examples of such systems and methods are disclosed in U.S. Pat. No. 7,590,996, entitled "Data Path for High Performance Pattern Generator," and in Cramer et al., "Lossless compression algorithm for REBL direct-write E-beam lithography system," Alternative Lithographic Technologies II, edited by Daniel J. C. Herr, Proceedings of the SPIE, Vol. 7637, pp. 76371L, Apr. 2, 2010, which patent and which article are incorporated by reference herein.

EXAMPLE

An example apparatus 10 has a DMD-based image transducer 150 with micro-mirrors 152 as pixels having a center-to-center spacing SC of 10.8 microns, an inhibition wavelength $\lambda_2=532$ nm, and a numerical aperture NA=0.9 for objective lens 170. The spacing SF of fringes 160X and 160Y at substrate 30 is given by:

$$SF=\lambda/2NA=(0.532 \text{ microns})/(2\times 0.9)=0.2956 \text{ microns}$$

The inhibition fringe spacing SF is equal to the DMD pixel size L'M=LM/M, where M is the de-magnification of objective lens 170. Thus, $$L'_M=(10.8 \text{ microns})/M=0.2956 \text{ microns}$$

The magnification ratio M is therefore:

$$M=10.8/0.2956=36.541$$

Assuming the resolution R is 1/20 of the substrate pixel size, which is commensurate with experimental results, the minimum feature size $L_P$ that can be imaged is given by:

$$L_P=(0.2956 \text{ microns})/20=14.8 \text{ nm}.$$

Optical Modelling

FIG. 3 shows a small segment of the crossed-fringe interference image 158 as formed at substrate 30 or in photoresist 40 deposited thereupon. The regular pattern of dark spots 300D is clearly visible. FIG. 4 shows a small segment of the transducer image 58 where every other DMD micro-mirror 152 is turned "off" to create the checkerboard effect.

Figure 8:
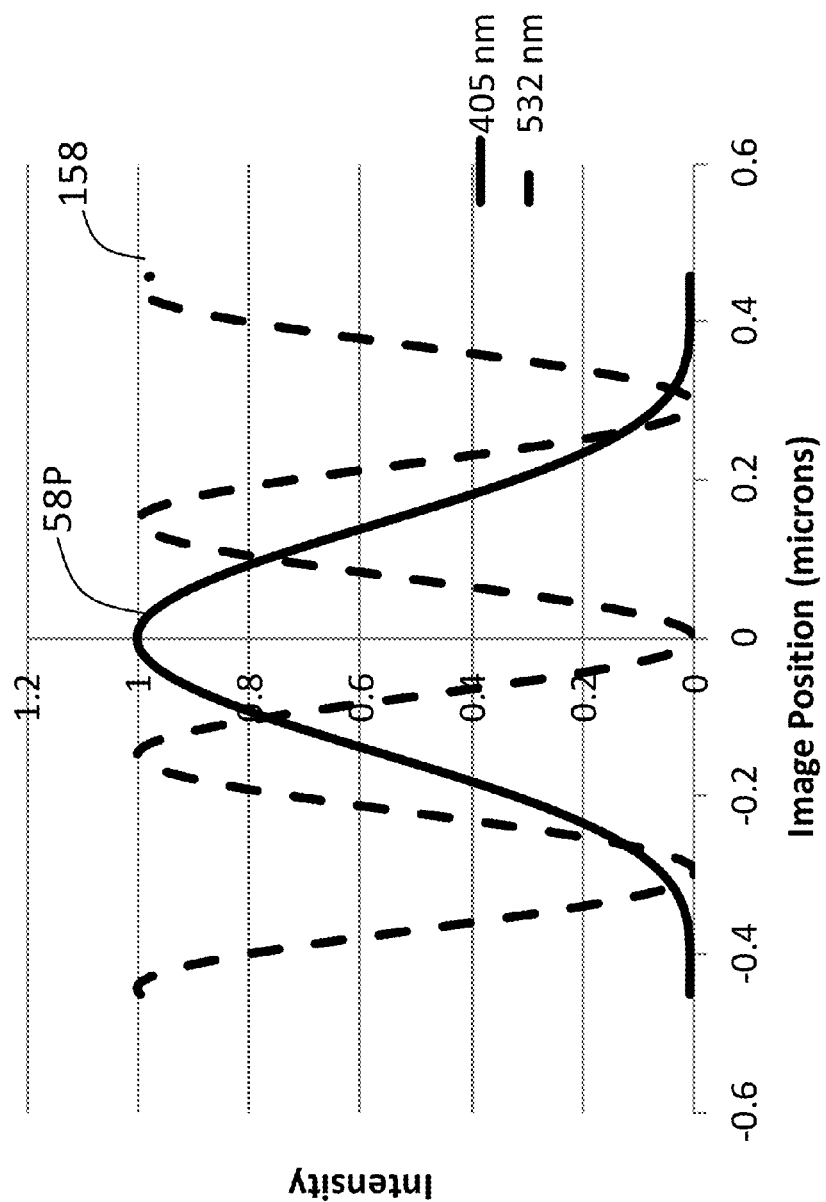
FIG. 8 is a plot of image position (microns) versus intensity (normalized) showing a cross-section in the X- or Y-direction through the middle of one pixel of the transducer image.

FIG. 8 is a plot of image position (microns) versus intensity (normalized) showing a cross-section in the X- or Y-direction through the middle of one pixel 58P of transducer image 58. The plot of FIG. 8 shows the intensity profile of a 405-nm "on" pixel (micro-mirror 152) illuminated incoherently ($\sigma=\infty$) and the inhibition fringes of interference image 158 centered on the pixel edges on either side. The width of a demagnified DMD pixel is $L'_M=0.295$ microns, which is also the distance from the center of one interference fringe to another. Note that at the center of the next pixel 58P the exposure illumination intensity from the first pixel has fallen to about 6.3%.

Figure 9:
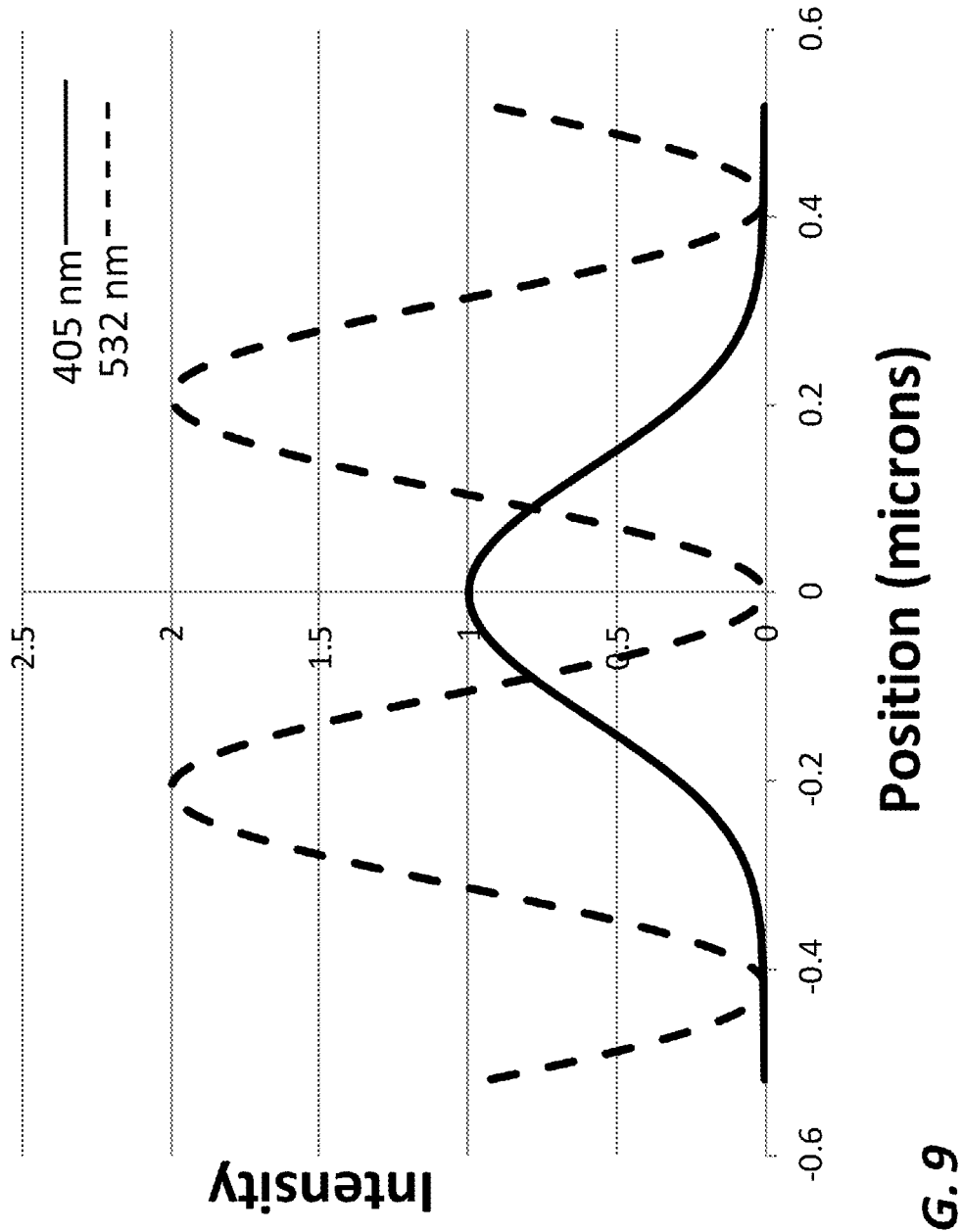
FIG. 9 is a plot of position (microns) versus intensity (relative units) for a portion of the interference image (dashed line) at second wavelength $\lambda_2$=532 nm and a portion of the transducer image (solid line) at first wavelength $\lambda_1$=405 nm showing how diagonally adjacent pixels also make a contribution to the overall intensity distribution.

FIG. 9 is a plot of position (microns) versus intensity (relative units) for a portion of the interference image 158 (dashed line) at second wavelength $\lambda_2=532$ nm and of the transducer image 58 (solid line) at first wavelength $\lambda_1=405$ nm. The plot of FIG. 9 illustrates how diagonally adjacent pixels 58P also make a contribution. In this case, the contribution from the nearest diagonal pixel 58P amounts to only 1.0% and for the four nearest diagonal pixels 58P combined amounts to 4%. Thus the total contribution from the four adjacent pixels 58P and the closest diagonal pixels totals about 29%. Depending on the nature of the resist (high or low contrast) and the expected performance of the lithography system, a 29% worst-case contribution from adjacent pixels 58P may or may not be acceptable.

The regions most susceptible to scattered or diffracted light from an "on" pixel 152 are the dark spots 300D centered on the nearby "off" pixels. A point on the substrate 30 anywhere between two dark spots 300D is located in a relatively high inhibition fringe intensity and therefore is not very susceptible to partial exposure from scattered or diffracted light. Thus, to a first approximation, it is necessary only to consider scattered light from one dark spot 300D to another and permissible to disregard other nearby exposures where the positions of the black holes on the substrate have been changed.

A situation wherein light 56 from the surrounding transducer pixels 152 creates a significant background in an "off" transducer image pixel 58P can be mitigated by not using all the pixels 152 in image transducer 150. In this case, some pixels 152 in image transducer 150 are turned off during the imaging process. There are many ways of achieving a reduced exposure background in "off" pixels 152.

Figure 10:
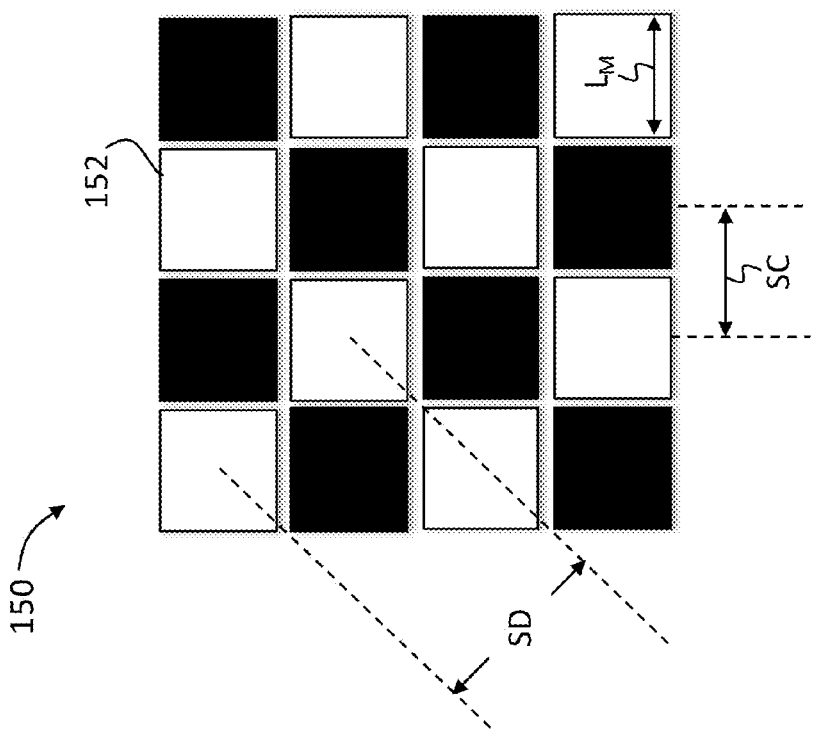
FIG. 10 is a schematic diagram of a portion of the image transducer and illustrates how every other pixel can be turned off to increase the center-to-center distance between the nearest "on" pixels by $\sqrt{2}$ times the nominal pixel spacing.

FIG. 10 is a schematic diagram of a portion of image transducer 150 and illustrates how every other pixel 152 can be turned off to increase the center-to-center distance between the nearest "on" pixels by $\sqrt{2}$ times the nominal pixel spacing. In this case the pixel-to-pixel spacing is increased, but the image profile remains largely the same. The array of pixels 152 of the image transducer 150 can be made with every other pixel permanently turned off, or the "off" pixels can be swapped with the "on" pixels between scans to keep the micro-mirror duty cycle approximately constant. In this case the only adjacent pixels 152 are on the diagonal, and these add a total contribution of only 4%. The contributions from each of the nearest X- or Y-direction pixels, which are two pixels removed, amounts to only 0.27% each, yielding a total contribution of about 5%.

Figure 11:
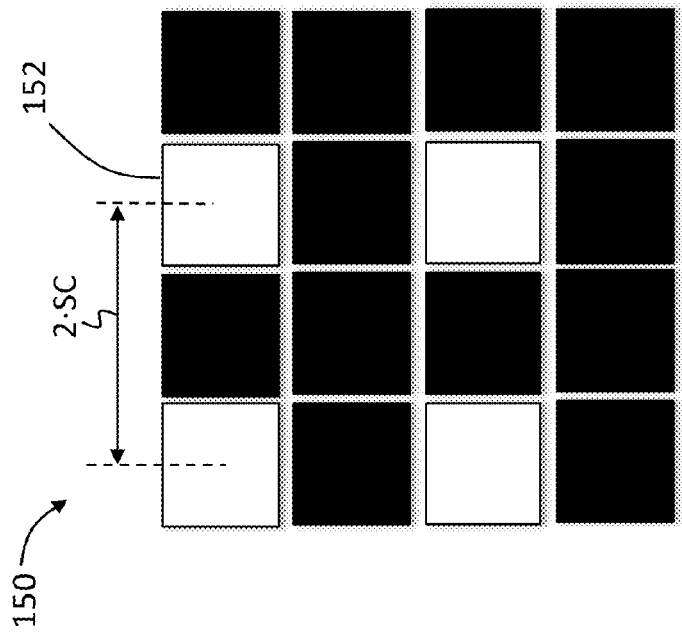
FIG. 11 is similar to FIG. 10 and illustrates how the spacing between active (on) pixels can be increased to twice the pixel spacing distance.

FIG. 11 is similar to FIG. 10 and illustrates how the spacing between active (on) pixels 152 can be increased to twice the pixel spacing distance (2·SC). However, the number of active pixels 152 has been reduced to 1/4 of the total number of pixels. A comparison of the amount of light contributed from nearby pixels is shown in Table 1. The values in the table are only a first approximation to the problem because only the contributions from the nearest and next nearest neighboring pixels have been taken into consideration, and it is assumed that there are no interference effects. Table 1 shows that the checkerboard arrangement reduces the contribution from nearby pixels by almost a factor of 4 and reduces the number of active pixels by a factor 2, which has a direct effect on throughput.

TABLE 1

| Configuration | Every Pixel | Every Other Pixel |
| --- | --- | --- |
| Contribution from nearest X or Y pixel | 6.3% | 0.27% |
| Contribution from nearest diagonal pixel | 1.06% | 1.06% |
| Total contribution from nearest 8 surrounding pixels | 29.4% | 5.32% |

Based on the above analysis, it appears that while one can in principle employ every pixel 152 of a DMD to form transducer image 58, there will be some proximity effects, i.e., contributions to the exposure intensity from nearby pixels. The worst-case exposure addition to a single pixel is estimated to be about 29.4%. Also, the total contributions listed in Table 1 assume a worst-case effect where all the pixels surrounding a pixel of interest are turned on, which may or may not be the case.

Image-Transducer Pixel Size and Shape

Figure 12B:
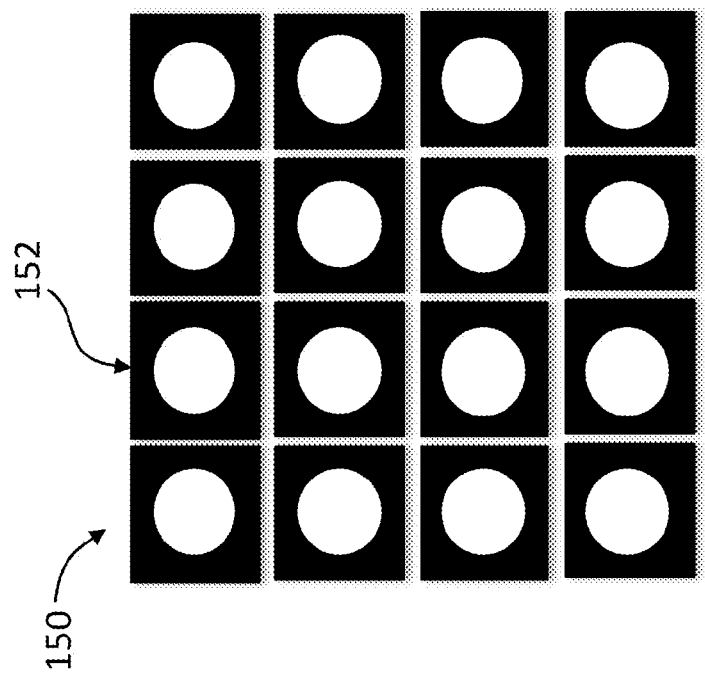
FIGS. 12A and 12B are similar to FIG. 11 and illustrate examples of circular transducer pixels.
Figure 12A:
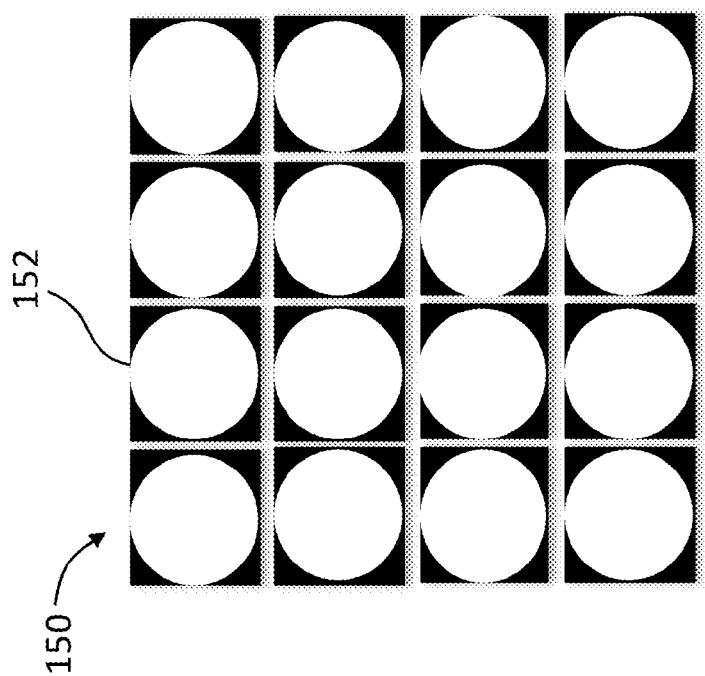

One way of reducing the proximity effect is simply to change the shape of the image-transducer pixel 152. FIG. 12A is similar to FIG. 11 and illustrates an example portion of image transducer 150 wherein the pixel 152 has a circular shape. Assuming the diameter of the circular pixel 152 is equal to the width $L_M$ of the square pixel, the light collection efficiency is reduced by $1-\pi/4=21.5\%$, while the proximity effect is slightly reduced. FIG. 12B is similar to FIG. 12A, but with the reflective portion of each pixel 152 reduced in size.

Figure 13:
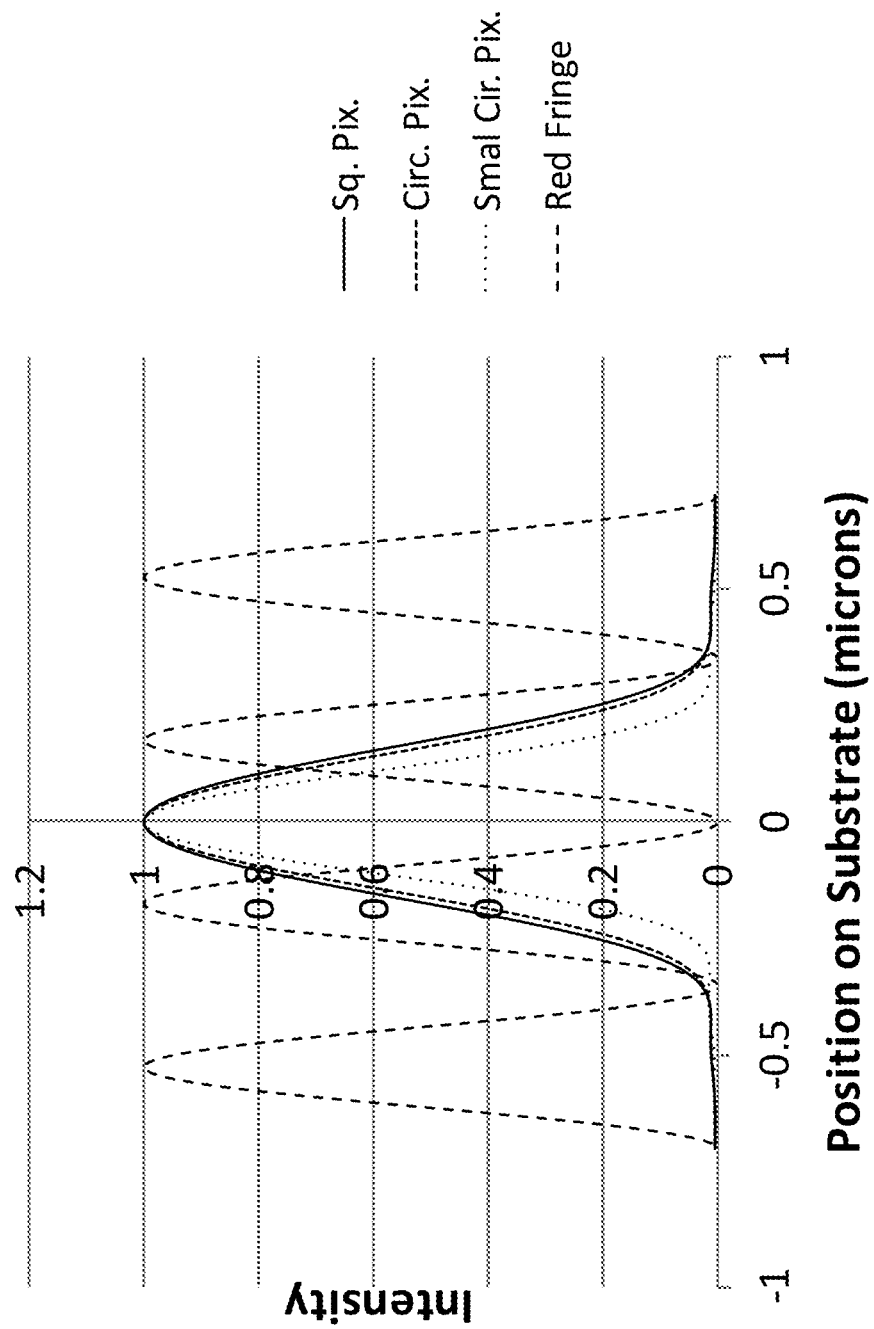
FIG. 13 is a plot of position (microns) versus intensity (normalized) that illustrates simulated intensity profiles for various image-transducer pixel shapes and sizes.

FIG. 13 is a plot of position (microns) versus intensity (normalized) that illustrates simulated intensity profiles for various image-transducer pixel 152 shapes and sizes. In all cases the profile represents a cross-section taken through the middle of the pixel 152 in either the X- or Y-direction. Square pixels 152 have the advantage that they can be packed closely and efficiently illuminated. However, this is not necessarily the optimum arrangement for minimizing the amount of light 56 that can be transferred from one DMD micro-mirror 152 to the center of the image of another DMD micro-mirror.

In the comparison shown in the plot of FIG. 13, the circular pixel 152 has a diameter equal to the width of the square pixel, and the small circular pixel has a diameter equal to 50% of the width of the square pixel. Table 2 summarizes the stray light comparisons for the different shapes and sizes of pixel 152.

TABLE 2

|  | Full Square pixel | Full Circular pixel | ½ Circular Pixel |
|---|---|---|---|
| Contribution from nearest X or Y pixel | 6.3% | 2.93% | 0.72% |
| Contribution from nearest diagonal pixel | 1.06% | 1.04% | 1.1% |
| Total contribution from nearest 8 surrounding pixels | 29.44% | 15.88% | 7.28% |

Interference Effects: Checkerboard Array

Especially for illumination sigma (σ) values below 1, there are appreciable contributions from pixels 152 that are not near neighbors, and the relative phase of each contribution needs to be taken into account. The phase of the four pixels closest to a reference pixel 152 can be varied by depositing a coating onto these pixels, which adds a phase shift and can influence the contribution from the surrounding pixels. This influence is illustrated in Table 3, which summarizes the following cases for a number of different phase shifts in the pixels 152 immediately surrounding the reference pixel: 1) "All pixels off" refers to the intensity at the reference image center when all the pixels including the reference pixels are off; 2) "Ref pixel off" refers to the intensity at the reference image center when all the pixels except the reference pixel are on; 3) "Ref Pixel on" refers to the intensity at the reference image center when all the pixels except the reference pixel are off; and 4) "All pixels on" refers to the intensity at the reference image center when all the pixels including the reference pixel are on.

TABLE 3

Interference effects from surrounding pixels on a checkerboard array

|  | σ = 1 | σ = 0.5 | σ = 0 | Nearest Pixel Phase Shift |
|---|---|---|---|---|
| All pixels off | 0 | 0 | 0 | 0 |
| Ref. pixel off | 0.03283 | 0.00833 | 0.00094 | 0 |
| Ref. pixel on | 1 | 1 | 1 | 0 |
| All pixels on | 1.10959 | 0.84888 | 1.06220 | 0 |
| All pixels off | 0 | 0 | 0 | −45° |
| Ref. pixel off | 0.03165 | 0.00898 | 0.00523 | −45° |
| Ref. pixel on | 1 | 1 | 1 | −45° |
| All pixels on | 1.09325 | 0.90122 | 1.10848 | −45° |
| All pixels off | 0 | 0 | 0 | −90° |
| Ref. pixel off | 0.02882 | 0.01056 | 0.01560 | −90° |
| Ref. pixel on | 1 | 1 | 1 | −90° |
| All pixels on | 1.05380 | 1.02759 | 1.22022 | −90° |
| All pixels off | 0 | 0 | 0 | −135° |
| Ref. pixel off | 0.02599 | 0.01214 | 0.02597 | −135° |
| Ref. pixel on | 1 | 1 | 1 | −135° |
| All pixels on | 1.01436 | 1.15396 | 1.33195 | −135° |
| All pixels off | 0 | 0 | 0 | −180° |
| Ref. pixel off | 0.02481 | 0.01279 | 0.03027 | −180° |
| Ref. pixel on | 1 | 1 | 1 | −180° |
| All pixels on | 0.99802 | 1.20631 | 1.37823 | −180° |

Note that the biggest variations in "Ref pixel off" and "Ref pixel on" occur when σ equals 0. In this case the optimum value for the phase shift on the closest pixels 152 is zero. If σ equals 1, the opposite is true: the optimum phase shift is 180°. For a σ value of 0.5, the optimum appears to be zero.

For a typical DMD, the tilt angle tolerance on the micro-mirrors 152 is quoted as ±1°, which results in a ±2° variation in the direction of the light beam 56R that is reflected from each micro-mirror. This variation turns out to be larger than the half angle subtended by the objective pupil 176, making it necessary to considerably overfill the objective pupil just to ensure that the illumination beam 56 is not vignetted at the pupil. Under these conditions, there is no satisfactory solution to be gained by putting a phase-shifting coating on the nearest neighbor pixels 152. The line-width variation due to proximity effects may be unacceptable even with an optimum phase shift.

An alternative to moving the pixels 152 apart in order to avoid proximity effects appears to be adding sufficient inhibiting radiation so that there is no appreciable partial exposure in the "off" pixels. This can be done by adding interfering inhibition light 256 to the exposure beam 56 that illuminates the image transducer 150, by adding some zero-order interfering inhibition radiation at the center of the pupil 176, by not perfectly balancing the intensities of the interfering inhibition beams, and by illuminating the "off" pixels 152 with inhibition radiation at an angle opposite to the angle employed for the exposure beam. All but the last alternative requires an increase in the exposure intensity in order to offset the raised threshold due to the addition of the inhibition radiation.

A Different Technology has Different Rules

As conventional lithography pushes against the diffraction limit with $k_1$ values approaching the theoretical limit of 0.25, there is a trend toward reducing the pattern entropy, i.e., to simplify the mask pattern so it can be produced with better fidelity and with smoother edges. In some of the most advanced chips, the critical layers appear to be made from an array of equally spaced, parallel lines that are broken or joined to construct the circuit. Such images can best be made with a dipole or a quadrupole illumination scheme.

Employing a similar philosophy with a direct-write system offers strong advantages from a lithographic perspective and also places tight constraints on the circuit designer, but a different technology brings with it different rules. For example, there is no possibility of creating assist features on a DMD used for super resolution, and any analogy to simulating a phase-shift mask on the DMD boils down to the simple solution of putting a 180° phase shift on every other pixel 152 in a checkerboard arrangement.

For apparatus 10 employing a current version of a DMD such as is available from Texas Instruments, it is not feasible to employ any type of partially coherent illumination. Variations in the tilt angle from micro-mirror 152 to micro-mirror and from one device to another make it necessary to overfill the objective pupil 176 simply to ensure a consistent intensity in each pixel image. The best that can be achieved under these conditions is a σ value of approximately 1, and changing the phase of adjacent pixels 152 in order to minimize their interaction plays a relatively minor role.

Figure 14:
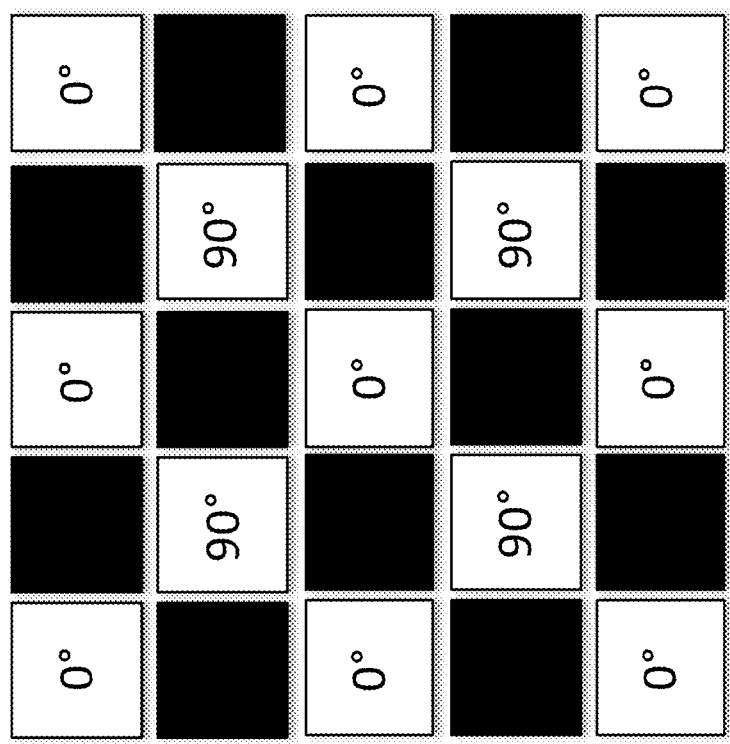
FIG. 14 is a schematic diagram that illustrates an example of how nearest neighbor image-transducer pixels can be phase shifted.

True spatial incoherence is achieved only with σ equal to infinity. Thus it still may be worthwhile to shift the phase of the light 56R reflected from the closest pixels 152 by an angle of about 180° to minimize contributions from the surrounding pixels. FIG. 14 illustrates an example of how the nearest neighbor pixels 152 can be shifted in phase. A relative shift of 90°, which corresponds to a quarter wavelength, was chosen as one example for illustrating how a phase shift between nearest neighbors can be organized. FIG. 14 also shows why any phase shift between adjacent pixels 152 has to operate in a complementary manner, i.e., serving to reduce, preferably equally, the interaction between both the unshifted and the phase-shifted pixel groups.

Pixel Writing Strategy

In a typical e-beam system used for writing mask patterns, the finest address structure is typically ⅕ to ⅒ the minimum feature size. This allows the circuit designer great flexibility in the location of pattern edges, but it increases the amount of information that must be handled to make a mask and impedes the throughput. In general, there are several methods of handling address structures that are much finer than the footprint of the writing beam. One method is to superimpose multiple images, each displaced with respect to one another, so that the final image edge is defined by the image edge coming closest to the target. Another method uses gray scaling wherein the beam intensity is modulated so that the critical exposure level, i.e., the exposure level where a small change causes the resist to stay or disappear, is achieved where the line edge is desired. Both methods involve the transfer and writing of large amounts of data, and this impedes the throughput.

With super-resolution lithography (SRL), it is desirable to have some overlap between adjacent pixels 152 in order to minimize line-edge roughness. To a reasonably good approximation, the exposure E in an isolated SRL pixel 152 is an inverted parabola that can be represented by the equation $E=1-ar^2$, where "a" is a constant that depends on the pixel size and r is the radial distance from the pixel center.

Figure 15:
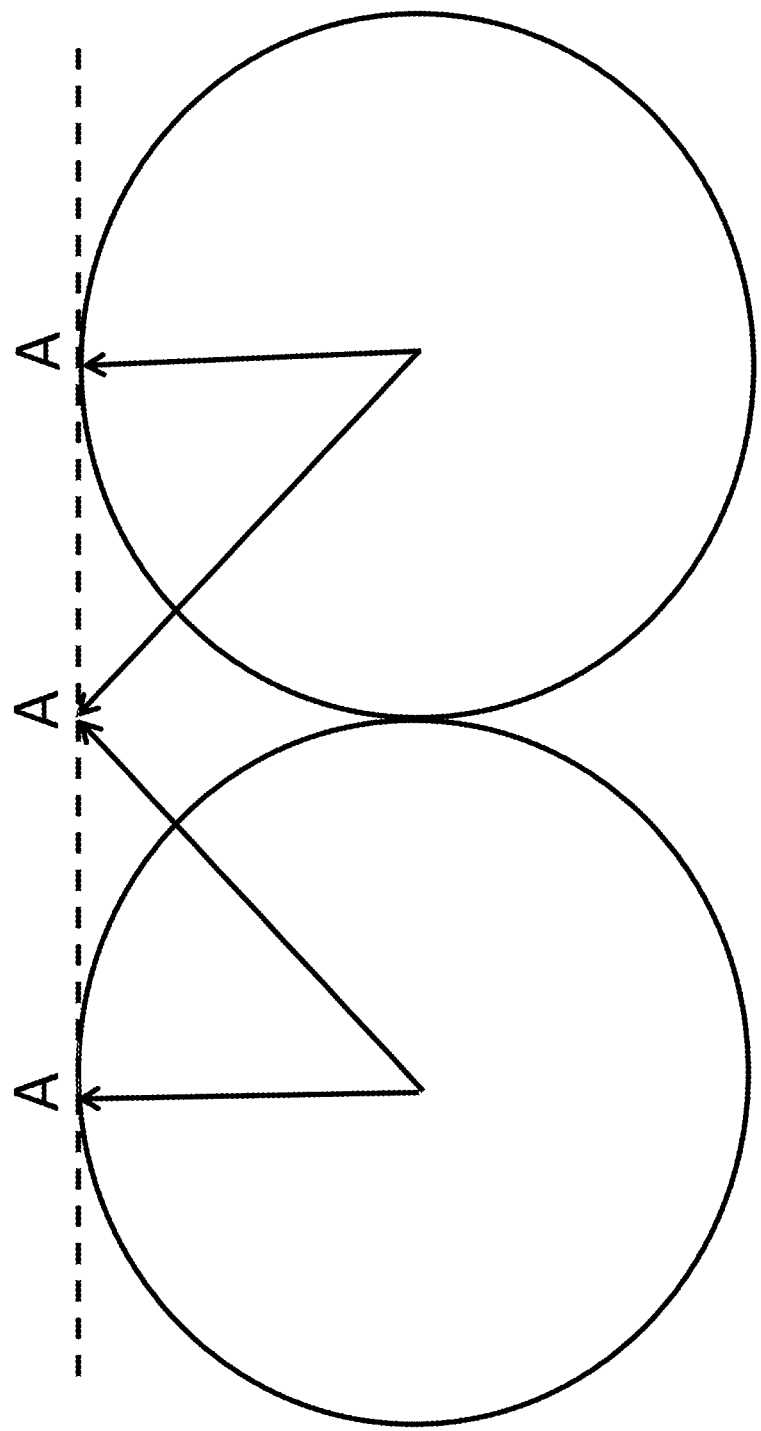
FIG. 15 is a schematic diagram that illustrates one method of minimizing the geometrical line-edge roughness (scalloped edges) caused by butting together circular pixels.

FIG. 15 is a schematic diagram that illustrates one method of minimizing the line-edge roughness that results when circular pixels abut one another. The method involves selecting the constant a so that the exposure dose is the same at the 3 points labeled A, two of which are 5 nm from the pixel center if the pixels are 10 nm in diameter. Thus:

$$E=1-a(5)^2=2(1-a(5^2+5^2))$$

$$a(100-25)=1$$

$$a=1/75=0.013333'$$

The threshold exposure is given by:

$$T=1-5^2/75=0.666$$

Figure 16:
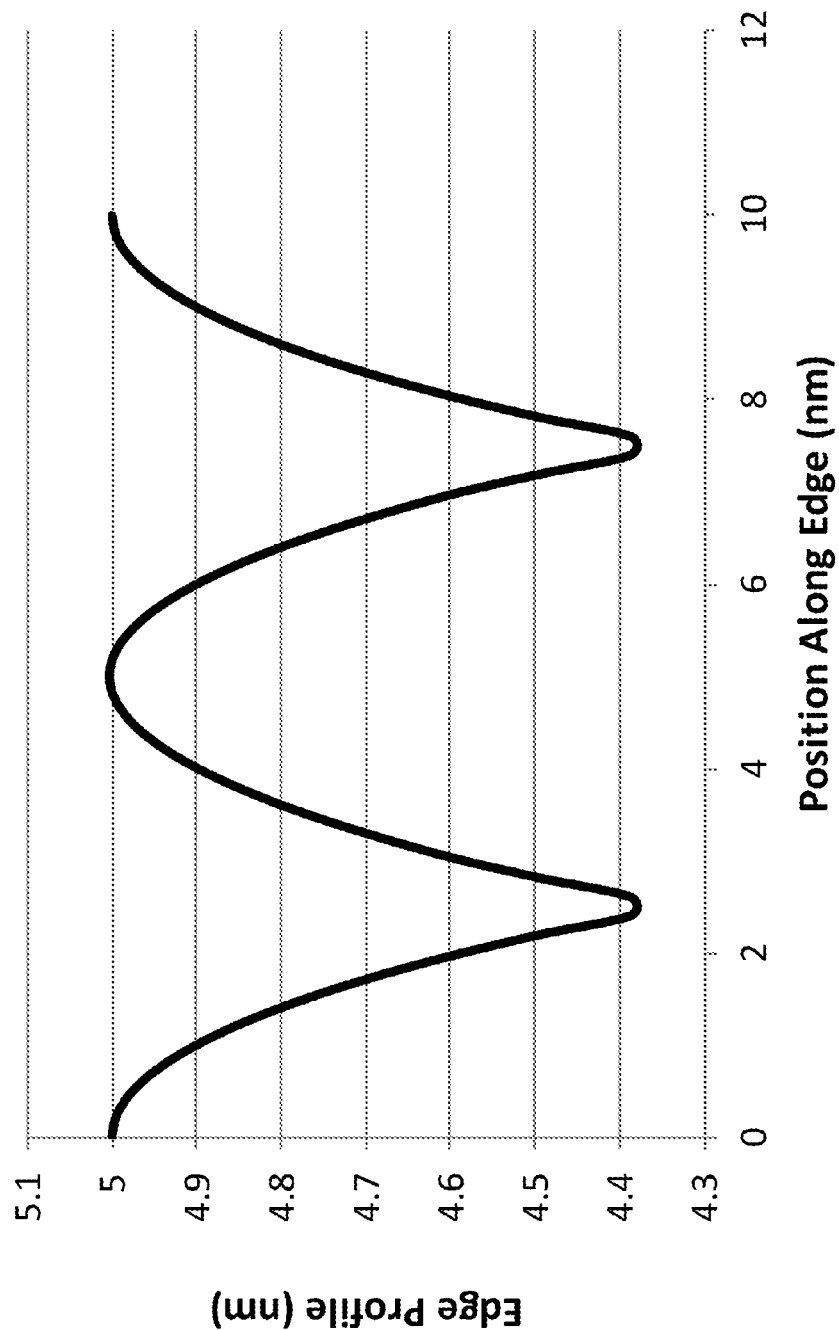
FIG. 16 plots the edge profile (nm) versus position along the edge (nm) for the method illustrated in FIG. 15.

The resulting line-edge profile is shown in FIG. 16, which plots the edge profile (nm) versus position along the edge (nm).

Using a threshold value of 0.666, the geometrical roughness produced by abutting 10-nm pixels is reduced to about 0.6 nm. In this case, the pixel radius measured where the exposure dose equals zero is 8.66 nm. The geometrical line-edge roughness LER would be the same on line edges aligned with the rows and columns of the image-transducer pixels 152 and degraded somewhat on diagonal lines. The ideal threshold value of 0.666 is based on the assumption that no inhibition light 256 is present at the very center of the pixel 152, where the fringe patterns 160X and 160Y have a minimum intensity. If in fact there is some residual inhibition light in the center of the pixel 152, then the amount of exposure light that is effective in producing an exposure dose will be reduced and the ideal threshold value will have to be calculated using the reduced amount of exposure light.

Figure 17:
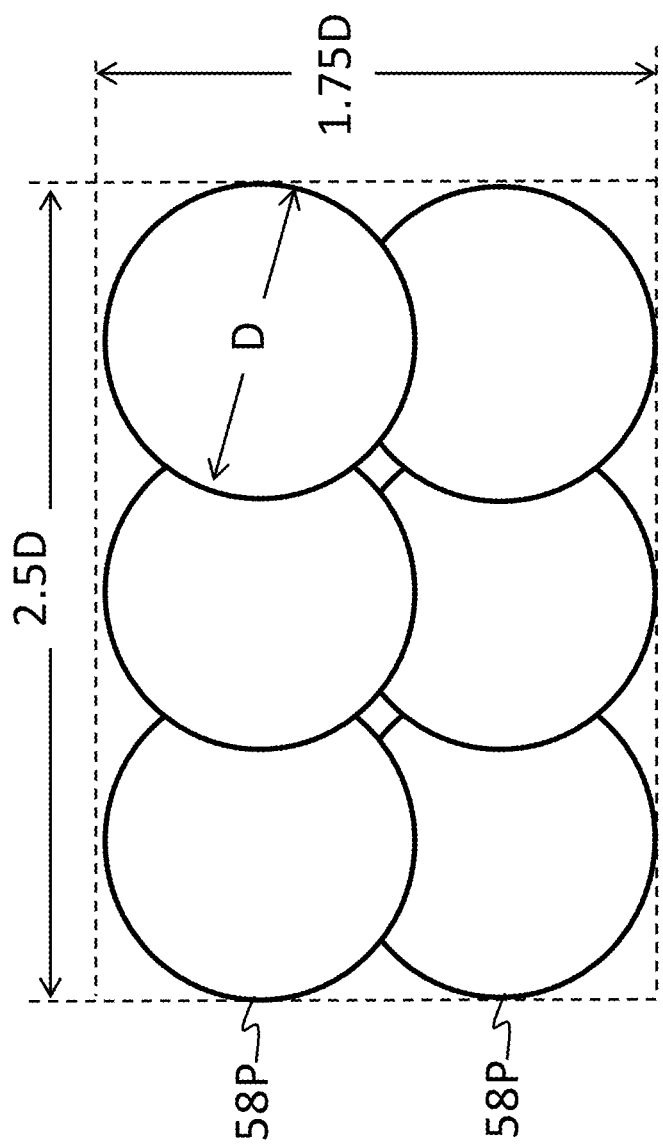
FIG. 17 is a schematic diagram of an example of overlapping pixel images.

In general, overlapping the portions of pixels 152 that, if isolated, would be above the threshold level increases the amount of data that needs to be transferred and results in a bias that must be added to or subtracted from the line width resulting from multiple superimposed pixels. An example of overlapping pixel images 58P is shown in FIG. 17. The edge profile of the resultant line segment is not accurately represented because there are partially exposed areas surrounding each exposed transducer pixel 58P, which, if the pixels are close enough, results in a complete exposure in the space between them. Overlapping pixels 58P lowers the threshold value, which increases the exposure level for a given photoresist 40, steepens the edge slope at the threshold point, and decreases the geometric line-edge roughness.

Filling in the Blank Spaces

Figure 18:
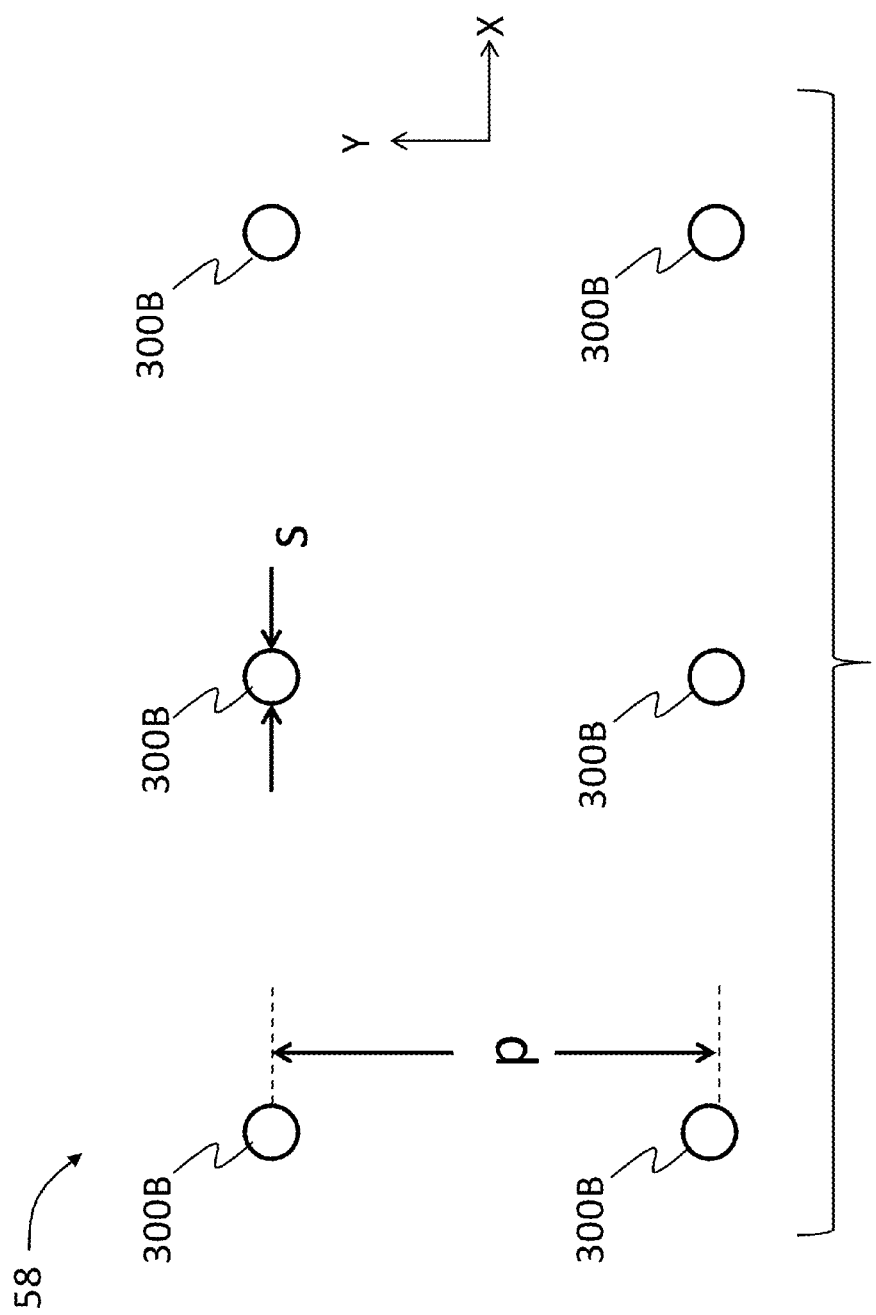
FIG. 18 is a schematic diagram that illustrates a sparse array of bright spots.

In an example operation of apparatus 10, a single exposure of the pattern on image transducer 150 creates via objective lens 170 a sparse array of bright spots 300B. Each bright spot 300B is a small fraction of the width of the distance to the next nearest spot. This is illustrated schematically in FIG. 18, where the width of a bright spot 300B (i.e., of a DMD pixel image 58P) is denoted "s" and the period between spots is denoted "p". The X- and Y-axes are defined by the directions of the rows and columns in the array of image transducer pixels 152, and that scanning is predominately along the Y-axis.

To construct an arbitrary pattern using bright spots 300B, the gaps of this sparse array can be filled in by superimposing multiple exposures. The number of exposures to be superimposed is roughly equal to $(p/s)^2$. If $p/s=N$, N being the number of super-resolution pixels 58P needed to fill the gap between adjacent super-resolution pixels, then the total number of exposures required to fill in the entire area is $N^2$. With a two-dimensional image transducer 150, this can be done in a single scan by employing substrate stage system SS, in particular interferometric positioning system 26, and moving stage 20 and substrate 30 supported thereby in a select manner.

Figure 19:
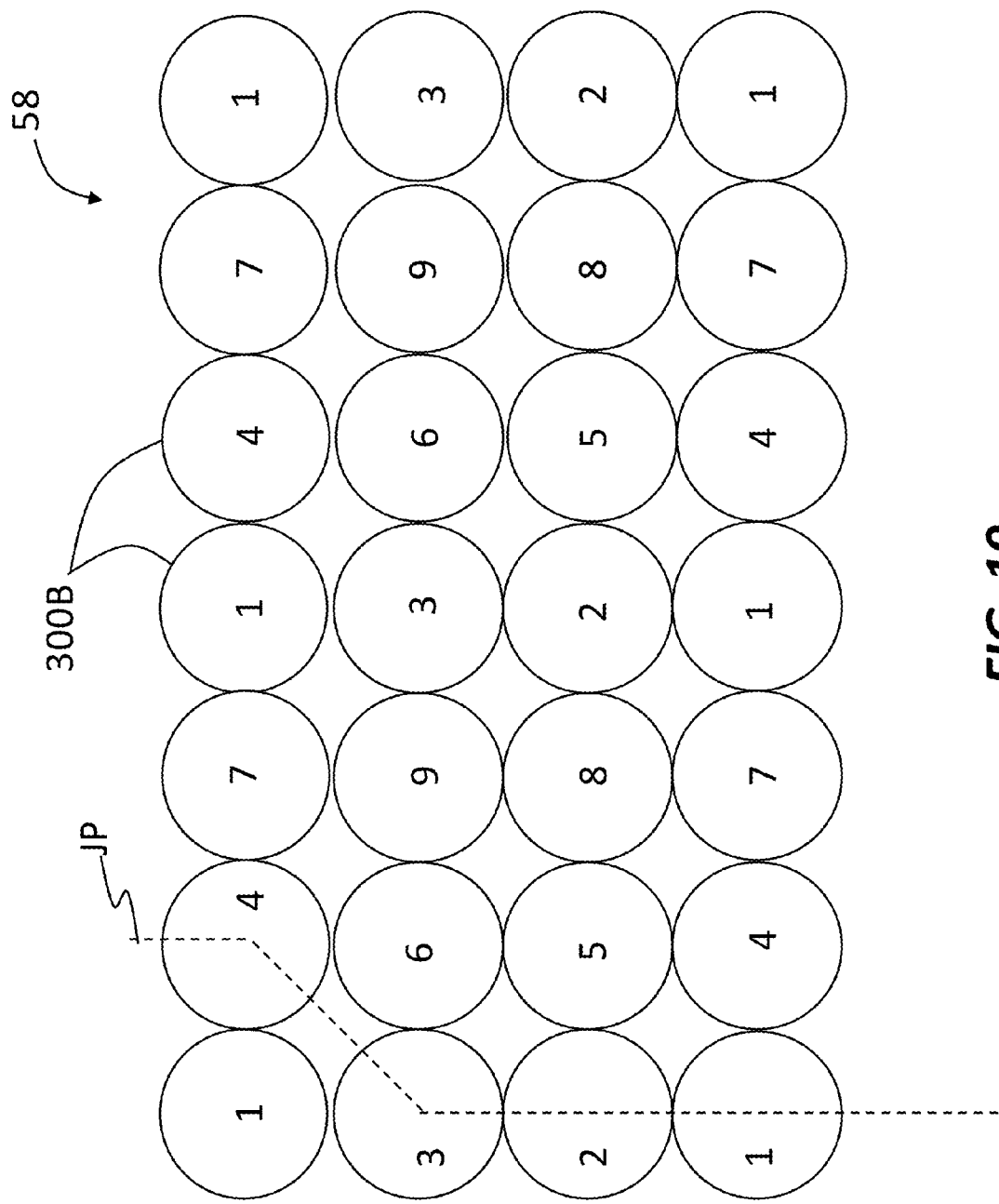
FIGS. 19 and 20 are schematic diagrams that illustrate examples of exposure sequences of bright dots using a sparse array of bright dots to form a denser exposure pattern.

An example exposure sequence is illustrated in FIG. 19, with the number in each bright spot (image pixel) 300B denoting the number of the exposure (i.e., 1=first exposure, 2=second exposure, etc.). Thus, the transducer image 58 of FIG. 19 is actually a composite image formed by multiple exposures. The exposure sequence shown has the advantage that the printed pixels 300B remain aligned with the X- and Y-axes. However, this arrangement of pixels 300B requires that a jogged path JP over to the next column is made each time a column of super-resolution pixels is completed, as illustrated by the dashed line. This jogging is impossible using only substrate stage system SS because the jogged portion in jogged path JP would have to be completed in the time between exposures or in about 30 microseconds.

Figure 20:
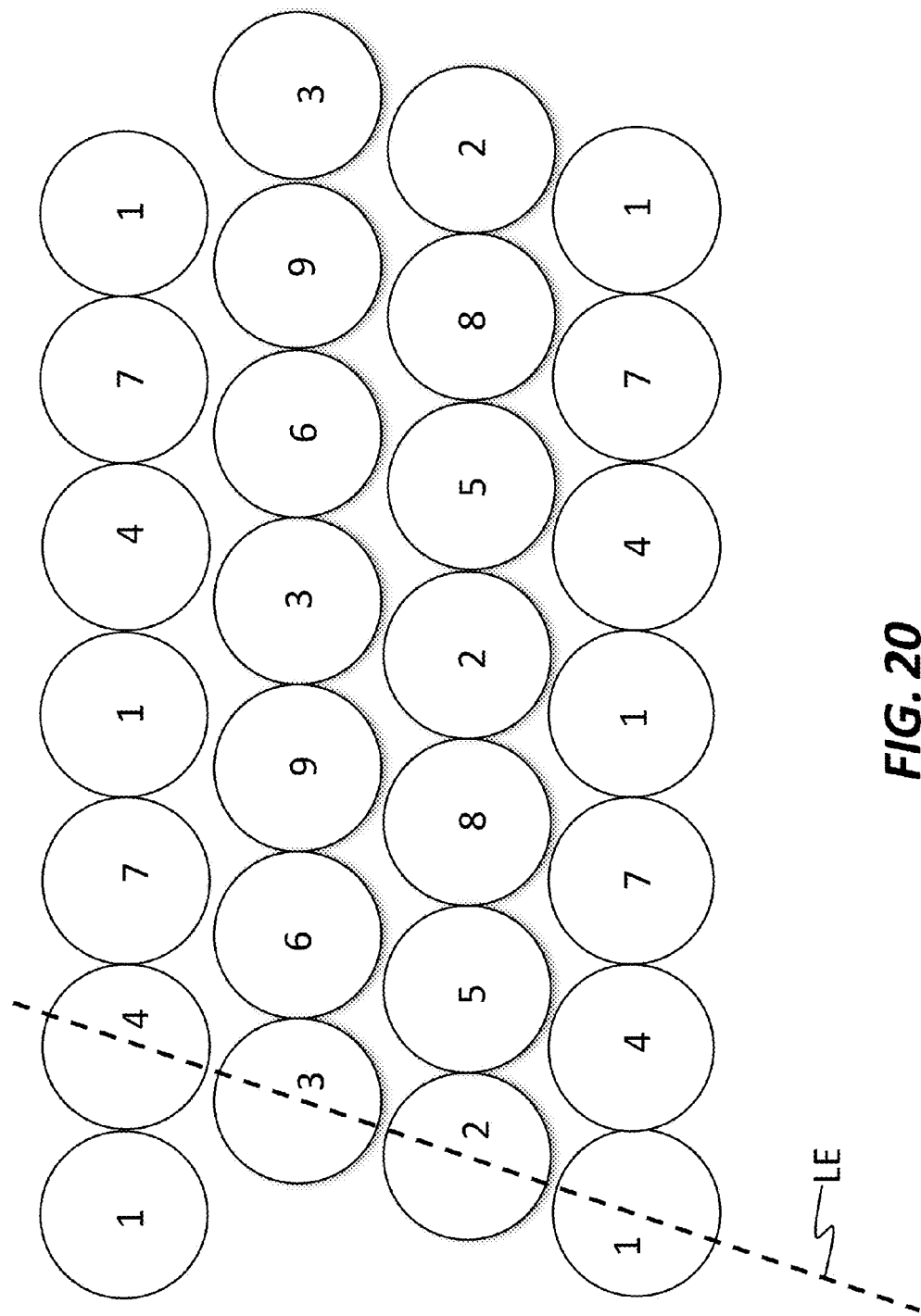

If the stage scan axis is skewed slightly with respect to the column (Y) direction, then the pixels 300B are arranged as shown in FIG. 20. For example, by orienting the stage scan direction slightly off with respect to the orientation of the sparse pattern produced by the image transducer 150, and by incrementing the stage position between each exposure, a line LE of sequentially exposed areas is created. The line LE represents the scan path.

This result can be achieved by employing any one of a number of methods. One method involves moving substrate 30 a distance about equal to s in the Y-direction and about equal to s/N in the X-direction between each exposure, where N is the number of exposures required to complete a single column. Another method involves moving stage 20 a distance about equal to p plus s or several times that distance in the Y-direction between each exposure. The ideal choice is the method that makes the stage motion increment the same each time without double exposing, by either leaving part of the pattern out or not using part of the array of micro-mirrors 152. For example if N exposures are required to span the distance between bright spots 300B generated in the first exposure and the image transducer 150 contained $N^2$ elements in the direction of scan, then incrementing the substrate 30 position a distance about equal to p plus s keeps the distance increment identical between each exposure.

Similarly, if the image transducer 150 has $3N^2$ elements in the direction of scan, then incrementing the position of substrate 30 a distance about equal to 3p plus s keeps the distance increment identical between each exposure. Since each part of the pattern must see a complete traverse of the array of micro-mirrors 152 in order to be completed, all the micro-mirrors 152 in the array are taken full advantage of, although there is some inefficiency at the beginning and end of each scan. It is thus more efficient to scan from one side of substrate 30 to the other than to attempt to expose individual small areas. FIG. 19 illustrates an example showing the number of superimposed exposures $N^2$ required to complete an arbitrary pattern.

The skewed composite transducer image 58 of FIG. 20 presents a data-processing challenge as compared to the composite transducer image of FIG. 19. However, as noted above, the time required for stage 20 to take a sudden step in the X-direction is substantial compared with the time that elapses between frames, and this is unacceptable.

In an example exposure method, the task of stepping in the X-direction is shared by stage 20 and fringe shifters 270, which can be used to move fringes patterns 160X and 160Y in the X-direction. The fringe shifters 270 can be used to carry out the jog in the X-direction. This frees stage 20 to move continuously and smoothly in a slightly skewed direction while fringe shifters 270 keep the dark spots 300D travelling in the Y-direction until a jog in the X-direction is required. This division of the task keeps the orientation of the grid data in the pattern files aligned with the X- and Y-axes of image transducer 150 and simplifies the data processing.

A related concept holds for jogs or non-uniform increments in the spaces between exposures in the scan direction. An example will serve to illustrate the point. Assume that each pixel 300B in transducer image 58 is trimmed by a factor of 20 by interference image 158 so that to completely fill in the spaces remaining after the first exposure, an additional $(N^2-1)=399$ exposures are required. Also assume that there are 1,080 pixels 152 in the scan direction on image transducer 150 and that the scanning system advances only 1 period per exposure. In this case, the entire original pattern will be filled-in long before the trailing edge of the image transducer 150 reaches the top of the original pattern, requiring that most of the transducer be turned off.

Greater efficiency can be achieved by advancing substrate 30 by two periods between exposures, i.e., by doubling the scan velocity and keeping the exposure rate constant. However, doing so still leaves some of the scanner pixels 152 with nothing to do before the trailing edge of the image transducer 150 reaches the leading edge of the first exposure. Ideally, the incremental motion of substrate 30 is equal to the number Q of image-transducer pixels 152 in the scan direction divided by $N^2$. In the above example, $Q/N^2=1080/(20)^2=2.7$. Usually, the ratio $Q/N^2$ is not an integer.

It is impractical to vary the scan speed of stage 20 between exposures. However, by choosing the average value for the scan speed of stage 20, (2.7p/increment of time between exposures) and by varying the number of periods p between successive exposures with the layout data and adjusting the fringe positions, a non-integer ratio such as 2.7 is obtained. For example, 280 advances of 3 periods each interleaved with 120 advances of 2 periods each yield a total advance of 1,080 periods in 400 exposures. To operate image transducer 150 at full efficiency when the average stage motion increment between exposures is a fractional number of image-transducer pixel images 152, the fringe interference image 158 must be moved quickly using fringe shifters 270.

Operational Modes

The apparatus 10 is configured via controller CO to carry out different methods of superimposing successive exposures. These methods include:

Step-and-Expose (a.k.a Step-and-Repeat): where the stage position is incremented, an exposure is made, then the stage position is incremented again, another exposure is made, and so on.

Scan-and-Flash: where the stage moves continuously and the exposing light source is flashed each time the next target position is reached. The pattern in the image transducer is changed between flashes.

Compensated Scan-and-Flash: identical to scan-and-flash, except the black holes are moved in synchronism with the motion of the stage during the flash.

The step-and-expose mode of operation requires that stage 20 accelerate, decelerate and then pause until the resultant vibrations have died down before an exposure takes place. This method is simple but slow and is not well suited to volume production. The scan-and-flash method of operation is better suited to high-volume production rates but results in some image smearing in the scan direction. Higher scan speeds require higher illuminator intensities, and there are practical limits to the maximum illumination intensity. The compensated scan-and-flash method of operation is best suited to high-volume manufacture and high-resolution imagery. This method places relatively modest requirements on the illuminator system IL, and there is no compromise in image quality.

Laser Power and Flash Duration

The scan-and-flash method keeps the stage 20 moving at a constant velocity, but to avoid image smearing the flash duration must be quite short. For example, with a typical DMD, the maximum frame rate is 20,000 frames per second. If we assume that the stage 20 travels a distance equal to 3p between exposures and that s=p/20 and the maximum allowable image smear is s/4, then the flash duration has to be about $1/(3\times 20\times$ 4)=1/240 of the flash duty cycle. This is about equal to 0.208 microseconds. The instantaneous laser intensity at the substrate 30 is equal to 240,000 W/cm² for a 50 mJ/cm² exposure dose.

In the compensated scan-and-flash method of operation, the dark spots 300D of interference image 158 defining the exposure area are moved in synchrony with the substrate 30 during the exposure. The locations of the dark spots 300D can easily be locked to the position of stage 20 using the fringe shifters 270 so that they move with the stage during an exposure. This is easily done using an electro-optical device for fringe shifters 270, which allows the fringes to be locked to the substrate position using a very high bandwidth servo.

Assuming the exposure can be done while the dark spots 300D travel across half a pixel and that the total travel between exposure flashes is 3 pixels, then the flash duration is 1/(2×3)=1/6 of the flash duty cycle or about 8.33 microseconds, and the instantaneous laser intensity is about 6,000 W/cm². Thus the compensated scan-and-flash mode reduces the required laser intensity by a factor of 40 and substantially or completely eliminates image smear resulting from the scan velocity.

Keeping the pattern scan axis aligned with the image-transducer array 152 requires periodic jogs in fringes 160X and 160Y running in the cross-scan direction and that the exposure take place while the dark spots 300D traverse the top portion of the exposure image profile. Assuming the top portion of the exposure image is about equal to p/2, the allowable exposure time expands to about 1/6 of the duty cycle, which is an increase of 40 times over that of the uncompensated step-and-flash mode. The corresponding laser power required is about 11 watts. At a wavelength of 405 nm, this amount of power can be obtained from about two-dozen laser diodes 52. However, manufacturing errors can result in a tilt angle variation of ±1° in the DMD micro-mirrors 152, resulting in a deflection angle error of ±2°.

The theoretical NA of the illumination beam 56 incident on image transducer 150 is the NA of the objective lens 170 divided by the magnification ratio M, i.e., 0.9/36.61=0.0246, which corresponds to a cone angle of 2·arcsin(0.0246)=2.82°. To be certain that the objective lens pupil 176 is filled with reflected light 56R, it is be necessary to overfill the pupil with illumination spread in the direction of the tilt angle by an extra 4°. This overfilling could increase the laser power required by light source LS by a factor of (2.82+4)/2.82=2.42 or to a total of about 27 watts, in addition to whatever additional light 56 is required to make up for transmission losses between the light source and substrate 30. If the laser diodes 52 are turned on only for exposure and are off most of the time, then they can be operated at a higher power level than would be the case were they operated continuously. This duty-cycle advantage can be used to reduce the total power by half.

Achieving Fringe Stability

One of the problems that beset most interferometer systems is how to maintain the thermal homogeneity of the air path through which the different beams pass. To position the dark spots 300D to 1/100 of a fringe spacing, the interference image 158 needs to be stable to 1/100 of fringe pattern 160X or 160Y. This requires a path temperature difference of no more than 0.006° C., assuming a 300-mm path length.

The best environmentally controlled chambers provide a temperature stability of about 0.1° C., provided there are no heat-generating elements, such as a stage, contributing convection currents to the air path. To stabilize the positions of dark spots 300D, it will be necessary to monitor the positions of the dark spots and correct any positioning errors using fringe shifters 270. Since this monitoring will be necessary in both the X- and Y-directions, at least one fringe shifter 270 is employed in each pair of interferometer arms of interference pattern generator IPG.

Figure 21:
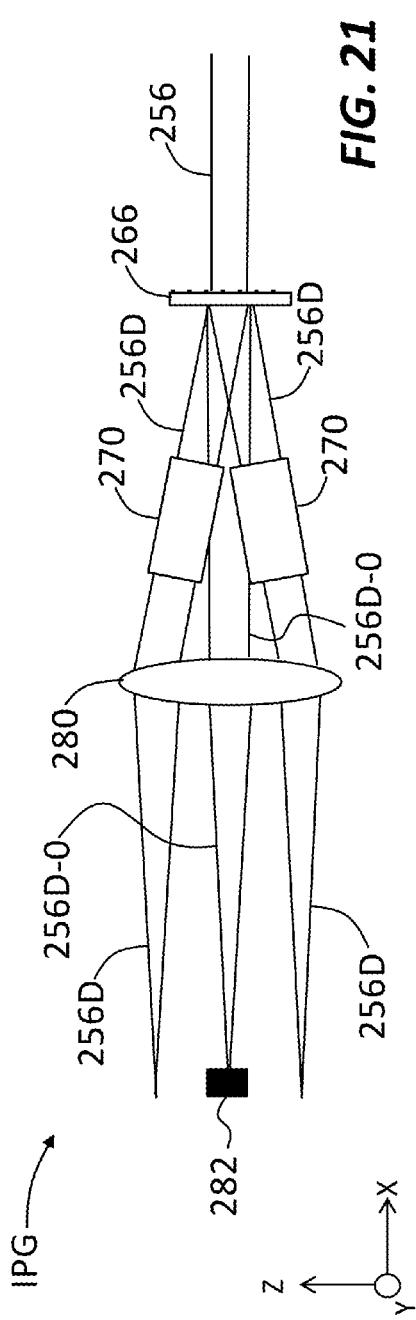
FIG. 21 is a close-up side view of a portion of the interference pattern generator showing a light-blocking member that blocks the 0th-order diffracted beam.
Figure 22:
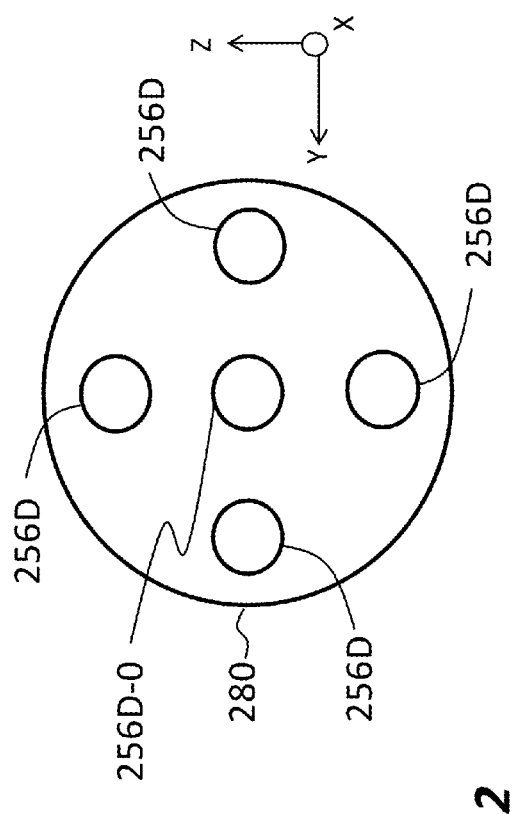
FIG. 22 is a view of a portion of the interference pattern generator looking in the X-direction into the collimating lens and shows an example positioning of the four diffracted light beams, along with the 0th-order light beam.

If fringe shifters 270 employ acoustic modulators, then two acoustic modulators are provided in each path, as shown in FIG. 21. Two acoustic modulators are required because each modulator introduces a small wavelength shift. To obtain a stationary fringe patterns 160X and 160Y, these wavelength shifts must be equal. The other fringe shifters 270 are in the orthogonal beam, which is normal to the plane of FIG. 21, and are shown in the elevated view of FIG. 2B. Monitoring the positions of fringes 160X and 160Y in interference image 158 can be done using alignment system AS, optionally in combination with filter(s) 354, which filter out exposure light 56 of wavelength $\lambda_1$. One way of measuring the exact position (phase) of the fringes 160X and 160Y in interference image 158 is by taking a fast Fourier transform (FFT) of the image of the fringes and analyzing changes in the phase components of the FFT image. The FFT can be performed in controller CO.

Exposure Fringes

A potential increase in the efficiency of illuminating image transducer 150 approaching a factor of 2 can be achieved by also illuminating the image transducer with orthogonal fringes created from an exposure light source or sources. The exposure fringes are generated in a fashion exactly analogous to the generation of the inhibition fringe patterns 160X and 160Y. For example, two orthogonally oriented phase gratings 266 are illuminated with spatially coherent illumination, the residual zero order is eliminated, and the ±1 diffraction-order beams from each grating are combined at the correct angle to create the desired interference pattern on the image transducer 150.

Throughput

In the above example, which employed exposure light 56 at a wavelength of 405 nm and an objective lens 170 with an NA of 0.9, 18-nm diameter pixels 40P are produced. If only every other pixel (micro-mirror 152) of DMD array 150 is potentially useful, then 1,080×1,920/2=1,036,800 pixels 40P can be written per frame. The maximum frame rate for a 1,080 DMD is 20 kHz. Thus $2.07 \times 10^{10}$ pixels 40P per second can be printed in photoresist layer 40. This rate corresponds to an area rate of $(2.07 \times 10^{10}/s)(18 \text{ nm})^2 = 6.72 \times 10^{12}$ nm²/s or 6.72 mm²/s. Writing a layer of photoresist pixels 40P on a 2-cm² chip would take about 200/6.72=29.8 seconds.

Apparatus Improvements

The resolution of apparatus 10 can be extended by increasing the NA of objective lens 170 to 1.33, thus making the objective an immersion lens. In addition, the inhibition wavelength $\lambda_2$ might be extended to about 300 nm. These two improvements would increase the resolution from 16.4 nm to 16.4(0.9/1.33)(300/532)=6.3 nm. Typical DMDs cannot operate below 290 nm because the internal lubricant used for the micro-mirrors 152 is damaged by short-wavelength light. Thus, extending the exposure wavelength $\lambda_1$ to about 230 nm would require either a different lubricant or eliminating the need for a lubricant. Further advances might also be achieved with improvements in the spectrally sensitive resist overcoat layer.

It is noted that typical commercially available DMDs were not designed for lithographic applications. The typical market for DMDs is for projection TVs and optical projectors in general, in which the resolution of the human eye plays an important role and limits the practical number of pixels. Without such commercial constraints, it is believed that the number of micro-mirrors 152 for a lithography specific DMD could be increased twentyfold and the frame rate tripled to yield a sixtyfold throughput increase, measured in pixels/s.

This would allow apparatus 10 to write 60×(2.07×10$^{10}$ pixels/s)=1.24×10$^{12}$ pixels/s. Taking an improved resolution of 5.5 nm into account, the area rate would be (1.24×10$^{12}$ pixels/s) (5.5 nm)$^2$=3.76×10$^{13}$ nm$^2$/s=37.6 mm$^2$/s. Writing a 2-cm$^2$ chip would take about 5.3 seconds, and this chip could contain 8.9 times more circuitry than the previous example.

An aspect of the disclosure includes printing photoresist pixels 40P using multiple apparatuses 10. For example, a two-dimensional array of apparatuses 10 would be positioned over wafer 30 so that each apparatus would only be required to write an area equal to its footprint, which in an example is 50 mm by 50 mm. Thus, a total of 32 apparatuses 10 can cover the area of a 300-mm-diameter wafer. The time taken to write this area would be about (50 mm)$^2$/(37.6 mm$^2$/s)=66.5 seconds. After adding an additional 10 seconds for load/unload, this corresponds to a throughput of about 47 wafers/hour at a resolution as small as about 5.5 nm.

Optimizing Two-Color Photoresist System Performance

Aspects of the disclosure includes systems for and methods of sub-pixel-resolution imaging that utilize a two-color photoresist system 40, or "two-color resist" for short, and further include optimizing the performance of the two-color photoresist system. Generally a photoresist is light-sensitive material that upon exposure to actinic (or "activating") energy forms relief images after subsequent processing. The subsequent processing may include a post-exposure-bake and includes development using a developer solution. The developer solution in most cases is aqueous-base but can also be organic-based. Subsequently, the relief images that formed from the imaging process are used to protect areas while a pattern transfer is made by etch or implant of ions of the areas not covered by the resist. The term "two-color resist" as the term is used herein includes the following:

1) A single layer of photoresist 40 wherein photo-molecules in the photoresist are capable of being activated by one wavelength $\lambda_1$ and de-activated or inhibited by a second wavelength $\lambda_2$. Activation is followed by a transition to a permanently exposed condition in the absence of deactivation;

2) A single layer of photoresist 40 wherein photo-molecules in the photoresist are capable of being activated by a very intense pulse of photons and deactivated by an exposure to a much lower intensity at the same wavelength $\lambda$. In the absence of deactivation the activated molecules transition to a permanently exposed state; or 3) A double layer photoresist 40 in which the bottom layer 40b is a regular photoresist layer that is exposed by an actinic wavelength $\lambda_1$ and a top layer is a photochromic material 40a that can be bleached (made more transparent) by a wavelength $\lambda_1$ but which is rendered opaque by light having an inhibiting (de-activating) wavelength $\lambda_2$ that subsequently is used to set the exposed bleached area to opaque.

It is important to note that both wavelengths $\lambda_1$ and $\lambda_2$ can be applied simultaneously with the effect that where light of wavelength $\lambda_2$ is of sufficient intensity that the top layer is rendered opaque and no resist exposure occurs, but where there is a hole in the interference pattern generated with light of $\lambda_2$, light of $\lambda_1$ bleaches a path through the top layer and exposes the resist below. Materials exist that allow sequential exposures starting with light of wavelength $\lambda_1$ to generate a long-lived excited state in the resist layer followed by a patterned exposure with light of wavelength $\lambda_2$ that deactivates the resist everywhere except where the dark holes in the interference pattern exist. Where the dark holes exist, the excited resist spontaneously converts to the permanently exposed condition.

Table 4 below sets forth example materials for the two-color resist 40, wherein the "photo-initiator" corresponds to the term "photo-molecule."

TABLE 4

EXAMPLE MATERIALS FOR THE TWO-COLOR RESIST

| Photo-initiator | Photo-inhibitor | Acrylic Monomer (s) |
| --- | --- | --- |
| Isopropylthioxanthone (ITX) | None | pentaerythritol triacrylate |
| 7-diethylamino-3-thenoylcoumarin (DETC) | None | pentaerythritol triacrylate |
| Malachite Green Carbonal Base (MGCB) 1.6% | None | 48.7 wt % ethoxylated(6) trimethylolpropane triacrylate(Sartomer), 48.7 wt % tris(2-hydroxy ethyl isocyanurate triacrylate (Sartomer) |
| camphorquinone(CQ)/ethyl 4-(dimethylamino)benzoate (EDAB) | tetraethylthiuram disulfide (TED) | triethylene glycol dimethacrylate (TEGDMA) |
| 2,5bis(p-dimethylaminocinnamylidene)-cyclopentanone (BDCC) | tetraethylthiuram disulphide (TED) | Dipentaerythritol pentaacrylate (SR399) and pentaerythritol triacrylate (SR444) |

The simplest model of the exposure profile produced by a two-color resist 40 using the system and methods disclosed herein is based on the assumption that inhibition light having a given inhibition photon intensity at the inhibition wavelength $\lambda_2$ will exactly cancel (i.e., de-excite) the excited photo-molecules produced by a given intensity of exposure (i.e., excitation or activation) light of exposure wavelength $\lambda_1$ associated with a transducer image. Depending on the relative values of the inhibition and excitation cross-sections, the intensity ratio for exact cancellation can be greater or less than unity. The exposure (intensity) profile predicted by this model is approximated by an inverted parabola, which has a maximum slope where the exposure is zero.

An example two-color resist 40 suitable carrying out the optimized methods disclosed herein includes a bottom layer 40b of regular photoresist activated by an activating wavelength and a top absorber layer 40a (see, e.g., the inset of FIG. 1). The top absorber layer 40a can be bleached by exposure light having the activating (exposure) wavelength (i.e. made transparent to the activating wavelength), and can rendered opaque to the activating wavelength by inhibition light having an inhibition wavelength $\lambda_2$. Only where the inhibition intensity is extremely low is there sufficient bleaching that exposure is possible.

In an example, the wavelength $\lambda_1$ for excitation (exposure) and $\lambda_2$ for inhibition (de-excitation) $\lambda_2$ are the same, but the intensities differ greatly, such as described the publication by Li et al., entitled "Achieving λ/20 Resolution by One-color Initiation and Deactivation of Polymerization", SCIENCE, 15 May 2009, Vol. 324, No. 5929, pp. 910-913. For example, malachite green can be excited with a very intense excitation beam at 800 nm and de-excited with a much less intense de-excitation beam at the same wavelength. In this case, the excitation is a two-photon photon process where two 800 nm photons combine to deliver the energy of a 400 nm photon.

Although the simple model based on one inhibition photon cancelling one excitation photon is easily manipulated to yield the exposure profiles that result from various excitation and inhibition fluxes, it does not accurately predict the shape to the exposure profile near the base where the "wings" of the profile that extend out from the main feature of the profile are likely to affect the adjacent image. Also, the simple model does not take into account the time constant for the conversion of the excited molecule to transition to a permanently exposed state, nor does it allow for anything other than simultaneous exposure and inhibition. A more realistic exposure profile can be generated with a finite-time-element model, which can be run on the Microsoft Excel® spreadsheet program. The simple model is thus referred to hereinafter as the "two-color Excel model."

The two-color Excel model can be used to calculate the exposure profile of a line or a single pixel. Rather than yielding the expected inverted parabola of the simple resist model, the two-color Excel model yields an exposure profile that has extensive wings that could prohibit the superposition of a large number of images in a small region since the few "off" pixels would buried under the accumulated exposure dose generated by the wings of the many "on" pixels.

Figure 23:
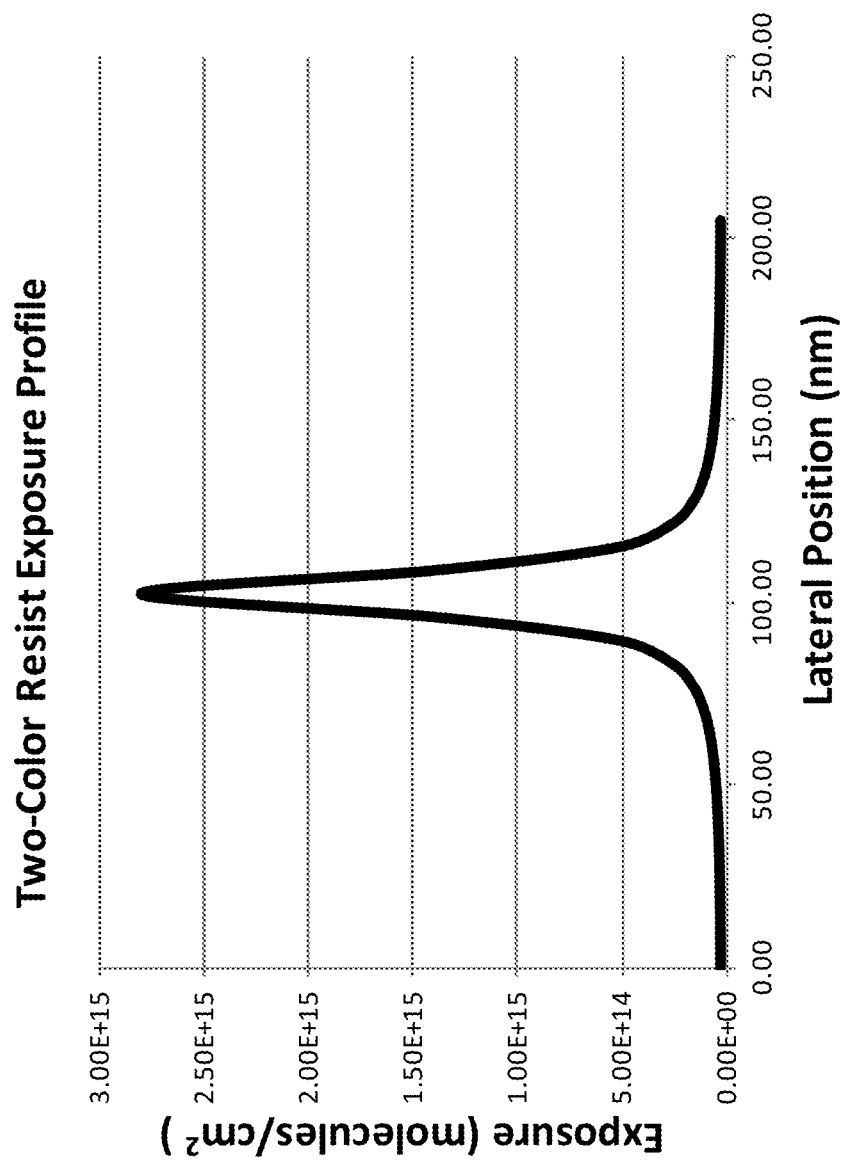
FIG. 23 is a plot of the exposure (molecules/cm2) versus lateral position (nm) that show the one-dimensional (e.g., line) exposure profile based on a two-color resist model as calculated using a finite-time-element analysis.

An example two-color resist exposure profile generated by the Excel model is illustrated in the plot of FIG. 23, which plots the lateral position (nm) versus the exposure dose (exposed molecules/cm$^2$) for an one-dimensional line image. The two-color Excel model indicates that superimposing sixteen narrowed line images in the image space occupied by the image of a single image transducer pixel can be problematic due to the extensive wings overlapping and obscuring the peaks of the desired lines.

Figure 24A:
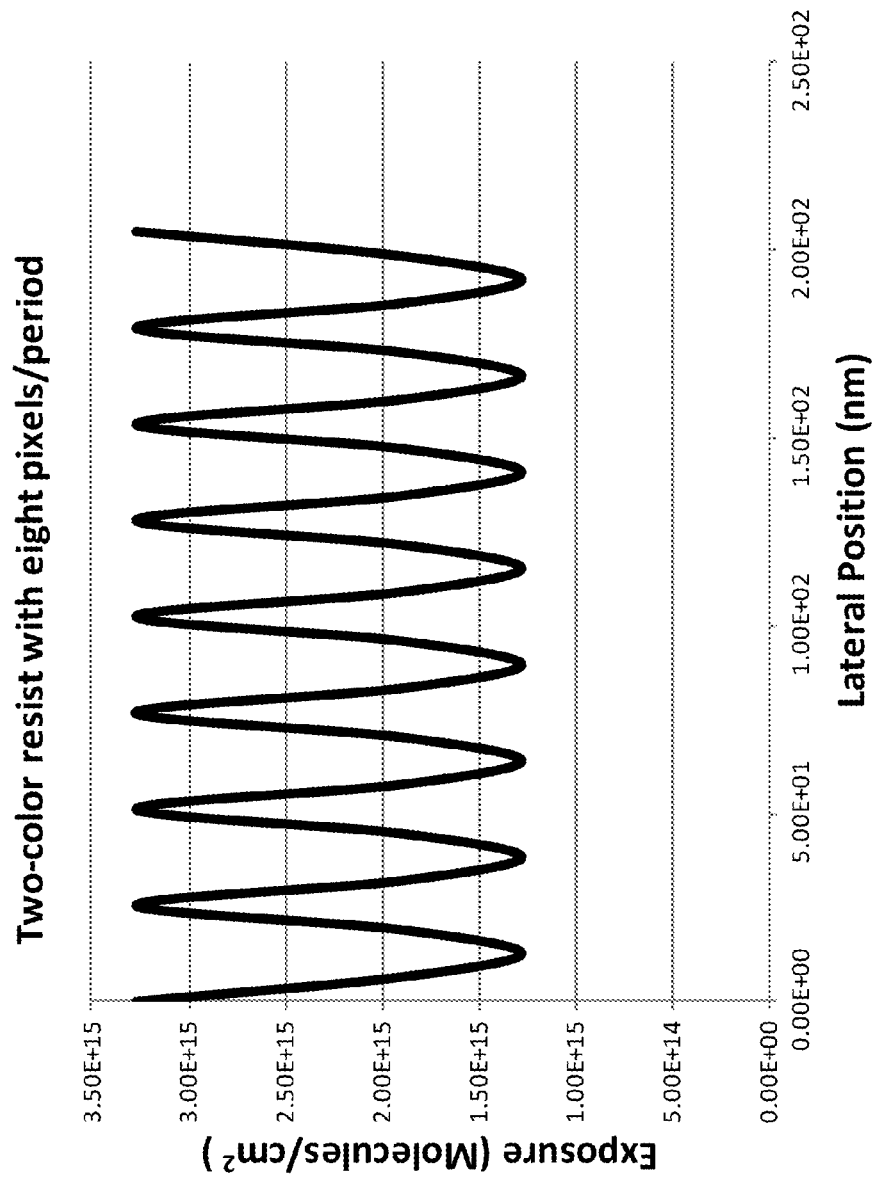
FIGS. 24A and 24B are plots similar to FIG. 23 and show the modulation levels obtained by placing eight (FIG. 24A) and sixteen (FIG. 24B) equally spaced lines in the space of a period.
Figure 24B:
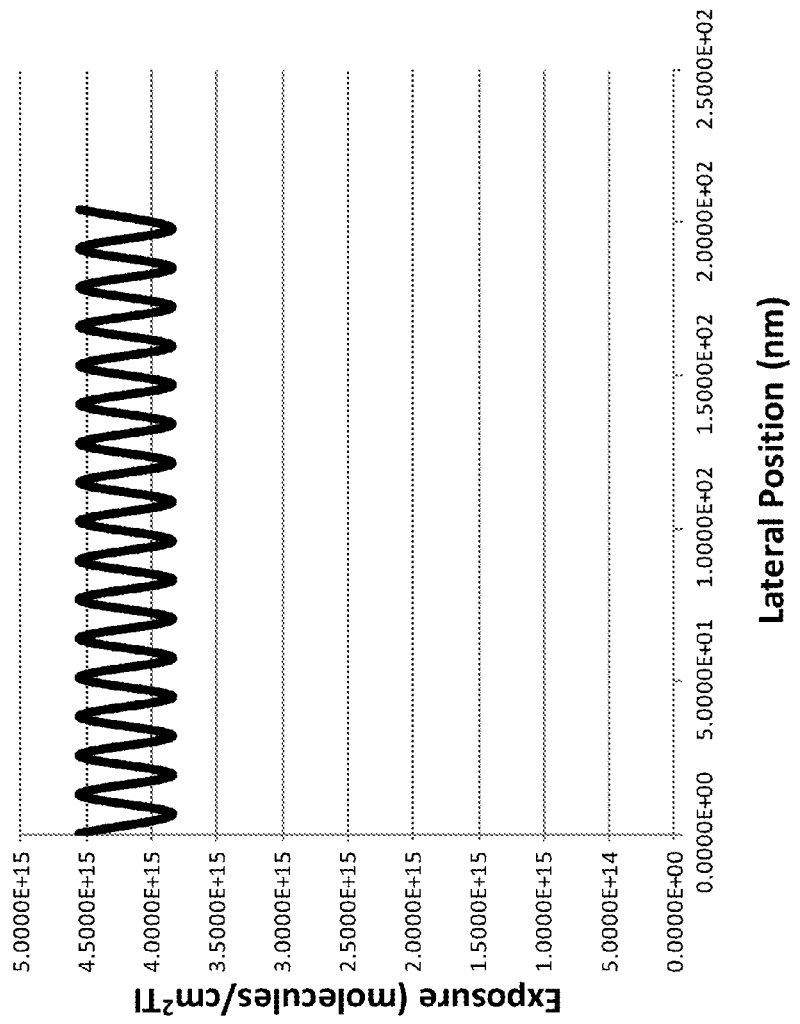

FIG. 24A is an example exposure profile plot obtained using the two-color Excel model of eight exposures of the line of in FIG. 23 superimposed in the image space occupied by the image of a single image transducer pixel. FIG. 24B is similar to FIG. 24A but for sixteen exposures. Even with the superposition of eight lines (FIG. 24A), the loss of modulation shows that the practical superposition limit is about ten lines. The two-color Excel model results shown in the exposure profile of FIG. 25B shows that the superposition of sixteen lines results in a modulation level of the exposure profile that is unworkable, because the resultant modulation level is too small and the resultant line widths too dependent on the exact value of the exposure threshold.

Figure 25:
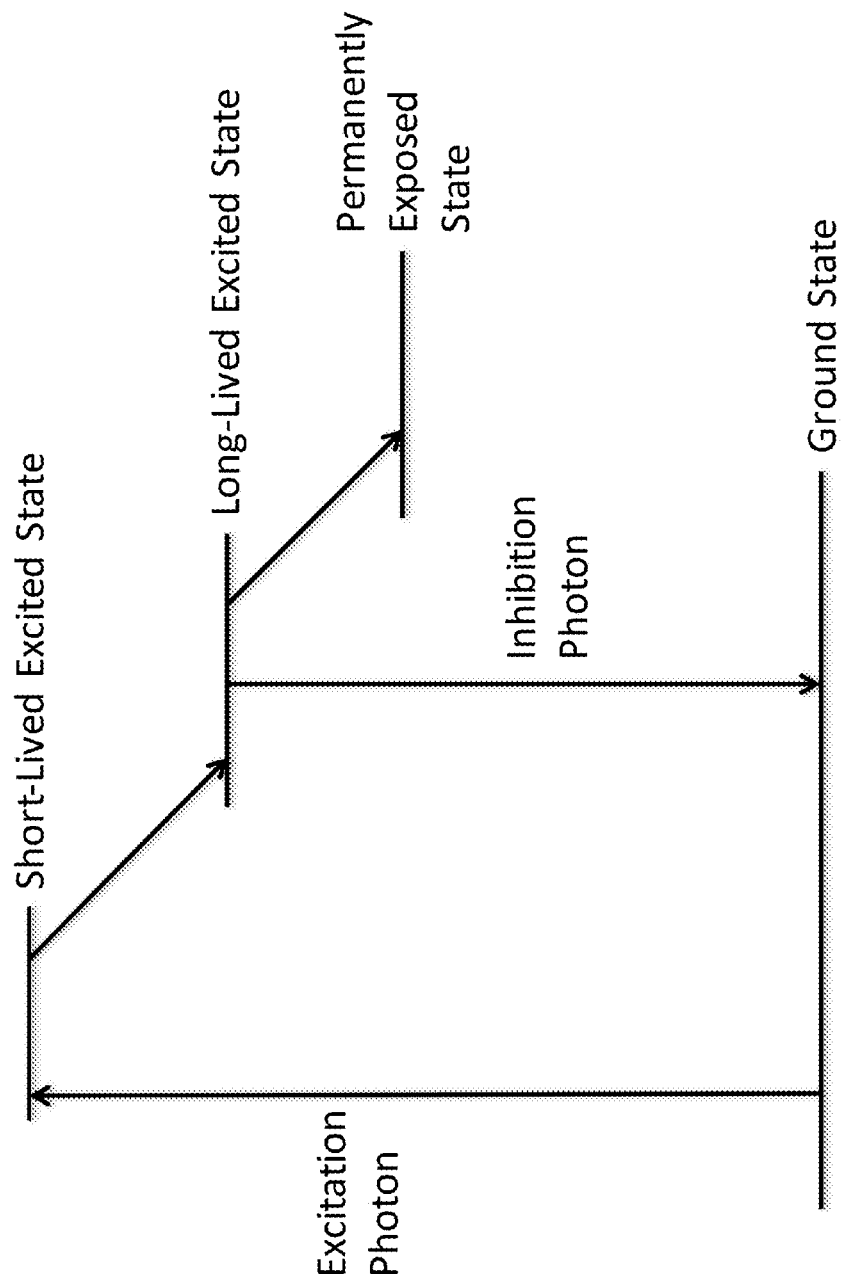
FIG. 25 is an energy level diagram of an example two-color resist as resist modeled using the aforementioned finite-time-element analysis.

An example two-color resist 40 contains a photosensitive molecule that can be brought to a long-lived excited state by absorption of activation or excitation light of wavelength $\lambda_1$, and then transitioned back to the ground state with the inhibition (i.e., de-excitation or de-activation wavelength) light of wavelength $\lambda_2$. Ideally this process can be repeated indefinitely. While in the excited state, the molecule can also spontaneously transition to a non-reversible photo-product, which is the final resist image. The transition rate to the permanently exposed state is characterized by a time constant $\tau$, defined as the period of time for a number of excited molecules to reduce to 1/e of the original number, assuming they were not inhibited in the meantime. FIG. 25 is an energy level diagram for an example two-color resist system 40 that relies on excitation and de-excitation of photosensitive molecules.

A time-sequenced model of a two-color resist system was constructed using the aforementioned Microsoft Excel® spreadsheet. The starting point for the model was a two-color resist 40 with a known number of photosensitive molecules per square centimeter, a known exposure flux EXP of photons per time increment, and a known inhibition flux INH of photons per time increment. The increase in the number of excited molecules per time increment depended on the exposure flux, the exposure cross-section, and the remaining density of photosensitive molecules. Similarly, the number of excited molecules removed from the total population of excited molecules depended on the excited molecule population, the inhibition cross-section and the inhibition flux, plus the number lost by spontaneously transitioning to the permanently exposed condition.

The two-color Excel model was intended to predict how a lithography system constructed to use a two-color resist might operate in practice. FIGS. 1 and 2A, introduced and discussed above, depict such a lithography apparatus 10 that in an example can include a commercially available image transducer 150 containing, e.g., 2 million square mirrors arranged in a 1080 by 1920 array. The maximum frame rate of such an array is about 20,000 frames per second. Thus, it is highly desirable from a throughput perspective that the exposure, inhibition, and transition to the permanently exposed condition all happen in the minimum time required for a single frame.

The two-color Excel model showed that it was desirable to have the inhibition pattern (interference image 158) present continuously and to begin each cycle with an excitation dose as short as the available laser power from light source LS of illuminator IL would allow. This minimizes the number of excited molecules that transition to the permanently exposed state during the excitation phase and increases the probability that a molecule located in the wings will be inhibited rather than transition to the permanently exposed state (see the energy level diagram of FIG. 25).

Increasing the inhibition flux and lengthening the time constant $\tau$ also serves to increase the probability of inhibition and decrease the probability of conversion to the permanently exposed state. The two-color resist model also showed that the longer the time constant $\tau$ for the transition to the permanently exposed condition, the better the exposure profile. However, throughput requirements and power requirements for light source LS put a limit on how far the time constant $\tau$ can be extended.

Figure 26:
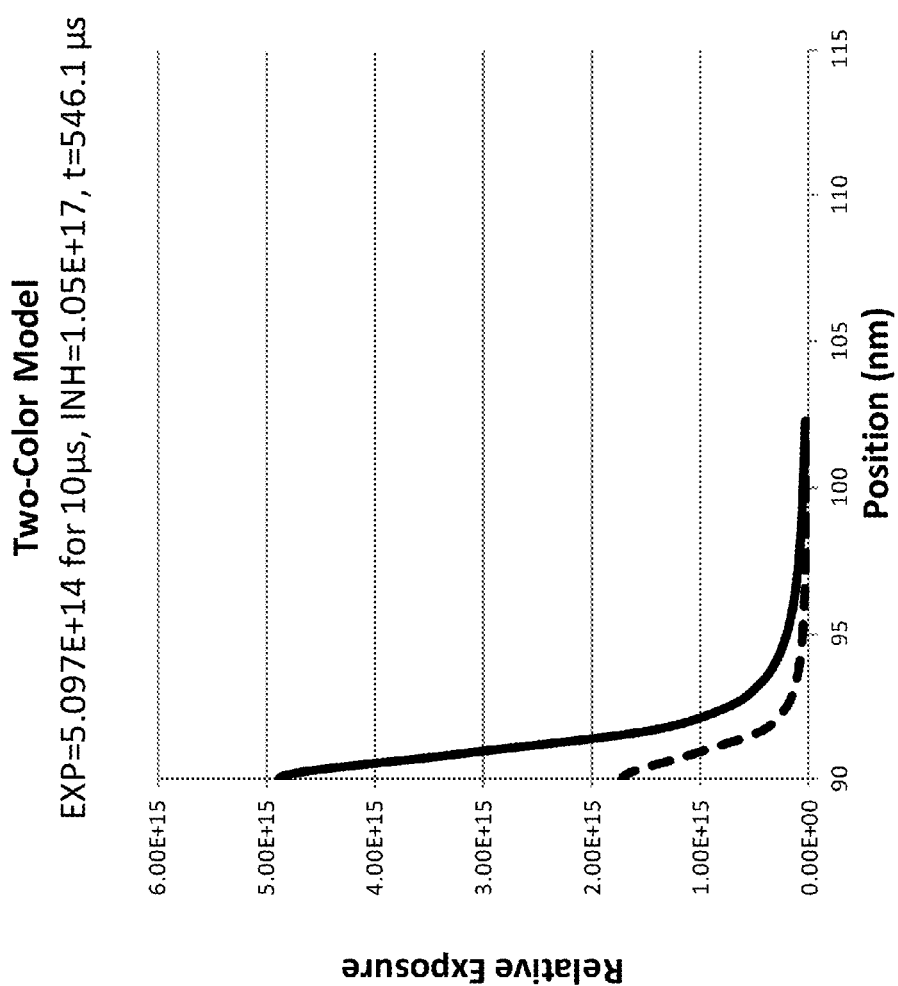
FIG. 26 is a plot of the relative exposure versus position (nm) that compares the resist profiles of the photoresist pixels obtained using resist time constants of $\tau$=0.5 ms (solid line) and $\tau$=2 ms (dashed line) using a total frame time of t=546.1 µs.

FIG. 26 is a plot of the relative exposure versus position (nm) for two exposure profiles that differ only with respect to the resist time constant $\tau$. The curve representing the resist with $\tau=2$ ms time is substantially lower than the curve for $\tau=0.5$ ms because the exposure time t=546.1 µs was insufficient for most of the excited molecules remaining after the inhibition exposure to be converted to permanently exposed molecules. Thus, a longer time constant $\tau$ imposes either a cycle-time penalty or an excitation dose penalty.

The resist time constant $\tau$ is not readily varied since it depends on the chemical composition of the resist. For example, a 50 µs frame time might employ a 10 µs exposure time and a two-color resist 40 with a time constant $\tau=40$ µs. If the time constant $\tau$ was much shorter than this, then a substantial number of excited molecules created during the exposure would be converted into permanently exposed molecules before the inhibition flux had an opportunity to trim the wings on the exposure profile. If the time constant $\tau$ were much, longer than this, then a substantial proportion of the excited molecules that would otherwise form the exposure profile peak, would remain at the end of the frame and then be inhibited by the repositioned inhibition pattern at the beginning of the next frame. This loss of excited molecules requires an increase in the exposure flux.

Figure 27:
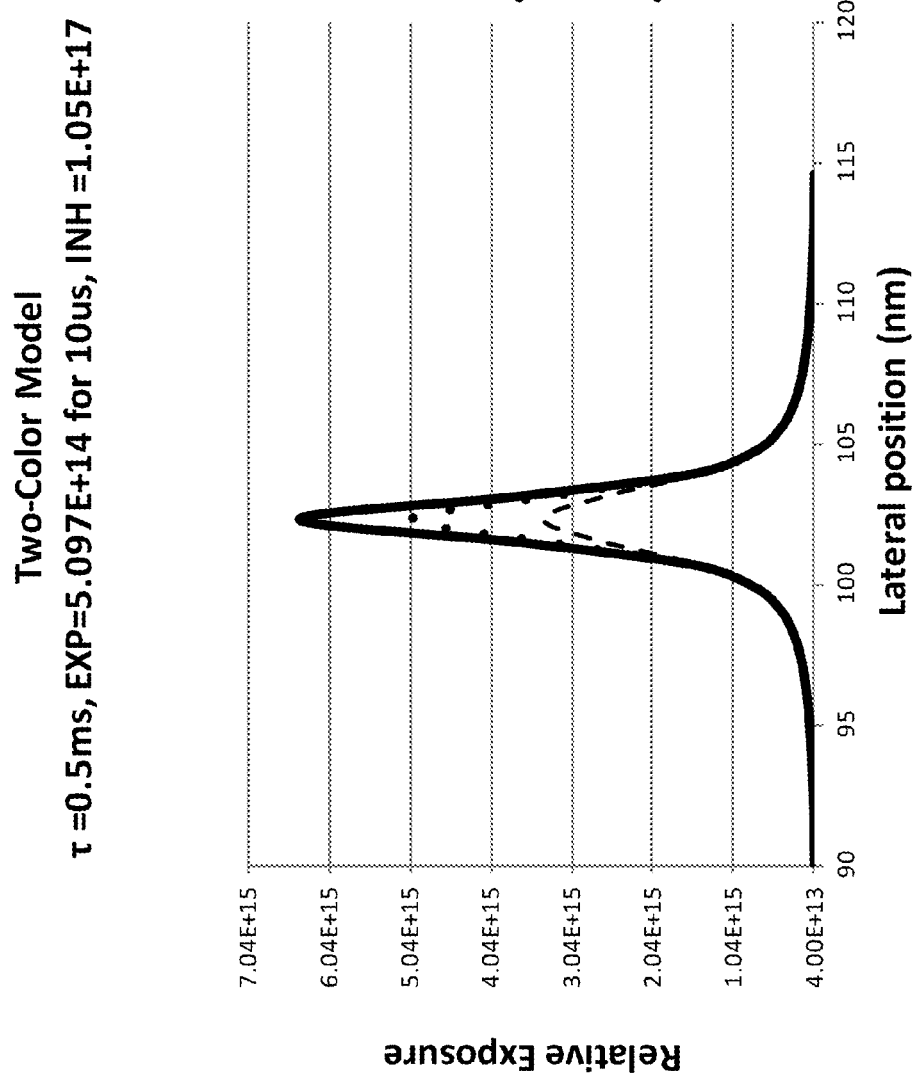
FIG. 27 is a plot similar to FIG. 26 and that compares profiles of photoresist pixels obtained using different frame times.

FIG. 27 is similar to FIG. 26 and illustrates an example of the way in which the exposure profile is formed as a function of time. In this case the resist time constant τ, the excitation intensity EXP and duration and the inhibition intensity INH are the same for each time frame, but the length of the frame time varies. This has a pronounced effect on the peak value of the exposure profile but virtually no effect on the wings.

Optimum Time Constant for a DMD Image Transducer

An example image transducer 150 is a DMD available from Texas Instruments as their model 1080p, which contains two-million micro-mirrors 152 and which has a maximum frame rate of 20,000 frames per second. Each micro-mirror 152 has associated with it a single bit of memory, which can be loaded with the next picture (i.e., mirror configuration) while the current picture is being displayed, and then every micro-mirror can be simultaneously switched to the next picture.

Once the micro-mirrors 152 have switched, the excitation and inhibition light beams are applied in the correct timing sequence. The optimum arrangement is to apply the inhibition light continuously and to reposition the interference image 158 formed with the inhibition light during the DMD switching process. The excitation light 56 should irradiate the DMD after DMD switching, and the duration should be as short as possible in order to keep the wings as small as possible.

The optimum resist time constant τ for this operating sequence is about the time to expose one frame (i.e. the frame exposure time). A time constant τ much longer than this imposes a significantly higher excitation dose, because a relatively small portion of the excited molecules are converted to the permanently exposed state before the next frame, which inhibits the remaining excited molecules. A time constant τ much shorter than this results in higher wings in the exposure profile because more excited molecules are converted to permanently exposed molecules before the inhibition pattern has had a good opportunity to act on them.

Figure 28:
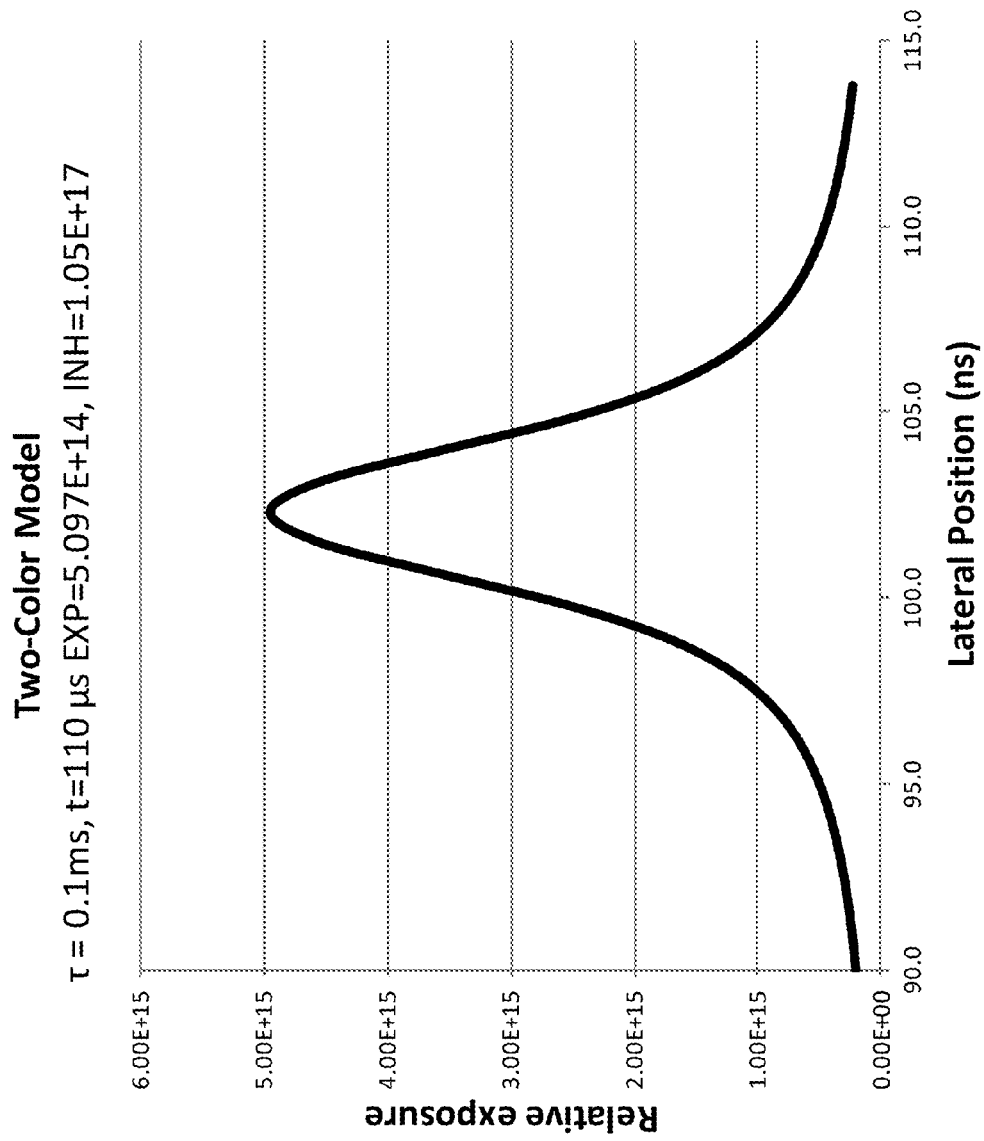
FIG. 28 is similar to FIG. 27 and shows an example of the profile of a photoresist pixel obtained using a very low ratio of the inhibition radiation intensity INH to excitation (exposure) radiation intensity (EXP)

FIG. 28 is similar to FIG. 27 and shows an example exposure profile employing time constant τ=0.1 ms, which is about the same as a frame exposure and is therefore an optimum resist time constant. In this example, the inhibition to excitation intensity ratio is only 2, the inhibition and excitation cross-sections are both $6.15E-18/cm^2$, and the concentration of photo-molecules is assumed to be $1.63E+16/cm^2$.

Figure 29:
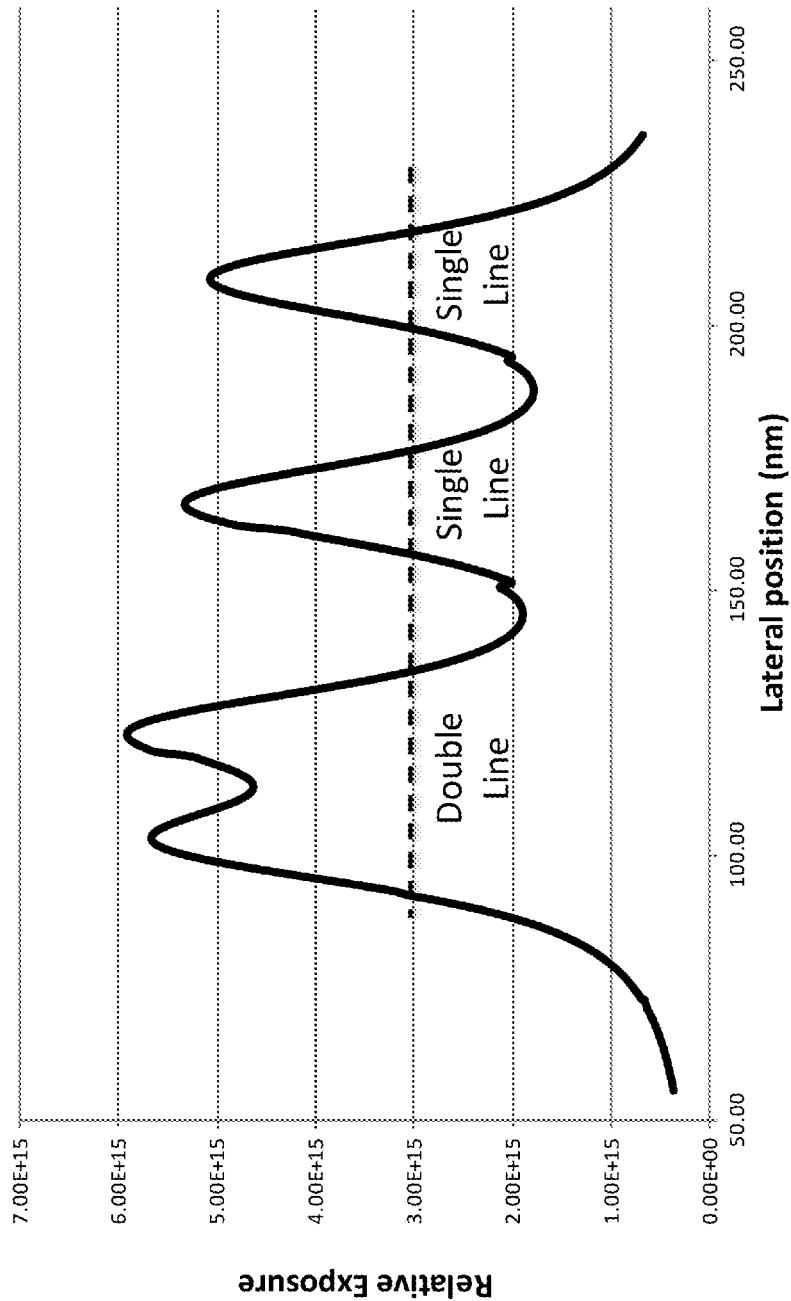
FIG. 29 is similar to FIG. 28 and shows an example profile of photoresist features obtained from a double line, a single space, a single line, another single space and another single line.

FIG. 29 is similar to FIG. 28 and illustrates how the exposure profile obtained in FIG. 28 can be used to form a photoresist pattern 41 from photoresist features 40P containing a double-width line and two single lines with a period of 42.56 nm. In this case, the exposure threshold can be set close to the 3E+15 (relative) exposure level, as indicated by the dashed line, to obtain the desired photoresist pattern 41.

An exception to the general rule where the resist time constant τ is approximately equal to the frame rate or vice versa, may occur when the period between exposures is determined by the other considerations such as the maximum scan rate. For example, if the desired pattern consists only of parallel lines and is thus one-dimensional, then the number of exposures per field can be drastically reduced and the substrate scan velocity increased, possibly to the point where the time between exposures is determined by the maximum stage velocity. In this instance, the time between exposures may determine the optimum resist time constant.

Closely Spaced Lines

One of the recent trends in lithography is toward mask patterns that contain lines that run in a single direction. Sometimes the lines are the same width and are evenly spaced and sometimes not. Sometimes they contain breaks and sometimes not. In all such cases, the lithography systems 10 and associated methods described herein offer particular advantages.

For example if a regular, repeating pattern consisting of lines each at least 10 nm wide and with a regular pattern repetition distance of 220 nm is required, then the fringe spacing in interference image 158 can be adjusted to yield a period 220 nm, which equals the repetition distance, and the exposure and inhibition parameters can be adjusted to yield a single, 10 nm wide line. In this case, the interference fringes in the cross-scan direction can be turned off and all the pixels in the DMD turned on. If eleven lines are required to create a single version of the repeating pattern, then each time the scanning system advances 1/11 of the width of the field the interference pattern is repositioned and an exposure is made. After the eleven lines composing the repeating pattern have been completed the process is repeated, so as to continue each line in the scan direction.

Figure 30:
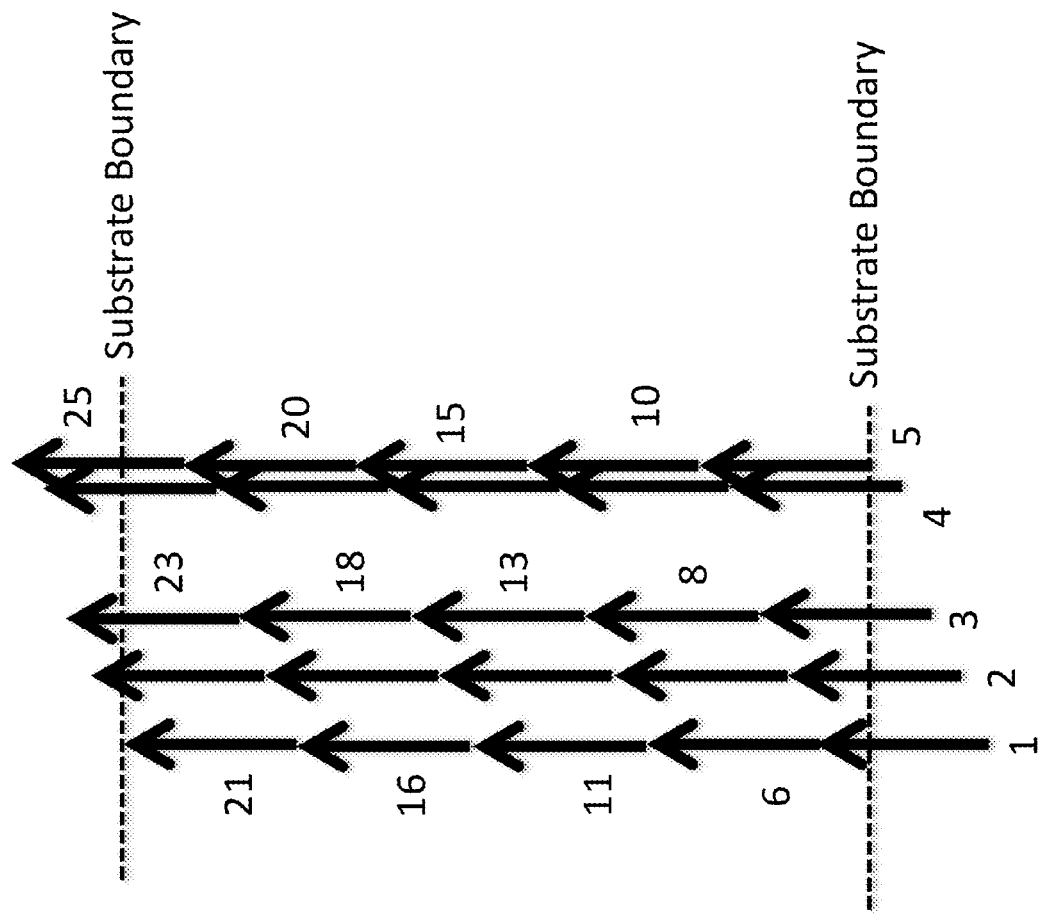
FIG. 30 is a schematic diagram that illustrates how five irregularly spaced lines per period can be extended across an entire substrate.

FIG. 30 is a schematic diagram that illustrates an example method of generating extended line patterns with an arbitrary spacing within a single period. The line created within in each period and with each exposure is represented as a vector (arrow). In this simplified example, five lines are required to form the repeating pattern so that one line is exposed each time the substrate advances 1/5 of the field width. The order in which the exposures are done is indicted by a number located beside the corresponding vector in most cases.

FIG. 30 shows that the lines can be spaced regularly or randomly, depending on the requirements of the circuit designer. In this case all of the transducer pixels 152 can be left on and the fringe pattern in interference image 158 in the cross-scan direction can be turned off. There is no need to change the magnification between the image transducer 150 and the substrate 30 to match the period of the interference pattern with the size of an imaged transducer pixel. The image transducer 150 can serve as a field delimiter by turning "off" the pixels 152 that fall outside the desired pattern edge. Some inefficiencies occur at the beginning and at the end of scan so that the edges of the substrate pattern, or the circuit pattern, have to fall between the scan boundaries, indicated in FIG. 30. However, overall this is a very efficient method of creating continuous one-dimensional patterns.

It is interesting to contrast the above method, which produces an extended pattern of parallel lines, with what is required to produce an arbitrary pattern. An arbitrary pattern with 10 nm pixels and a 220 nm period requires superimposing a minimum of $(220/10)^2=484$ exposures per field. If 5 nm line edge placement resolution is required, then the number of superimposed exposures increases 2-fold to 5-fold, depending on how the increased resolution is achieved. In the above example, the simplicity afforded by the regular line pattern allowed the number of superimposed exposures to be reduced to eleven per field, with each exposure generating a single line extending the entire width of the imaged field.

In order to generate eleven equally spaced lines within an interference pattern period, the cross-scan motion of the interference pattern would be stepped 1/11 of the width of the period. One possibility is to employ the same excitation and inhibition fluxes to generate a line as would be done for the general case. The excitation portion typically takes a small fraction of the time required for a single frame, and is be repeated each time the scan direction fringes are repositioned.

This keeps the excitation and inhibition intensities at their nominal values, but the repetition rate would fall to the time required to scan 1/11 the width of the image transducer image. If the inhibition fringe pattern of interference image 158 is held fixed during the time between exposures or is turned off during most of this time, then a two-color resist with a time constant roughly corresponding to the time between exposures could be used. This approach can be used generate exposure profiles with a very high peak to valley ratio.

Line Breaks

When printing lines using apparatus 10, line breaks slow down the process, depending on the spacing between the end one line and the beginning of the next line. Breaks corresponding to the imaged size of an individual image transducer pixel 152 (e.g., micro-mirror) can be generated with "off" pixels in the image transducer 150 during the exposure.

In the example above, the break generated by such an "off" pixel would be about equal to the period size and would not affect the scan rate. However, a line break corresponding to the 10 nm width of the lines being created would require the presence of the interference pattern in the cross scan direction and a switch to an operational sequence more closely related to the case for a arbitrary pattern that, in this instance, requires 484 superimposed exposures. There are some savings to be obtained because there is no need to provide breaks between the lines, and this reduces the number of superimposed images to half. Further reductions are possible if the position of the line breaks can be further restricted to some integer multiple of 10 nm, such as 20 or 30 nm. In general, simplifying the pattern by making it more regular reduces the number of superimposed images and serves to speed-up the imaging process.

Alternate Means of Creating Black Holes

U.S. Pat. No. 6,811,933 describes how to generate a regular array of black holes 300D (see, e.g., FIG. 3) by imaging a specially constructed phase mask onto photoresist 40. The mask includes regions surrounded by phase changes that vary azimuthally by n wavelengths each revolution, where n is an integer greater than zero. Ideally the phase change varies linearly with azimuth angle but this leads to fabrication issues. Four phase change increments, each representing a 90° increment in phase, are sufficient to generate a diffraction limited black hole.

FIG. 31A is a plan view of example mask M that illustrates a phase variation scheme wherein the phase can be varied step-wise in quarter wave increments. Each of the small black squares on mask M represents a small (sub-resolution) opaque or dark region $R_D$ that corresponds to the location of black holes 300D at substrate 30. The size of each dark region $R_D$ on the mask M is well below the resolution limit of the imaging system IS of the modified apparatus 10 shown in FIG. 32 and discussed in greater detail below.

With reference also to the close-up view of FIG. 31B, each dark region $R_D$ is surrounded by four transparent or clear regions $R_C$ having a phase shift that differs by 90° from its nearest neighbors, and is arranged so that the clear regions on the opposite side of each dark region $R_D$ have a 180° relative phase shift. The resultant black hole 300D produced by this mask M is determined by diffraction, and it is slightly smaller than the holes produced by a transmission-mask, an attenuating phase-shift mask or a rimshift phase-shift mask. Regions $R_D$ are sized to obscure the small mismatch that typically occurs at the meeting point between the four different phase shift regions.

Figure 32:
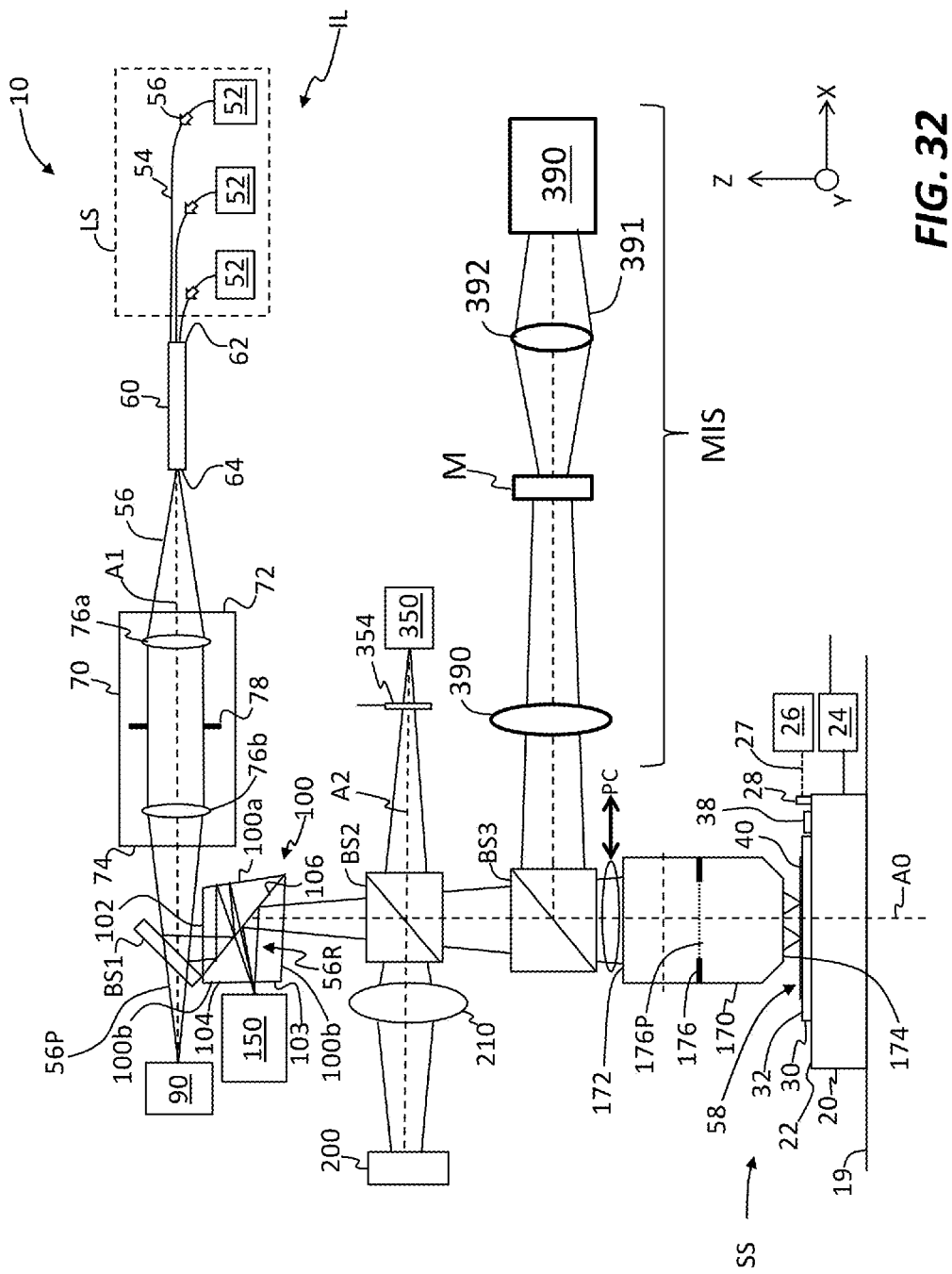
FIG. 32 is similar to FIG. 2A and illustrates a modified direct-write lithography apparatus whereby the interference pattern generator (IPG) is replaced by a mask imaging system (MIS) that utilizes the mask of FIG. 31 to form the black holes.

FIG. 32 is similar to FIG. 2A and illustrates an example apparatus 10 wherein a mask imaging system MIS is substituted for interference pattern generator IPG (see also FIG. 1) to create a mask image 358 that substitutes for the interference image 158. Mask imaging system MIS includes a light source 390 that generates inhibition radiation 391, which is imaged onto the mask M by a lens 392. The mask M contains the above-described pattern for generating an array of black holes 300D at photoresist 40.

The inhibition radiation 391 passes through mask M and is relayed to beam-splitter BS3 by a lens 390, and from there the inhibition radiation passes through objective 170 and is imaged in photoresist layer 40. The magnification and position of the "black hole mask" M is arranged so that each black hole 300D is imaged in the center of an image transducer pixel image 152P. An advantage of this configuration is that the light source 390 for mask M need not be very monochromatic since the path length difference in rays of inhibition radiation 391 forming the black hole pattern is only a wavelength or two.

Apparatus 10 of FIG. 32 can be operated as a step-and-repeat or step-and-scan system. The step-and-repeat approach utilizes the motion of a small optical element PC in the common path shared by the excitation an inhibition light beams, which can step the image very quickly over a very small range covering one period. In an example, optical element PC is situated along optical axis A0 just above the objective 170.

Another method is to employ the step-and-scan technique where the mask M is moved in synchronism with the scanned wafer 30 and the exposure source is flashed as the resulting black holes 300D formed by imaging mask M pass over the central portion of each pixel image 58P in photoresist 40. Since the pattern of black holes 300D and the substrate 30 move in synchronism, there is no image smear and the exposure duration is not limited by image smear considerations. Unless the substrate 30 is very small, the finite size of the mask M will limit the travel and the mask and substrate 30 will have to be reregistered and the scanning motion started again once the edge of the mask pattern reaches the edge of the DMD pattern image.

Generating Thin Black Lines

Figure 33:
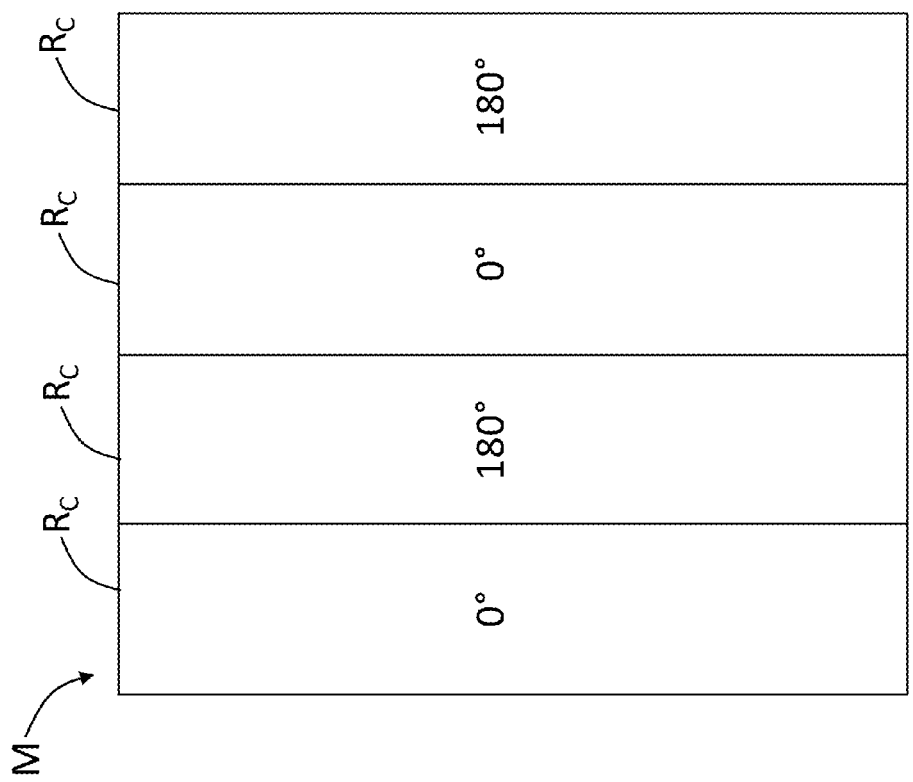
FIG. 33 is an example mask similar to that of FIG. 31 but that only includes clear phase regions of alternating phase that form black "lines" rather than black holes.

In an example method, thin black lines rather than black holes 300D are formed using the masked-based apparatus 10 of FIG. 32 by simply introducing in mask M a 180° phase discontinuity at the desired position of the black line, as shown in the close-up view of FIG. 33. The mask M of FIG. 33 has only clear regions $R_C$ in the form of alternating strips that differ in phase at the inhibiting wavelength $\lambda_2$ by 180°. Mask M can be made using techniques known in the art, e.g., by etching the alternate strips so that the optical path length through them differs from their neighbors by half an inhibiting wavelength.

Substituting the mask M of FIG. 33 for the mask of FIG. 31A results in the creation of array of black lines instead of an array of black holes. The spacing of the black lines can be arranged to equal the desired period of the repeating line pattern. The printed width of the sub-resolution line in photoresist layer 40 would depend on the relative intensities and the timing of the excitation and inhibition fluxes.

The position of the resultant sub-resolution photoresist line feature 40P formed in photoresist 40 depends on the substrate position during the exposure. A unique pattern spanning the distance between the lines on the mask image and containing a number of sub-resolution lines could be printed across a substrate using the method described above in connection with forming closely space lines, with the only difference being that the substrate 30 is moved relative to the mask M rather than shifting the fringe pattern of interference image 158 to position a new line.

Patterning the Excitation Illumination on the Image Transducer

Figure 34A:
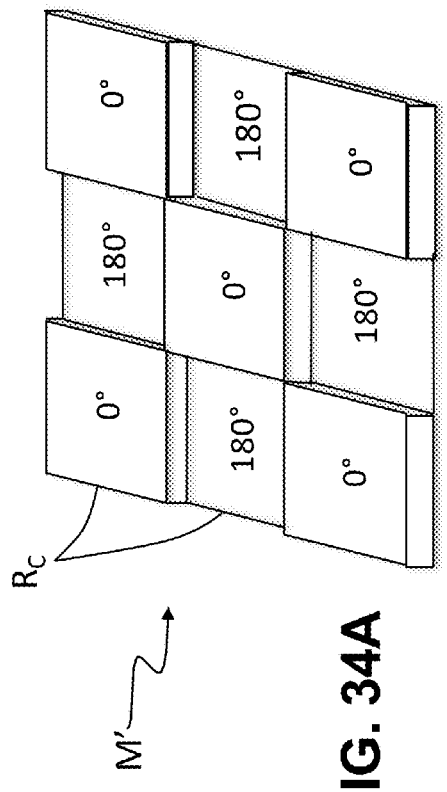
FIG. 34A is a close-up schematic diagram of an example phase mask that can be used in the illumination system of the direct-write apparatus shown in FIGS. 1, 2A and 32 to form a dark line on the edge of each image transducer element in the image transducer to reduce the overlap between the images of adjacent image transducer elements, thereby increasing the intensity in the center of each image transducer element.

FIG. 34A is schematic diagram of a small portion of an example phase mask M' used in apparatus 10 to create a two dimensional array of black lines on the edges of each image transducer pixel 152P. This tends to reduce the overlap between the images of adjacent image transducer elements 152, and increases the intensity in the center of each image transducer element. In an example, mask M' is a phase-shift mask with a checkerboard pattern of clear regions $R_C$, with 180° phase shift between adjacent regions.

Figure 34B:
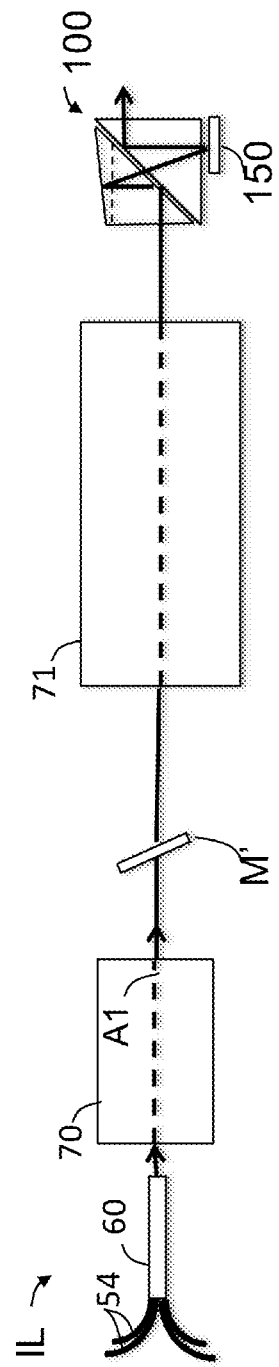
FIG. 34B is a close-up view of the illumination system of the direct-write apparatus, showing the placement of the phase mask of FIG. 34A in the relay optical system.

FIG. 34B illustrates a portion of illumination system IL of apparatus 10 as adapted to make use of mask M'. Mask M' is shown arranged between two telecentric relay systems, 70 and 71. The first relay 70 images the end of the light pipe onto the mask M'. The second relay 71, which is ideally a 1:1 relay, images mask M' onto the DMD 150. Mask M' is tilted with respect to axis A1 so that the mask plane is in focus across the field of the DMD 150, which is also tilted with respect to (folded) axis A1. Configuring relay optical system 70 as a 1× telecentric relay between mask M' and image transducer 150 preserves the tilt angle and keeps the dimensions of the phase mask patterns on mask M' identical to the separation between micro-mirrors 152 of image transducer 150. The function of light uniformizer 60 (light pipe) is to collect the light 56 from an array of laser diode illuminated fibers 54, and render it uniform after multiple reflections along the length of the uniformizer.

Increasing the Line Edge Position Resolution

Line edge position resolution is defined as the minimum possible separation between the possible locations of an edge of photoresist features 40P in the exposed photoresist 40. If a single layer of photoresist pixels or features 40P are butted together to form a larger geometry, then removing a row or column of photoresist pixels moves the edge of the photoresist pattern by the size of the pixel, and the line edge resolution equals the pixel size. If more resolution is required, then a second layer of photoresist pixels 40P can be added. However, it is desirable to minimize the total number of photoresist pixels 40P contained in a period. Each photoresist pixel 40P is formed by an exposure profile with a peak to valley ratio and the valleys or wings add up to displace the peaks and create a variation in the edge locations. Thus, any increase in line edge resolution needs to be done by adding a minimum number of photoresist pixels 40P.

Figure 35B:
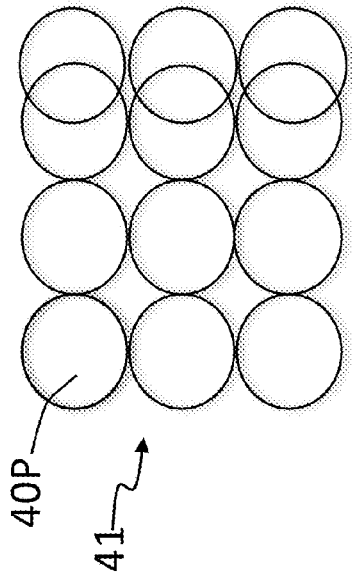
FIGS. 35A through 35D respectively illustrate four example methods for increasing the line edge placement resolution of a photoresist pattern by shifting the position of some of the photoresist pixels.
Figure 35D:
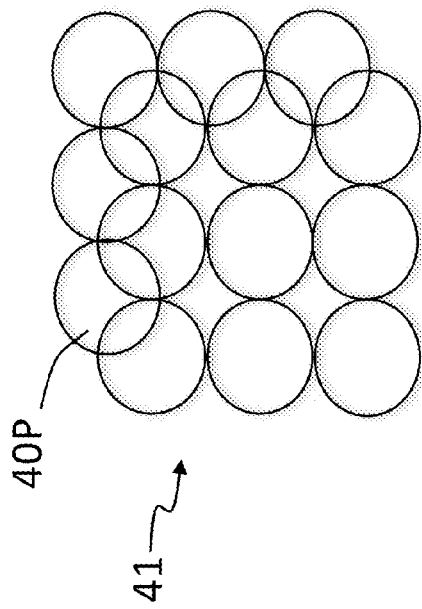
Figure 35A:
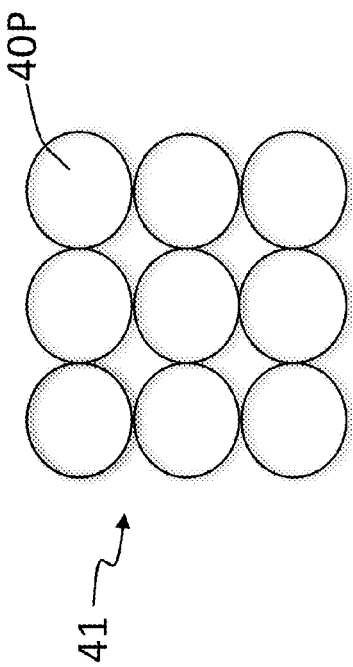

FIGS. 35A through 35D illustrate various methods of increasing the resolution of the line edge position of a non-sub-resolution photoresist pattern 41 by judicious positioning of photoresist pixels 40P. FIG. 35A shows a solid geometry that defines an example non-sub-resolution photoresist pattern 41 consisting of a packed array of photoresist pixels 40P in which the line edge resolution is equal to one pixel. FIG. 35B shows how the size of photoresist pattern 41 can be extended in the X-direction by half a photoresist pixel 40P by partially overlaying an additional column of photoresist pixels displaced by half of a resolution element.

Figure 35C:
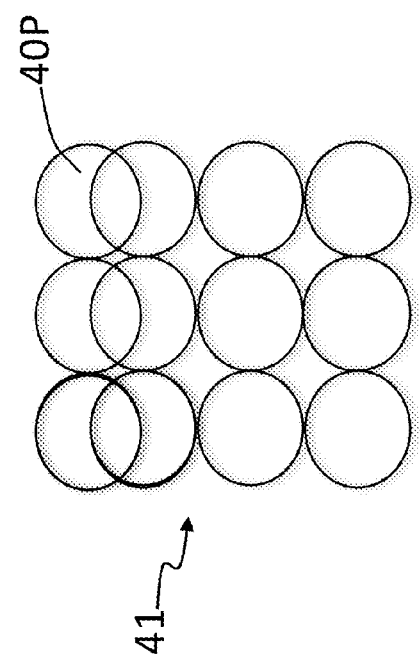

FIG. 35C illustrates how the size of photoresist pattern 41 can be increased by a half pixel in the Y-direction, and FIG. 35D illustrates a size increase by half a pixel in both directions. Note that two opposing corners of photoresist pattern 41 as shown in FIG. 35D are appreciably less sharp than the other two opposing corners and that the displacement of the overlapping layer is in a diagonal direction. This seems to be an inevitable result of creating a photoresist pattern 41 with fractional pixel dimensions in both the X and Y directions.

In the case of a geometry consisting of integer numbers of photoresist pixels 40P in both directions, but having an ideal position shifted by a half pixel, an alternative solution is to write it in a separate pass with the photoresist pixel 40P locations shifted accordingly. Each pass decreases the throughput so there is a strong incentive to restrict the line edge resolution available to the pattern designer.

An alternate way of moving an edge is by making available different maximum exposure levels for each photoresist pixel 40P. If the photoresist pixels 40P bordering an edge of photoresist pattern 41 are exposed less, then the photoresist feature tends to shrink, which moves the edges and increases the line edge resolution.

Figure 36:
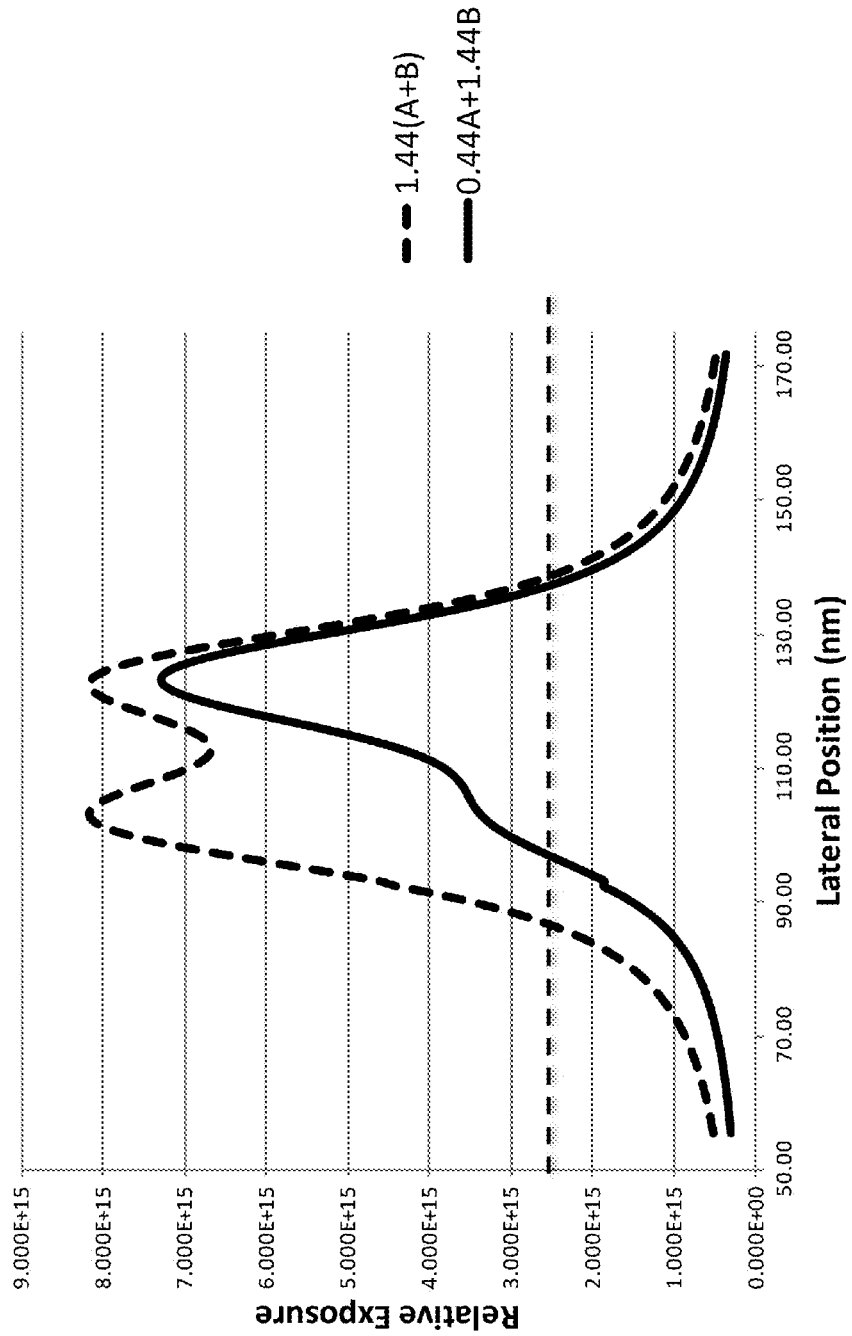
FIG. 36 is a plot similar to that shown in FIG. 27 and that illustrates an example method of increasing the line edge placement resolution of a photoresist pattern by changing the exposure dose when forming some of the photoresist pixels.

FIG. 36 is a plot of relative exposure vs. lateral position (nm) and compares the exposure dose profiles of two adjacent lines. In one case the two adjacent lines were given the same exposure dose, and in the other case one of the lines was given only about 31% of the dose of the other. Comparison of the resulting line widths at the 3E+15 level (dashed horizontal line) indicates that the under-exposure reduced the combined line width by 25% or about half a pixel. The edge position resolution is thus reduced to half a pixel using this technique.

Figure 37:
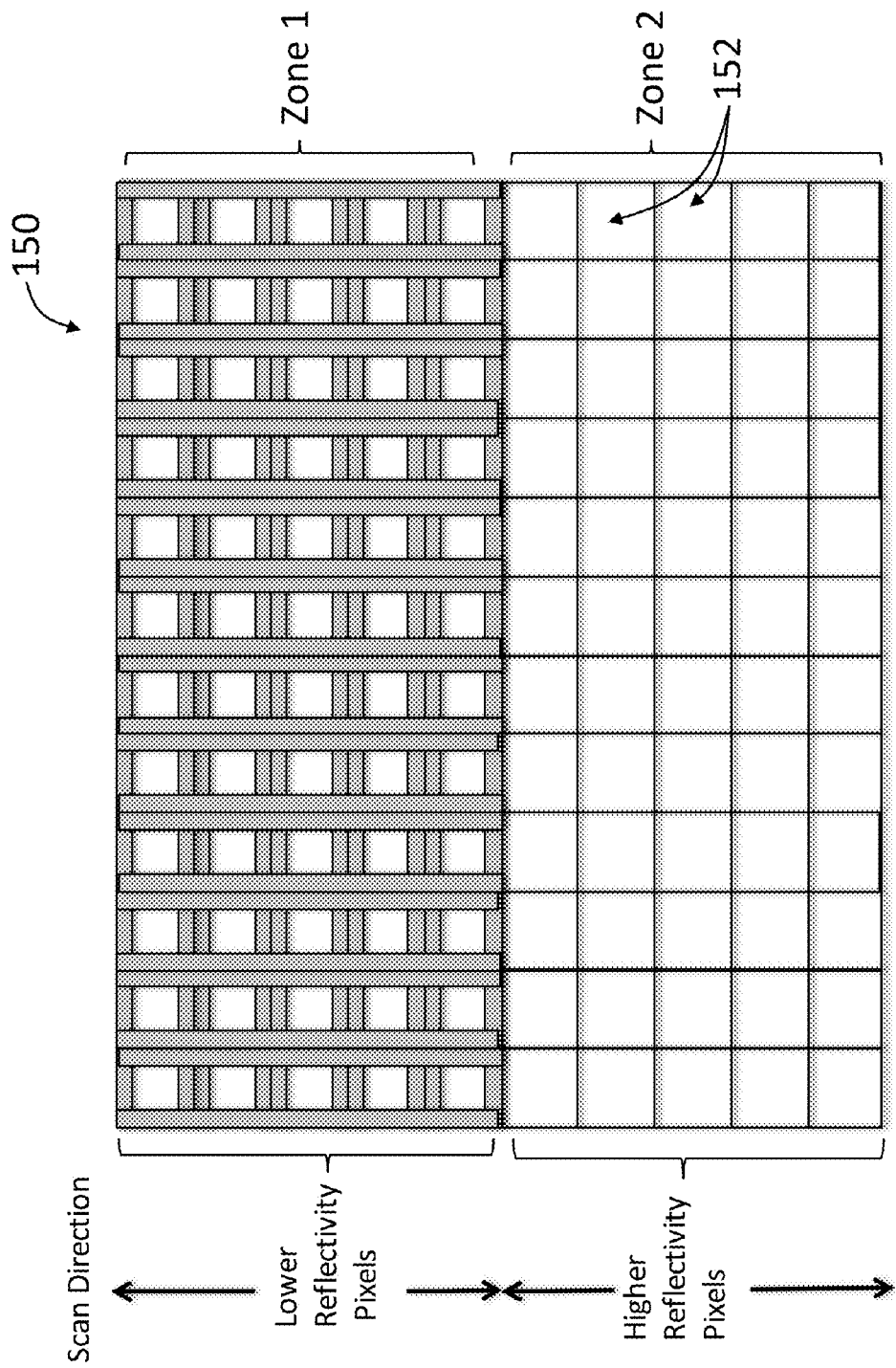
FIG. 37 is a face-on view of an example digital micro-mirror array that includes two zones wherein the micro-mirrors have different reflectivity, thereby affecting the exposure level without having to modify the uniformity of the illumination light.

FIG. 37 is a front-on view of an example image transducer 150 in the form of a DMD wherein the micro-mirror array is divided into two zones, ZONE 1 and ZONE 2, wherein the micro-mirror reflectivity is different for micro-mirrors 152 in the two zones. This allows for different exposure levels when exposing photoresist 40 without having to adjust the intensity of illumination light 56.

The reflectivity of a micro-mirror 152 is readily changed by making the reflecting surface area smaller, as illustrated in FIG. 37. However, each zone needs to contain enough pixels running in the scan direction to complete the picture. If each period is spanned by N super-resolution elements in each direction, then completing the picture will require a minimum of $N^2$ image transducer pixels 152 running in the scan direction in each zone.

For example, if each super-resolution image pixel 58P is 10 nm wide and the period ($\lambda$/2NA) is 220 nm, then N=220/10=22 and $N^2$=484. The Texas Instruments 1080p DLP has 1080×1920 micro-mirrors 152. If the DMD 150 is oriented so that the direction corresponding to 1080 micro-mirrors are aligned with the scan direction, then two zones ZONE 1 and ZONE 2 each containing 484 mirrors are possible. But three zones is not possible unless the DMD is turned 90° so that the 1920 mirror direction is oriented with the scan direction.

The preferred method of increasing the line edge resolution of photoresist pattern 41 is by under-exposing the edge pixels 40P. Not only does this preserve the square corners on all the geometries, it also reduces the total amplitude of the wings in each period, thereby improving the image quality. One complication is that the relationship between the exposure level and the line edge position is not linear.

An alternative to modifying the reflectivity of the DMD pixels 152 is to change the excitation dose either by changing the output power level of the laser diodes 52 in illuminator IL, or the excitation pulse duration, or both, each time substrate 30 scans through some fractional length of the DMD image.

For example, if there are 1080 pixels 152 in the scan direction then each time the scan covers 540 pixels (½ the image field) or 360 pixels (⅓ the field) or 270 pixels (¼ the field), the excitation dose could be changed so that edge pixels can be selectively underexposed thereby causing the edge position to shift. For example, if one third turns out to be the desired fractional length, then the exposure sequence could start out with a full exposure dose, and after traversing 360 pixels on the image plane, the exposure dose could be reduced to about half until 720 pixels are traversed, whereupon the exposure dose is reduced to about a quarter. After traversing all 1080 pixels the sequence is repeated by starting again with a full exposure dose.

In this case each pixel can receive a maximum of three exposures (a full, a half and a quarter) and minimum of zero exposures if the corresponding pixel in each exposure is turned off. Because the relationship between edge position and dose is very non-linear the dose ratios of one half and one quarter are crude approximations only. As before, the ratio of the super pixel size to the period size must be less than or equal to the square root of the number of pixels traversed with a single dose so that every possible pixel location can be addressed. An exception to this rule is repetitive patterns, which have repeating areas that never need to be addressed.

Polarization of the Inhibition and Excitation Beams

When the NA of imaging system IS (see, e.g., FIG. 1) becomes sufficiently high, it is important to employ light that is s-polarized to obtain the smallest possible images; i.e., the polarization of the image-forming light rays is oriented so that the electric vector is parallel to the substrate. This rule applies to both the excitation and inhibition beams and can be achieved by placing an azimuthal polarizer in the part of the optical path common to both beams.

In the case where orthogonal fringes are employed as the inhibition pattern in interference image 158, such a polarizer also ensures that the two beams that interfere to form the fringes in one direction cannot interfere with the beams forming the fringes that run in the other direction, even if they originate from a common laser 250. If three-fold symmetry is employed in the fringe pattern, then interference between each of the three fringe patterns can be avoided by employing different lasers 250 to generate each set of fringes.

Reducing Pixel Cross-Talk

The two-color resist model allows the exposure profile to be calculated at any point given the excitation and inhibition intensities and time durations at that point. Generally it has been assumed that the inhibition intensity follows a $\sin^2$ distribution and the excitation intensity is constant over the region of interest. This is usually a good approximation in the region close to the peak intensity, but it is not exactly true near the edges of the period where the intensity generated by a single pixel falls off and spills over into the adjacent pixels. An area of particular concern is the center of an adjacent "off" pixel where the inhibition pattern intensity is close to zero and the stray light from surrounding "on" pixels can amount to a few percent.

Fortunately, this unwanted excitation component can be suppressed by illuminating the "off" pixels with inhibition light. However, there are limits to this approach because some of the inhibition intensity on the "off" pixels will spill over onto the "on" pixels. For example, under nominal conditions an excitation level of 5E+15 photons/cm$^2$ IT (where IT is the time increment of 0.05 µs used in the model) produces an exposure density of 4.75E+15 molecules/cm$^2$. If 4% of this flux spills into the black hole in the next pixel, which is turned "off", then the resultant exposure density is 2.48E+14 molecules/cm$^2$. Since this pixel is an "off" pixel, we can try to attenuate the amount of exposure by illuminating it with an inhibition intensity of 4E+15 photons/cm$^2$. The net result is an exposure density of 1.55E+13, so the exposure in the off pixel has been reduced by a factor of 16 by illuminating the "off" pixels with inhibition light. Some of the inhibition intensity applied to the "off" pixel is likely to spill onto the adjacent "on" pixel with the result that the "on" pixel exposure density will be reduced from 4.75E+15 to 3.28E+15 molecules/cm$^2$. Thus a 16-fold reduction in cross-talk requires a 45% increase in the exposure dose in this particular example.

It will be apparent to those skilled in the art that various modifications and variations can be made to the present disclosure without departing from the spirit and scope of the disclosure. Thus it is intended that the present disclosure cover the modifications and variations of this disclosure, provided they come within the scope of the appended claims and their equivalents.

What is claimed is:

1. A direct-write lithography apparatus for forming in a two-color photoresist layer on a substrate sub-resolution photoresist pixels, wherein the two-color photoresist layer includes photo-molecules, comprising:
    an illumination system configured to provide an illumination light having a wavelength capable of exciting the photo-molecules in the two-color photoresist to form excited-state photo-molecules;
    at least one image transducer having an array of configurable transducer pixels arranged to receive and selectively modulate the illumination light;
    an objective lens arranged to receive the modulated illumination light from the at least one image transducer and form on the two-color photoresist layer a transducer image having an arrangement of bright spots, with each bright spot having a first size and being formed by a corresponding activated transducer pixel;
    a stage that movably supports the substrate;
    an inhibition image generator arranged relative to the objective lens and adapted to operate in combination with the objective lens to generate at the two-color photoresist an inhibition image from inhibition light having an inhibition wavelength that causes excited-state photo-molecules to transition to an unexcited state that is not susceptible to conversion to an irreversible exposed state, wherein the inhibition image includes an array of dark spots; and
    wherein the array of dark spots are aligned with the bright spots and are smaller than the bright spots so that a portion of the excited-state photo-molecules adjacent the periphery of the bright spots absorb the inhibition radiation and transition to the unexcited state, while a portion of the excited photo-molecules at the center of the bright spots are not exposed to the inhibition light and transition to an irreversible exposed state, thereby forming in the two-color photoresist a set of sub-resolution photoresist pixels each having a size smaller than would be formed in the absence of the dark spots.

2. The apparatus of claim 1, wherein the inhibition image generator includes either an interference pattern generator or a mask imaging system.

3. The apparatus of claim 1, wherein the inhibition image generator includes a mask imaging system that includes a phase mask.

4. The apparatus of claim 1, wherein each image transducer pixel includes a center and an edge, and wherein the illumination system includes a phase mask configured to modulate the illumination beam to provide a maximum intensity at the center of each image transducer pixel and a minimum intensity along an edge of each transducer pixel.

5. The apparatus of claim 1, further comprising including an optical element arranged to adjust an alignment between the substrate, the image transducer image and the inhibition image.

6. The apparatus of claim 1, wherein the transducer image is composed of light that excites the photo-molecules in the resist layer, the interference pattern image is composed of light that inhibits excitation of photo-molecules in the resist layer, and wherein the transducer and inhibition images have an s-polarization at the two-color photoresist.

7. The apparatus of claim 1, wherein the transducer pixels define zones having different reflectivity.

8. The apparatus of claim 1, wherein the transducer pixels have a 180° degree phase shift with respect to the light from the four nearest neighboring transducer pixels.

9. The apparatus of claim 1, wherein the set of sub-resolution photoresist pixels defines a pattern having a first axis, wherein the image transducer has a second axis aligned with the first axis, and wherein the pattern has a minimum feature size defined by a size of the sub-resolution pixels.

\* \* \* \* \*